(12) United States Patent
Mitomo et al.

(10) Patent No.: US 11,594,859 B2
(45) Date of Patent: Feb. 28, 2023

(54) LIGHT EMITTING ELEMENT AND LIGHT EMITTING ELEMENT ARRAY

(71) Applicant: Sony Corporation, Tokyo (JP)

(72) Inventors: Jugo Mitomo, Kanagawa (JP);
Tatsushi Hamaguchi, Kanagawa (JP);
Hiroshi Nakajima, Kanagawa (JP);
Masamichi Ito, Miyagi (JP); Susumu Sato, Kanagawa (JP)

(73) Assignee: Sony Corporation, Tokyo (JP)

( * ) Notice: Subject to any disclaimer, the term of this patent is extended or adjusted under 35 U.S.C. 154(b) by 166 days.

(21) Appl. No.: 16/631,709

(22) PCT Filed: May 9, 2018

(86) PCT No.: PCT/JP2018/017856
§ 371 (c)(1),
(2) Date: Jan. 16, 2020

(87) PCT Pub. No.: WO2019/017044
PCT Pub. Date: Jan. 24, 2019

(65) Prior Publication Data
US 2020/0169061 A1    May 28, 2020

(30) Foreign Application Priority Data

Jul. 18, 2017 (JP) ............................. JP2017-139244

(51) Int. Cl.
*H01S 5/183* (2006.01)
*H01S 5/042* (2006.01)
*H01S 5/02* (2006.01)

(52) U.S. Cl.
CPC ...... *H01S 5/18361* (2013.01); *H01S 5/04253* (2019.08); *H01S 5/18305* (2013.01);
(Continued)

(58) Field of Classification Search
CPC ............... H01S 5/18388; H01S 5/0207; H01S 5/18341; H01S 5/18305; H01S 5/18386–18391
See application file for complete search history.

(56) References Cited

U.S. PATENT DOCUMENTS 4,309,670 A * 1/1982 Burnham ............ H01S 5/18388
372/46.01
4,935,939 A * 6/1990 Liau ........................ H01S 5/026
372/98

(Continued)

FOREIGN PATENT DOCUMENTS

CN        1596046 A      3/2005
CN        1698213 A      11/2005
(Continued)

OTHER PUBLICATIONS

International Search Report for Application No. PCT/JP2018/017856, dated Jul. 31, 2018.

*Primary Examiner* — Joshua King
(74) *Attorney, Agent, or Firm* — K&L Gates LLP

(57) ABSTRACT

A light emitting element includes: a laminated structure 20 obtained by laminating a first compound semiconductor layer 21, an active layer 23, and a second compound semiconductor layer 22; a first light reflecting layer 41 disposed on a first surface side of the first compound semiconductor layer 21; a second light reflecting layer 42 disposed on a second surface side of the second compound semiconductor layer 22; and light convergence/divergence changing means 50. The first light reflecting layer 41 is formed on a concave mirror portion 43. The second light reflecting layer 42 has a flat shape. When light generated in the active layer 23 is emitted to the outside, a light convergence/divergence state before the light is incident on the light convergence/divergence changing means 50 is different (Continued)

from a light convergence/divergence state after the light passes through the light convergence/divergence changing means 50.

11 Claims, 30 Drawing Sheets

(52) U.S. Cl.
    CPC ........ *H01S 5/18388* (2013.01); *H01S 5/0207* (2013.01); *H01S 5/04254* (2019.08); *H01S 5/04256* (2019.08); *H01S 5/18308* (2013.01); *H01S 5/18341* (2013.01); *H01S 5/18369* (2013.01)

(56) References Cited

U.S. PATENT DOCUMENTS

| | | | | |
|---|---|---|---|---|
| 5,309,468 A * | 5/1994 | Makiuchi | ............ | H01S 5/18305 372/50.23 |
| 5,341,390 A * | 8/1994 | Yamada | ............ | H01S 5/18305 372/45.012 |
| 5,432,812 A * | 7/1995 | Kurobe | ............ | B82Y 20/00 372/108 |
| 5,461,637 A * | 10/1995 | Mooradian | ............ | H01S 5/041 372/11 |
| 5,796,714 A * | 8/1998 | Chino | ............ | H01S 5/04256 372/50.124 |
| 5,838,715 A | 11/1998 | Corzine | | |
| 5,963,578 A * | 10/1999 | Fulbert | ............ | H01S 3/0627 372/101 |
| 6,026,111 A * | 2/2000 | Jiang | ............ | H01S 5/18308 372/101 |
| 6,343,090 B1 * | 1/2002 | Yoo | ............ | H01S 5/18388 372/96 |
| 6,611,003 B1 * | 8/2003 | Hatakoshi | ............ | H01L 33/20 257/98 |
| 6,661,829 B2 * | 12/2003 | Jeon | ............ | H01S 5/18388 372/96 |
| 6,754,245 B2 * | 6/2004 | Park | ............ | B82Y 20/00 372/50.11 |
| 6,778,582 B1 * | 8/2004 | Mooradian | ............ | H01S 5/18311 372/20 |
| 6,990,134 B2 * | 1/2006 | Park | ............ | B82Y 20/00 372/50.11 |
| 7,580,437 B2 * | 8/2009 | Kondo | ............ | B82Y 20/00 372/50.124 |
| 10,290,996 B1 * | 5/2019 | Mathai | ............ | H01S 5/18386 |
| 11,031,752 B2 * | 6/2021 | Hamaguchi | ............ | H01S 5/2063 |
| 2001/0030319 A1 * | 10/2001 | Sato | ............ | H01S 5/34 257/14 |
| 2002/0093024 A1 * | 7/2002 | Lee | ............ | H01S 5/18388 257/98 |
| 2002/0105988 A1 * | 8/2002 | Park | ............ | B82Y 20/00 372/45.01 |
| 2002/0106160 A1 * | 8/2002 | Cox | ............ | H01S 5/18386 385/49 |
| 2002/0150130 A1 * | 10/2002 | Coldren | ............ | H01S 5/18305 372/20 |
| 2002/0163688 A1 * | 11/2002 | Zhu | ............ | H04B 10/2581 398/144 |
| 2002/0176473 A1 * | 11/2002 | Mooradian | ............ | H01S 5/142 372/92 |
| 2002/0181536 A1 * | 12/2002 | Jeon | ............ | H01S 5/18388 372/96 |
| 2002/0186737 A1 * | 12/2002 | Marion | ............ | H01S 5/423 372/50.1 |
| 2002/0196548 A1 * | 12/2002 | Kuznetsov | ............ | H01S 5/18388 359/578 |
| 2003/0012231 A1 * | 1/2003 | Tayebati | ............ | G02B 26/001 372/20 |
| 2003/0112843 A1 * | 6/2003 | Thornton | ............ | H01S 5/183 372/97 |
| 2003/0122142 A1 * | 7/2003 | Tatum | ............ | H01S 5/423 257/98 |
| 2003/0169797 A1 * | 9/2003 | Aldaz | ............ | H01S 5/18388 372/96 |
| 2004/0136433 A1 * | 7/2004 | Kuznetsov | ............ | H01S 5/18388 372/92 |
| 2005/0007666 A1 * | 1/2005 | Kuznetsov | ............ | H01S 5/18388 359/578 |
| 2005/0100069 A1 * | 5/2005 | Gwo | ............ | B82Y 20/00 372/50.1 |
| 2005/0276299 A1 * | 12/2005 | Kondo | ............ | H01S 5/18388 372/50.23 |
| 2006/0029112 A1 * | 2/2006 | Young | ............ | G06F 1/105 372/7 |
| 2006/0083282 A1 * | 4/2006 | Kondo | ............ | H01S 5/18327 372/50.124 |
| 2006/0083283 A1 * | 4/2006 | Kondo | ............ | B82Y 20/00 372/50.124 |
| 2006/0198404 A1 * | 9/2006 | Henrichs | ............ | B82Y 20/00 372/29.02 |
| 2007/0241354 A1 * | 10/2007 | Tanaka | ............ | H01S 5/0422 257/98 |
| 2007/0246721 A1 * | 10/2007 | Reill | ............ | H01S 5/18388 257/98 |
| 2007/0280320 A1 * | 12/2007 | Feezell | ............ | H01S 5/18341 372/46.01 |
| 2008/0031295 A1 * | 2/2008 | Tanaka | ............ | H01L 33/382 372/44.01 |
| 2008/0043798 A1 * | 2/2008 | Calvez | ............ | H01S 5/141 372/50.22 |
| 2008/0247436 A1 * | 10/2008 | Carter | ............ | H01S 5/0264 372/50.11 |
| 2009/0129421 A1 * | 5/2009 | Kitatani | ............ | H01S 5/22 372/50.23 |
| 2010/0203660 A1 * | 8/2010 | Tanaka | ............ | H01S 5/0234 438/29 |
| 2011/0044363 A1 * | 2/2011 | Uchida | ............ | B82Y 20/00 372/45.01 |
| 2012/0051383 A1 * | 3/2012 | Stern | ............ | H01S 5/423 372/50.21 |
| 2012/0147912 A1 * | 6/2012 | Moench | ............ | H01S 5/14 372/29.02 |
| 2012/0230361 A1 * | 9/2012 | Adachi | ............ | H01S 5/18 372/45.01 |
| 2012/0248977 A1 * | 10/2012 | Ootorii | ............ | H01L 25/167 313/524 |
| 2013/0058370 A1 * | 3/2013 | Chang-Hasnain | ..... | B82Y 20/00 372/50.11 |
| 2013/0077648 A1 * | 3/2013 | Felder | ............ | H01L 33/005 372/75 |
| 2013/0223466 A1 * | 8/2013 | Gronenborn | ............ | H01S 5/0267 372/50.124 |
| 2015/0043601 A1 * | 2/2015 | Hamaguchi | ............ | H01S 5/183 372/44.01 |
| 2015/0043606 A1 * | 2/2015 | Hamaguchi | ............ | H01S 5/18391 372/50.11 |
| 2015/0044795 A1 * | 2/2015 | Futagawa | ............ | H01S 5/18308 438/29 |
| 2015/0214695 A1 * | 7/2015 | Adachi | ............ | H01S 5/18 372/20 |
| 2017/0033535 A1 * | 2/2017 | Joseph | ............ | H01S 5/18308 |
| 2017/0063040 A1 * | 3/2017 | Su | ............ | H01S 3/08059 |
| 2017/0115497 A1 * | 4/2017 | Chen | ............ | G02B 27/425 |
| 2018/0366907 A1 * | 12/2018 | Joseph | ............ | H01S 5/18308 |
| 2019/0006819 A1 * | 1/2019 | Joseph | ............ | H01S 5/0225 |
| 2019/0386189 A1 * | 12/2019 | Lee | ............ | H01L 33/08 |

FOREIGN PATENT DOCUMENTS

| | | | | |
|---|---|---|---|---|
| CN | 101561522 A | | 10/2009 | |
| CN | 106463909 A | | 2/2017 | |
| CN | 106848838 A | * | 6/2017 | ........ H01S 5/04253 |
| DE | 102008030844 A1 | * | 12/2009 | ........ H01S 5/0612 |
| DE | 112017006413 T5 | * | 8/2019 | ........ H01S 5/0207 |
| JP | H08321660 A | | 12/1996 | |
| JP | H10200200 A | | 7/1998 | |

(56) References Cited

FOREIGN PATENT DOCUMENTS

| JP | 2000022277 | A |   | 1/2000  |               |
|----|------------|---|---|---------|---------------|
| JP | 2000022277 | A | * | 1/2000  | ............. B82Y 20/00 |
| JP | 2000076682 | A |   | 3/2000  |               |
| JP | 2000076682 | A | * | 3/2000  |               |
| JP | 2002237653 | A |   | 8/2002  |               |
| JP | 2002368333 | A |   | 12/2002 |               |
| JP | 2006066538 | A |   | 3/2006  |               |
| JP | 2006066538 | A | * | 3/2006  | ......... H01S 5/18388 |
| JP | 2006114753 | A | * | 4/2006  | ......... H01S 5/18388 |
| JP | 2006114753 | A |   | 4/2006  |               |
| JP | 3999309    | B2| * | 10/2007 | ......... H01S 5/18388 |
| JP | 2008258276 | A |   | 10/2008 |               |
| JP | 2010147359 | A | * | 7/2010  | ........... G02B 6/4206 |
| JP | 2012511824 | A | * | 5/2012  |               |
| JP | 2013541854 | A |   | 11/2013 |               |
| JP | 2019165198 | A | * | 9/2019  | ............. H01S 5/423 |
| KR | 100363165  | B1| * | 11/2002 |               |
| KR | 20020092186| A | * | 12/2002 | ......... H01S 5/18388 |
| KR | 20090077167| A |   | 7/2009  |               |
| WO | WO-03007437 | A2 | * | 1/2003 | ............. H01S 5/183 |
| WO | WO-03088435 | A1 | * | 10/2003 | ............. H01S 5/142 |
| WO | WO-2004064211 | A1 | * | 7/2004 | ............. H01S 5/423 |
| WO | WO-2010000231 | A1 | * | 1/2010 | ................ H01S 5/14 |
| WO | WO-2014175901 | A1 | * | 10/2014 | ............. H01S 5/423 |
| WO | WO-2016024991 | A1 | * | 2/2016 | ........... H01S 5/4012 |
| WO | WO2017092613 | A1 |  | 6/2017 |               |
| WO | WO-2018083877 | A1 | * | 5/2018 | ......... H01S 5/34333 |
| WO | WO-2018139877 | A1 | * | 8/2018 | ............. H01S 5/423 |
| WO | WO-2018190030 | A1 | * | 10/2018 | ......... H01S 5/18302 |
| WO | WO-2019181757 | A1 | * | 9/2019 | ........... G01S 7/4815 |
| WO | WO-2020027296 | A1 | * | 2/2020 | ............. H01S 5/183 |
| WO | WO-2020247291 | A1 | * | 12/2020 | ......... H01S 5/18369 |

\* cited by examiner

LIGHT EMITTING ELEMENT AND LIGHT EMITTING ELEMENT ARRAY

TECHNICAL FIELD

The present disclosure relates to a light emitting element and a light emitting element array.

BACKGROUND ART

In a light emitting element constituted by a surface emitting laser element (VCSEL), in general, laser oscillation occurs by resonating a laser beam between two light reflecting layers (distributed Bragg reflector layers (DBR layers)). In addition, in a surface emitting laser element having a laminated structure obtained by laminating an n-type compound semiconductor layer, an active layer (light emitting layer) including a compound semiconductor, and a p-type compound semiconductor layer, in general, a second electrode including a transparent conductive material is formed on the p-type compound semiconductor layer, and a second light reflecting layer having a laminated structure of insulating materials is formed on the second electrode. Furthermore, on the n-type compound semiconductor layer (on an exposed surface of a substrate in a case where the n-type compound semiconductor layer is formed on a conductive substrate), a first light reflecting layer having a laminated structure of a first electrode and an insulating material is formed. Note that an axis passing through the center of a resonator formed by the two light reflecting layers is referred to as Z axis, and a virtual plane orthogonal to Z axis is referred to as XY plane for convenience.

By the way, in a case where the laminated structure includes a GaAs-based compound semiconductor, a resonator length $L_{OR}$ is about 1 μm. Meanwhile, in a case where the laminated structure includes a GaN-based compound semiconductor, the resonator length $L_{OR}$ is usually as long as several times the wavelength of a laser beam emitted from a surface emitting laser element. That is, the resonator length $L_{OR}$ is considerably longer than 1 μm.

CITATION LIST

Patent Document

Patent Document 1: Japanese Patent Application Laid-Open No. 2006-114753
Patent Document 2: Japanese Patent Application Laid-Open No. 2000-022277

SUMMARY OF THE INVENTION

Problems to be Solved by the Invention

In addition, when the resonator length $L_{OR}$ becomes longer as described above, unlike a conventional GaAs-based surface emitting laser element adopting a resonator length $L_{OR}$ of about 1 μm, diffraction loss increases, and this makes laser oscillation difficult. That is, the light emitting element may function as an LED instead of functioning as a surface emitting laser element. Here, "diffraction loss" generally refers to a phenomenon that a laser beam traveling back and forth in a resonator gradually dissipates out of the resonator because light tends to spread due to a diffraction effect. Furthermore, in a case where the laminated structure includes a GaN-based compound semiconductor, there is a problem of thermal saturation. Here, "thermal saturation" is a phenomenon that light output is saturated by self-heating when a surface emitting laser element is driven. A material used for the light reflecting layer (for example, a material such as $SiO_2$ or $Ta_2O_5$) has a lower value of thermal conductivity than the GaN-based compound semiconductor. Therefore, an increase in the thickness of the GaN-based compound semiconductor layer leads to suppression of thermal saturation. However, an increase in the thickness of the GaN-based compound semiconductor layer increases the resonator length $L_{OR}$, and this causes the problem described above. A technique for imparting a function as a concave mirror to a light reflecting layer is well known from, for example, Japanese Patent Application Laid-Open No. 2006-114753 and Japanese Patent Application Laid-Open No. 2000-022277. However, these patent publications describe nothing about a problem to be solved by the light emitting element of the present disclosure, such as a problem of an increase in diffraction loss due to an increase in the resonator length $L_{OR}$ or a problem of thermal saturation.

Therefore, an object of the present disclosure is to provide a light emitting element having a configuration and a structure capable of solving the problem of an increase in diffraction loss due to an increase in the resonator length $L_{OR}$ and the problem of thermal saturation, and a light emitting element array including the light emitting element.

Solutions to Problems

In order to achieve the object described above, the light emitting element of the present disclosure includes:

a laminated structure obtained by laminating a first compound semiconductor layer having a first surface and a second surface facing the first surface, an active layer facing the second surface of the first compound semiconductor layer, and a second compound semiconductor layer having a first surface facing the active layer and a second surface facing the first surface;

a first light reflecting layer disposed on the first surface side of the first compound semiconductor layer;

a second light reflecting layer disposed on the second surface side of the second compound semiconductor layer; and light convergence/divergence changing means, in which the first light reflecting layer is formed on a concave mirror portion, the second light reflecting layer has a flat shape, and when light generated in the active layer is emitted to the outside, a light convergence/divergence state before the light is incident on the light convergence/divergence changing means is different from a light convergence/divergence state after the light passes through the light convergence/divergence changing means.

In order to achieve the object described above, the light emitting element array of the present disclosure is a light emitting element array having a plurality of light emitting elements juxtaposed therein, and each of the light emitting elements is constituted by the light emitting element of the present disclosure.

EFFECTS OF THE INVENTION

In the light emitting element of the present disclosure or a light emitting element constituting the light emitting element array of the present disclosure, the first light reflecting layer is formed on the concave mirror portion. Therefore, light is diffracted starting from the active layer and spreads.

Then, the light incident on the first light reflecting layer is reliably reflected toward the active layer, and can be collected on the active layer. Therefore, an increase in diffraction loss can be avoided, laser oscillation can be performed reliably, and the problem of thermal saturation can be avoided because of having a long resonator. Moreover, since the light convergence/divergence changing means is included, an emission state when light generated in the active layer is emitted to the outside can be accurately controlled so as to be in a desired state. Note that effects described here are merely illustrative, and are not restrictive. Furthermore, an additional effect may be present.

MODE FOR CARRYING OUT THE INVENTION

Figure 1:
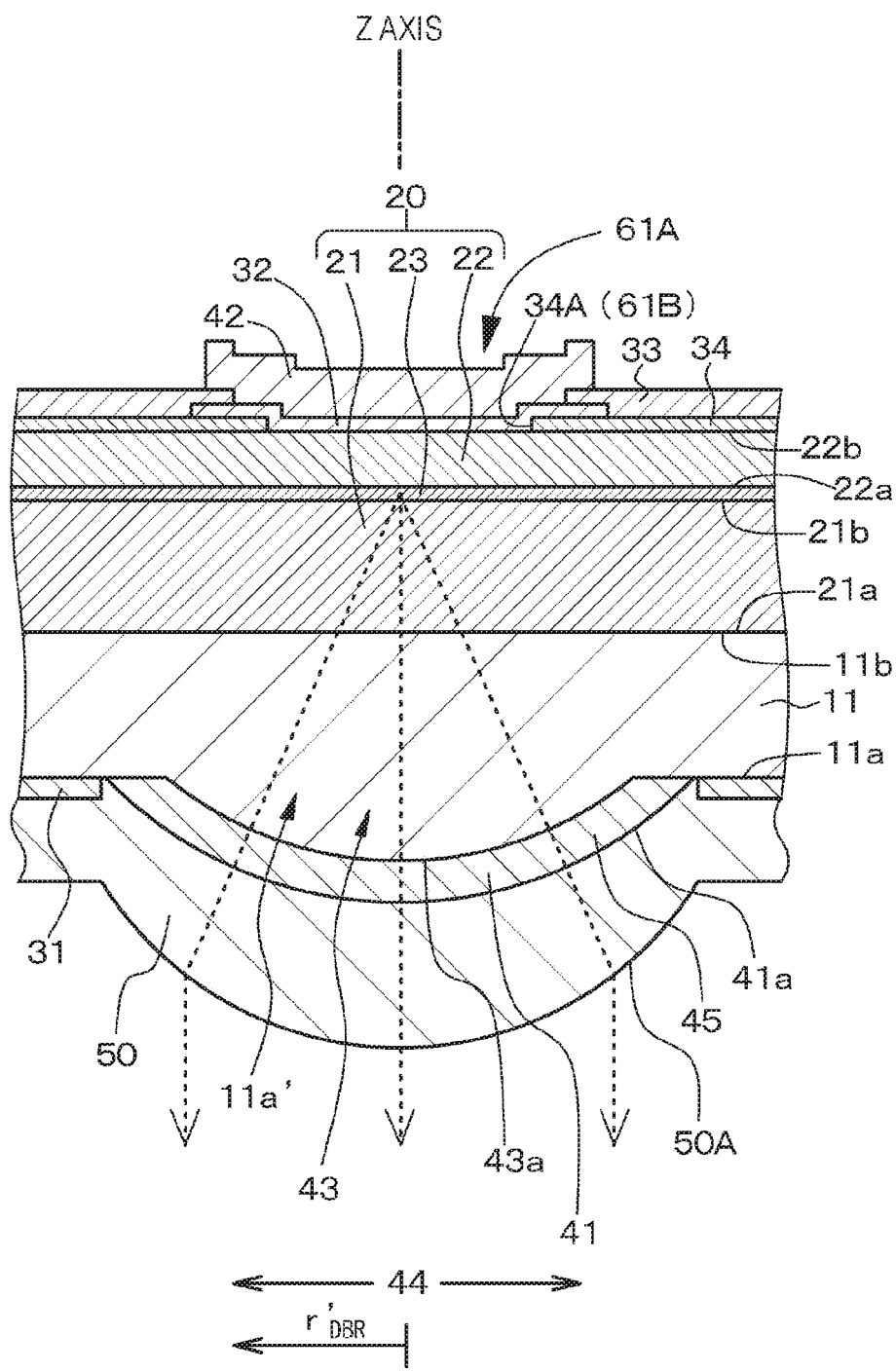
FIG. 1 is a schematic partial end view of a light emitting element of Example 1.

Hereinafter, the present disclosure will be described on the basis of Examples with reference to the drawings. However, the present disclosure is not limited to Examples, but various numerical values and materials in Examples are illustrative. Note that description will be made in the following order.

1. General description on light emitting element and light emitting element array of the present disclosure 2. Example 1 (light emitting element and light emitting element array according to a first aspect of the present disclosure, light emitting element having configuration 3-A)

3. Example 2 (modification of Example 1, light emitting element of configuration 3-B)

4. Example 3 (modification of Examples 1 and 2, light emitting element of configuration 4)

5. Example 4 (modification of Example 3)

6. Example 5 (light emitting element according to a second aspect of the present disclosure)

7. Example 6 (modification of Examples 1 to 5)

8. Example 7 (modification of Examples 1 to 6, light emitting element of configuration 1)

9. Example 8 (modification of Examples 1 to 7, light emitting element of configuration 2)

10. Example 9 (modification of Example 8)

11. Example 10 (modification of Example 8)

12. Others

General Description on Light Emitting Element and Light Emitting Element Array of the Present Disclosure In the light emitting element array of the present disclosure, light beams emitted from light emitting elements can have different wavelengths. In addition, in the light emitting element array of the present disclosure, a plurality of light emitting elements can be mounted on, for example, one mounting substrate. Note that the configuration and structure of each of the light emitting elements making wavelengths of light emitted therefrom different can be a known configuration and structure. Examples of the color of light emitted from the light emitting elements include blue, green, and red.

In the light emitting element of the present disclosure or a light emitting element constituting the light emitting element array of the present disclosure including the preferable form described above (hereinafter, these light emitting elements may be collectively referred to as "light emitting element and the like of the present disclosure"), when light generated in the active layer passes through the light convergence/divergence changing means, a more convergent state can be obtained than a state before the light is incident on the light convergence/divergence changing means. However, the present disclosure is not limited thereto. In some specifications required for the light emitting element, when light generated in the active layer passes through the light convergence/divergence changing means, a more divergent state can be obtained than a state before the light is incident on the light convergence/divergence changing means. In the form in which when light generated in the active layer passes through the light convergence/divergence changing means, a more convergent state is obtained than a state before the light is incident on the light convergence/divergence changing means, the light that has passed through the convergence/divergence changing unit can be parallel light, light that converges to a certain point or region, or light that diverges.

In the light emitting element and the like of the present disclosure including the preferable form described above, the light convergence/divergence changing means can be constituted by a convex lens, a Fresnel lens, or a hologram lens. Alternatively, the light convergence/divergence changing means can be constituted by a plasmonic element, a photonic crystal element, an element including a metamaterial, or a sub-wavelength diffraction grating.

Examples of a material constituting the convex lens or the Fresnel lens include a material transparent to light emitted from the active layer, such as a transparent insulating material layer. Specific examples thereof include silicon oxide ($SiO_X$), silicon nitride ($SiN_Y$), silicon oxynitride ($Si-O_XN_Y$), tantalum oxide ($Ta_2O_5$), zirconium oxide ($ZrO_2$), aluminum oxide ($Al_2O_3$), aluminum nitride (AlN), titanium oxide ($TiO_2$), magnesium oxide (MgO), chromium oxide ($CrO_x$), vanadium oxide ($VO_x$), tantalum nitride (TaN), and niobium nitride ($NbO_x$). The convex lens or the Fresnel lens can be formed by forming a resist material layer having the same cross-sectional shape as the convex lens or the Fresnel lens on such a transparent insulating material layer, and then etching back the resist material layer and the transparent insulating material layer. The transparent insulating material layer can be formed by various physical vapor deposition methods (PVD method) and various chemical vapor deposition methods (CVD method) depending on a material used. Alternatively, the transparent insulating material layer can be formed by application of a photosensitive resin material and exposure, or a method for forming a transparent resin material into a lens shape on the basis of a nanoprint method can also be adopted.

Moreover, in the light emitting element and the like of the present disclosure including the preferable form described above, light may be emitted via the first light reflecting layer, and the light convergence/divergence changing means may be disposed on a light emitting side of the first light reflecting layer. Note that the light emitting element and the like of the present disclosure with such a configuration is referred to as a "light emitting element according to a first aspect of the present disclosure" for convenience. In such a light emitting element according to the first aspect of the present disclosure, for example, the light convergence/divergence changing means only needs to be formed on or above a light emitting surface of the first light reflecting layer.

In the light emitting element according to the first aspect of the present disclosure, the center of curvature of the light convergence/divergence changing means on an optical axis (Z axis) (preferably, the center of curvature in a region of the light convergence/divergence changing means corresponding to an effective region of a radius $r'_{DBR}$ in a concave mirror portion as described later) can be located closer to the light convergence/divergence changing means than the center of curvature of the first light reflecting layer on the optical axis (Z axis) (preferably, the center of curvature in a region of the first light reflecting layer corresponding to an effective region of a radius $r'_{DBR}$ in the concave mirror portion).

In the light emitting element according to the first aspect of the present disclosure including the preferable configuration described above, on the optical axis (Z axis), a distance from a light emitting surface of the light convergence/divergence changing means to a light emitting surface of the first light reflecting layer is preferably $1 \times 10^{-6}$ m to $1 \times 10^{-3}$ m.

Moreover, in the light emitting element according to the first aspect of the present disclosure including the various preferable configurations described above, when the planar shape of the first light reflecting layer is assumed to a circle, the circle desirably has a diameter of $1 \times 10^{-4}$ m or less, preferably $5 \times 10^{-5}$ m to $1 \times 10^{-4}$ m.

Moreover, in the light emitting element according to the first aspect of the present disclosure including the various preferable configurations described above, the thickness of the light convergence/divergence changing means along the optical axis (Z axis) is preferably $1 \times 10^{-6}$ m to $1 \times 10^{-3}$ m.

Moreover, in the light emitting element according to the first aspect of the present disclosure including the various preferable configurations described above, a distance from the active layer to the first light reflecting layer is preferably $1 \times 10^{-5}$ m to $5 \times 10^{-4}$ m.

Alternatively, in the light emitting element and the like of the present disclosure including the preferable form described above, light may be emitted via the second light reflecting layer, and the light convergence/divergence changing means may be disposed on a light emitting side of the second light reflecting layer. Note that the light emitting element and the like of the present disclosure with such a configuration is referred to as a "light emitting element according to a second aspect of the present disclosure" for convenience. In such a light emitting element according to the second aspect of the present disclosure, for example, the light convergence/divergence changing means only needs to be formed on or above a light emitting surface of the second light reflecting layer.

In the light emitting element and the like of the present disclosure including the various preferable forms and configurations described above, a distance from the first light reflecting layer to the second light reflecting layer along the optical axis (Z axis) is $1\times10^{-5}$ m m or more. That is, the resonator length $L_{OR}$ satisfies $1\times10^{-5}$ m$\leq L_{OR}$, preferably $1\times10^{-5}$ m$\leq L_{OR}\leq 5\times10^{-4}$ m, more preferably $1\times10^{-5}$ m$\leq L_{OR}\leq 1\times10^{-4}$ m.

Moreover, in the light emitting element and the like of the present disclosure including the various preferable forms and configurations described above, the laminated structure can include a GaN-based compound semiconductor.

Moreover, in the light emitting element and the like of the present disclosure including the various preferable forms and configurations described above, the light emitting element can include a surface emitting laser element.

Here, the terms "on" and "above" are often used in the description of various elements constituting the light emitting element. These terms may refer to portions (regions) of various elements located in a direction away from the active layer, and may be different from an actual vertical relationship in the light emitting element. That is, for example, "on the concave mirror portion" refers to a portion (region) of the concave mirror portion located in a direction away from the active layer.

Moreover, in the light emitting element and the like of the present disclosure including the various preferable forms and configurations described above, the first light reflecting layer can include a light transmitting portion and a light shielding portion surrounding the light transmitting portion (light emission region restricting portion). Note that the shape of an outer edge of a current injection region as described later is preferably similar to the shape of an outer edge of the light transmitting portion. Furthermore, the shape of an outer edge of the concave mirror portion is preferably similar to the shape of the outer edge of the light transmitting portion. By disposing the light shielding portion, the light emission region can be controlled more accurately.

Examples of a specific position of the light shielding portion include the first compound semiconductor layer side of the first light reflecting layer and the side opposite to the first compound semiconductor layer side of the first light reflecting layer. More specifically, the specific position of the light shielding portion is as follows.

(A) In a case where the concave mirror portion is formed on a substrate, and the light shielding portion is formed on the first compound semiconductor layer side of the first light reflecting layer, the light shielding portion is:

(A-1) formed on a part of the concave mirror portion on the first compound semiconductor layer side, (A-2) formed on a part of the concave mirror portion on the first compound semiconductor layer side and on a part of the first surface of the substrate, or (A-3) formed on a part of the first surface of the substrate.

(B) In a case where the concave mirror portion is formed on a substrate, and the light shielding portion is formed in the first light reflecting layer, the light shielding portion is:

(B-1) formed on a part of the first light reflecting layer, (B-2) formed on a part of the first light reflecting layer and on a part of the first surface of the substrate, or (B-3) formed on a part of the first surface of the substrate.

(C) In a case where the concave mirror portion is formed in the first compound semiconductor layer, the light shielding portion is:

(C-1) formed on a part of a portion constituting the concave mirror portion in the first compound semiconductor layer, (C-2) formed on a part of a portion constituting the concave mirror portion in the first compound semiconductor layer and on a part of the first compound semiconductor layer located outside the concave mirror portion, or (C-3) formed on a part of the first surface of the first compound semiconductor layer located outside the concave mirror portion.

(D) In a case where the concave mirror portion is formed on the first compound semiconductor layer, and the light shielding portion is formed in the first light reflecting layer, the light shielding portion is (D-1) formed on a part of the first light reflecting layer, (D-2) formed on part of the first light reflecting layer and on a part of the first surface of the substrate, or (D-3) formed on a part of the first surface of the substrate.

The light shielding portion can be constituted by a metal film or an alloy film such as titanium (Ti), platinum (Pt), gold (Au), nickel (Ni), or palladium (Pd), or a laminate of these metal films and alloy films, or for example, can be constituted by a resin film including a carbon nanotube-containing resin material.

Moreover, in the light emitting element and the like of the present disclosure including the various preferable forms and configurations described above, the shape of the concave mirror portion can be a spherical form or a parabolic form having a coefficient of determination of 0.8 or more within a range of a beam waist radius wo from the central portion of the concave mirror portion. Here, the beam waist radius wo is defined by the following formula (A).

$$\omega_0^2 = (\lambda_0/\pi)\{L_{OR}(R_{DBR} - L_{OR})\}^{1/2} \tag{A}$$

Here, $\lambda_0$: Wavelength of desired light mainly emitted from light emitting element (oscillation wavelength)

$L_{OR}$: Resonator length $R_{DBR}$: Radius of curvature of concave mirror portion In the light emitting element and the like of the present disclosure including the preferable form and configuration described above, a figure drawn by an interface facing the laminated structure in a part of the concave mirror portion when the concave mirror portion is cut along a virtual plane including a laminating direction of the laminated structure can be a part of a circle or a part of a parabola, as described above. Strictly, the figure is not a part of a circle in some cases, or is not a part of a parabola in some cases. That is, a case where the figure is mostly a part of a circle or mostly a part of a parabola is also included in the case where "a figure is a part of a circle or a part of a parabola". Such a portion (region) of the concave mirror portion that is a part of a circle or a part of a parabola may be referred to as an "effective region in the concave mirror portion". Note that the figure drawn by an interface facing the laminated structure in a part of the concave mirror portion can be determined by measuring the shape of the interface with a measuring device, and analyzing the obtained data on the basis of a least square method.

Light Emitting Element of Configuration 1

In the light emitting element and the like of the present disclosure including the preferable form and configuration described above, the second compound semiconductor layer has a current injection region and a current non-injection region (current confinement region) surrounding the current injection region, and a shortest distance $D_{CI}$ from the area center of gravity of the current injection region to a boundary between the current injection region and the current non-injection region preferably satisfies the following formula (B). Here, the light emitting element having such a configuration is referred to as a "light emitting element of configuration 1" for convenience. Note that for derivation of the following formula, see, for example, H. Kogelnik and T. Li, "Laser Beams and Resonators", Applied Optics/Vol. 5, No. 10/October 1966.

$$D_{CF} \geq \omega_0/2 \quad (B)$$

Figure 26:
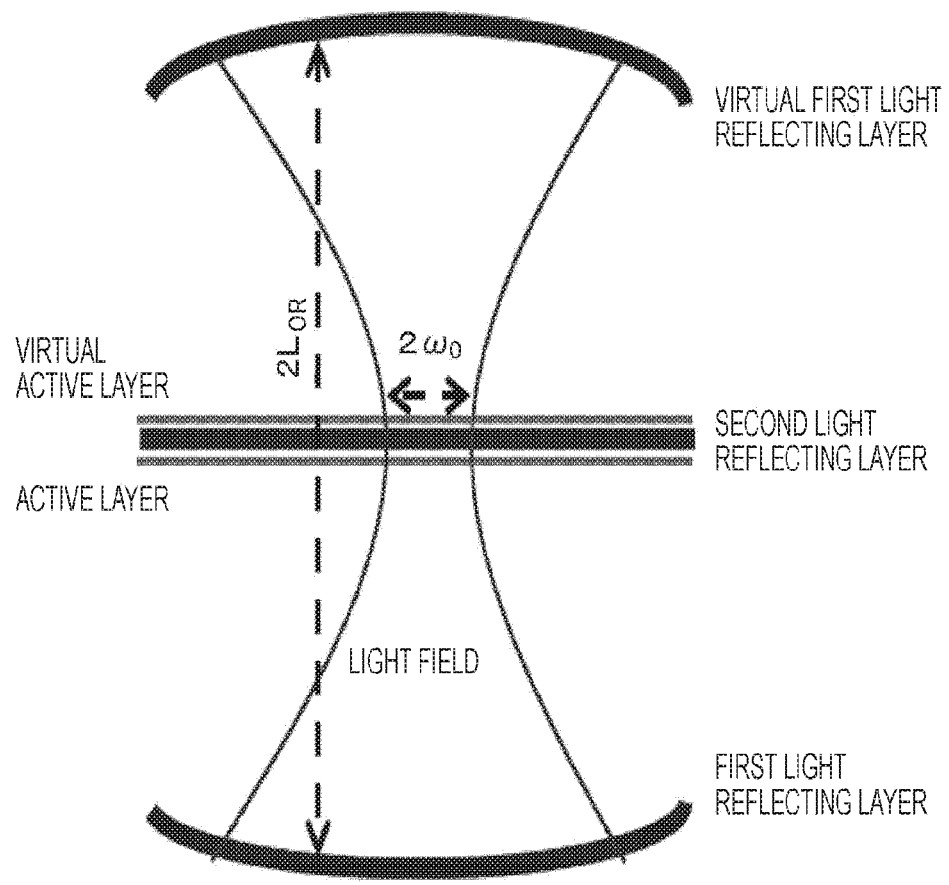
FIG. 26 is a conceptual diagram assuming a Fabry-Perot resonator sandwiched between two concave mirror portions having the same radius of curvature in the light emitting element of Example 1.
Figure 27:
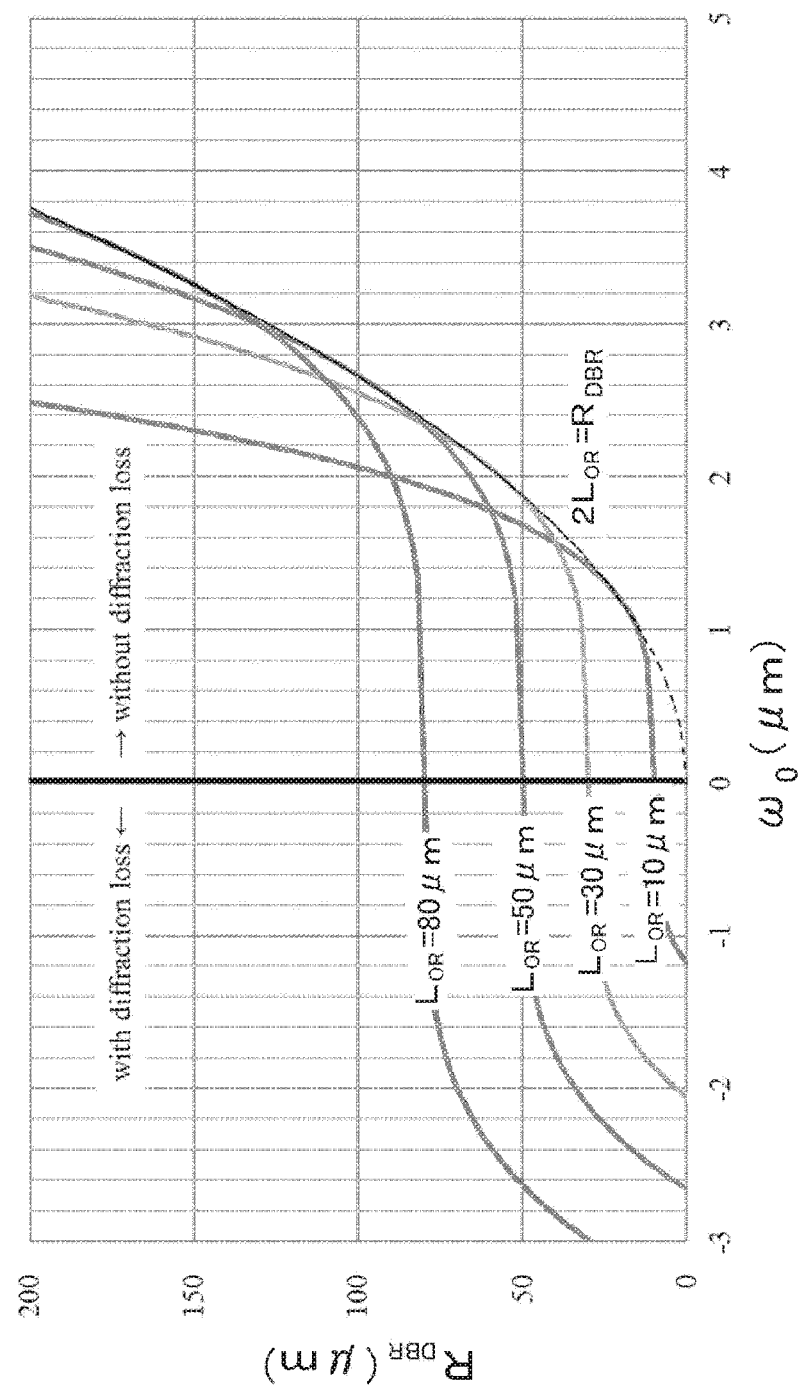
FIG. 27 is a graph illustrating a relationship among a value of $\omega_0$, a value of a resonator length $L_{OR}$, and a value of a radius of curvature $R_{DBR}$ of a concave mirror portion.
Figure 28:
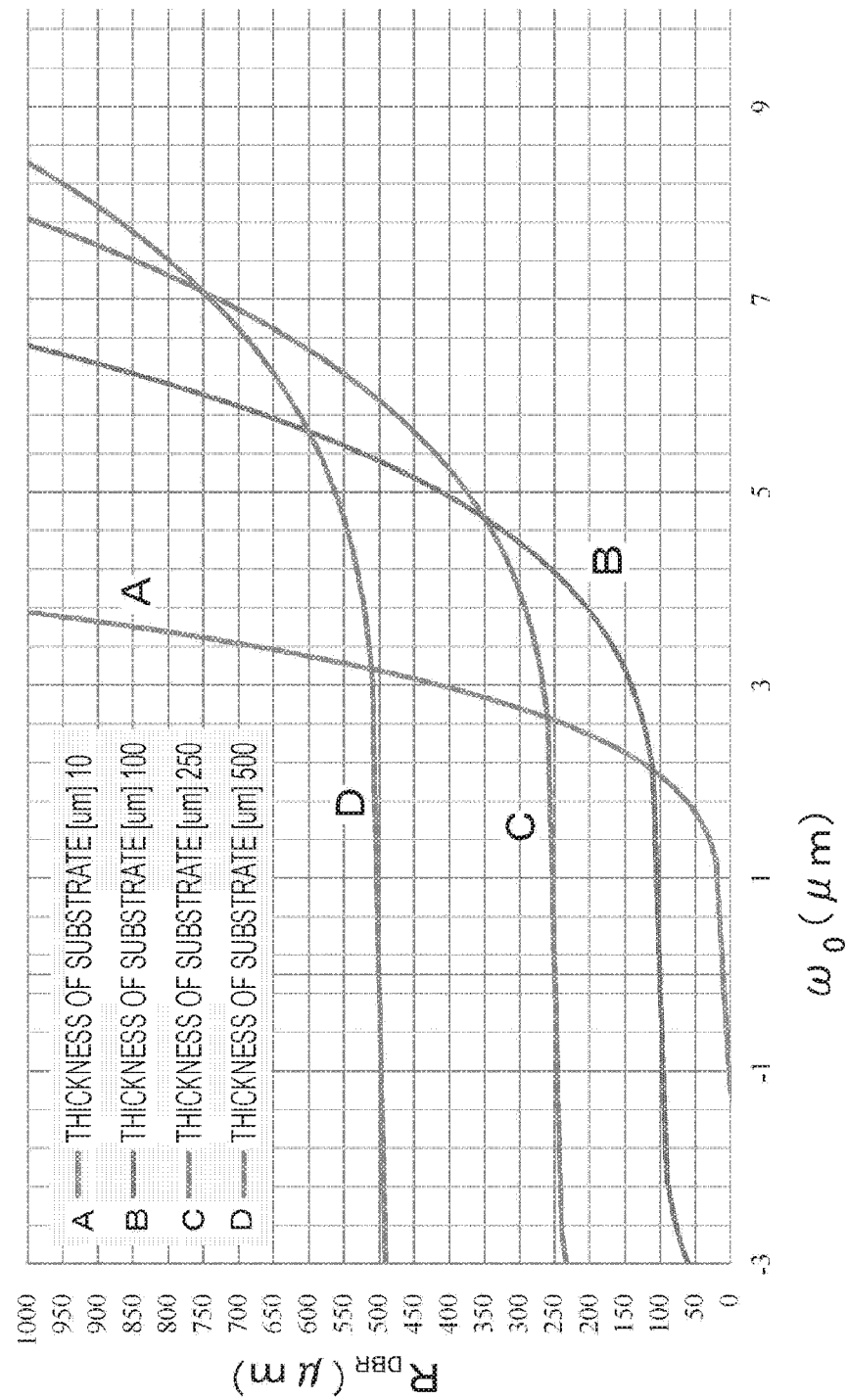
FIG. 28 is a graph illustrating a relationship among a value of $\omega_0$, a value of a resonator length $L_{OR}$, and a value of a radius of curvature $R_{DBR}$ of a concave mirror portion.
Figure 29A:
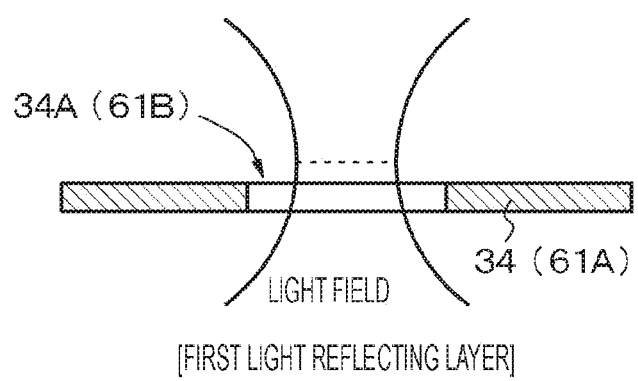
FIG. 29A is a diagram schematically illustrating a laser beam collecting state when a value of $\omega_0$ is "positive"
Figure 29B:
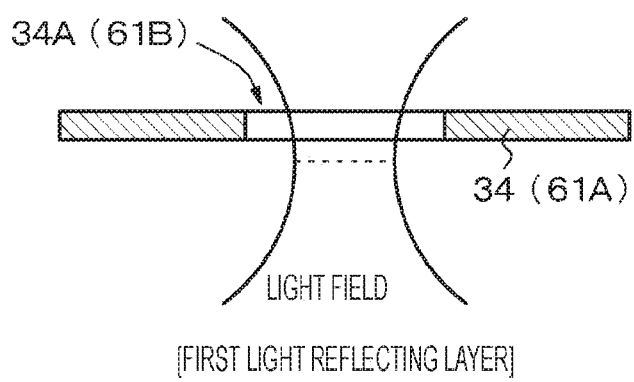
FIG. 29B is a diagram schematically illustrating a laser beam collecting state when a value of $\omega_0$ is "negative".

Here, in the light emitting element and the like of the present disclosure, the first light reflecting layer is formed on the concave mirror portion. However, considering objectivity of the second light reflecting layer with respect to a flat mirror, the resonator can be expanded to a Fabry-Perot resonator sandwiched between two concave mirror portions having the same radius of curvature (see the schematic diagram of FIG. 26). At this time, the resonator length of the virtual Fabry-Perot resonator is twice the resonator length $L_{OR}$. FIGS. 27 and 28 are graphs illustrating a relationship among a value of $\omega_0$, a value of the resonator length $L_{OR}$, and a value of a radius of curvature $R_{DBR}$ of an interface with the concave mirror portion. Note that a "positive" value of $\omega_0$ indicates that a laser beam is schematically in the state of FIG. 29A, and a "negative" value of $\omega_0$ indicates that a laser beam is schematically in the state of FIG. 29B. The state of the laser beam may be the state illustrated in FIG. 29A or the state illustrated in FIG. 29B. However, the virtual Fabry-Perot resonator having two concave mirror portions is in the state illustrated in FIG. 29B when the radius of curvature $R_{DBR}$ is smaller than the resonator length $L_{OR}$, resulting in excessive confinement and diffraction loss. Therefore, the state illustrated in FIG. 29A in which the radius of curvature $R_{DBR}$ is larger than the resonator length $L_{OR}$ is preferable. Note that when the active layer is disposed closer to the flat light reflecting layer, specifically, closer to the second light reflecting layer out of the two light reflecting layers, a light field is more collected in the active layer. That is, light field confinement in the active layer is strengthened, and laser oscillation is facilitated. The position of the active layer, that is, a distance from a surface of the second light reflecting layer facing the second compound semiconductor layer to the active layer is not limited, but is $\lambda_0/2$ to $10\lambda_0$, for example.

By the way, in a case where a region where light reflected by the first light reflecting layer is collected is not included in a current injection region corresponding to a region where the active layer has gain by current injection, stimulated emission of light from a carrier is inhibited. As a result, laser oscillation may be inhibited. By satisfying the above formulas (A) and (B), inclusion of the region where light reflected by the first light reflecting layer is collected in the current injection region can be ensured, and laser oscillation can be achieved reliably.

In the light emitting element of configuration 1, the radius $r'_{DBR}$ of the effective region in the concave mirror portion can satisfy $\omega_0 \leq r'_{DBR} \leq 20 \cdot \omega_0$, preferably $\omega_0 \leq r'_{RBR} \leq 10 \cdot \omega_0$. Alternatively, examples of the value of $r'_{DBR}$ include $r'_{DBR} \leq 1 \times 10^{-4}$ m, preferably $r'_{DBR} \leq 5 \times 10^{-5}$ m. Furthermore, examples of the height hDBR of the concave mirror portion include $h_{DBR} \leq 5 \times 10^{-5}$ m. Moreover, in the light emitting element of configuration 1 including such a preferable configuration, $D_{CF} \geq \omega_0$ can be satisfied.

In the light emitting element and the like of the present disclosure, the shape of the concave mirror portion is preferably a spherical shape or a parabolic shape having a coefficient of determination of 0.8 or more within a range (region) of the beam waist radius $\omega_0$ from the central portion of the concave mirror portion. For example, within a range (region) of 1.2 times the beam waist radius $\omega_0$, or within a range (region) twice the beam waist radius $\omega_0$, the shape of the concave mirror portion is desirably a spherical shape or a parabolic shape having a coefficient of determination of 0.8 or more, preferably 0.9 or more, more preferably 0.99 or more. The coefficient of determination CD is a value indicating how much an independent variable (explaining variable) can explain a dependent variable (explained variable), and is defined by the following formula (C). Specifically, when a measured coordinate of the concave mirror portion is represented by $y_i$, and an expected ideal coordinate of the concave mirror portion is represented by $f_i$, a square of the coefficient of determination CD is obtained by subtracting a value obtained by dividing the sum of squares of a residual by the sum of squares of a difference from an average ($y_{ave}$) of the measured coordinates from 1. As the square of the coefficient of determination CD is closer to 1, a relative residual is smaller. Note that the figure (measured coordinate) drawn by a part of the concave mirror portion can be obtained by measuring the shape of the concave mirror portion (specifically, the shape of an interface between the concave mirror portion and the first light reflecting layer) with a measuring device.

$$CD^2 = 1 - [\Sigma_i(y_i - f_i)^2]/[\Sigma_i(y_i - y_{ave})^2] \quad (C)$$

In the light emitting element and the like of the present disclosure, a current confinement region (current non-injection region) is preferably formed in the second compound semiconductor layer. Specifically, the current confinement region (current non-injection region) can be formed on the basis of an ion injection method. In this case, an ion species can be at least one ion selected from the group including boron, proton, phosphorus, arsenic, carbon, nitrogen, fluorine, oxygen, germanium, and silicon (that is, one type of ion or two or more types of ions). Alternatively, the current confinement region (current non-injection region) can be formed in the second compound semiconductor layer on the basis of an ashing treatment, can be formed in the second compound semiconductor layer on the basis of a reactive etching (RIE) treatment, or can be formed on the basis of plasma irradiation. In these treatments, the current confinement region (current non-injection region) is exposed to plasma particles. Therefore, the conductivity of the second compound semiconductor layer is deteriorated, and the current confinement region is in a high resistance state. That is, the current confinement region is formed by exposure of the second surface of the second compound semiconductor layer to the plasma particles. Specific examples of the plasma particles include argon, oxygen, and nitrogen. Alternatively, the current confinement region (current non-injection region) can be formed by etching an insulating film formed on the second compound semiconductor layer. Examples of a material constituting the insulating film include $SiO_X$, $SiN_X$, $AlO_X$, $ZrO_X$, and $HfO_X$. Alternatively, in order to obtain the current confinement region, the second compound semiconductor layer and the like may be etched by an RIE method and the like to form a mesa structure, or some of the laminated second compound semiconductor layers may be partially oxidized from a lateral direction to form the current confinement region. Alternatively, these may be appropriately combined with each other.

Light Emitting Element of Configuration 2

Moreover, in the light emitting element and the like of the present disclosure including the preferable form and configuration described above (including the light emitting element of configuration 1), the laminated structure including the second electrode can have at least two light absorbing material layers in parallel with the virtual plane occupied by the active layer. Here, the light emitting element of such a configuration is referred to as a "light emitting element of configuration 2" for convenience. In addition, the light emitting element of configuration 2 preferably has at least four light absorbing material layers.

In the light emitting element of configuration 2 including the preferable configuration described above, if an oscillation wavelength (wavelength of light emitted mainly from the light emitting element and desired oscillation wavelength) is represented by $\lambda_0$, an equivalent refractive index of the whole of the two light absorbing material layers and the laminated structure located between the light absorbing material layers is represented by $n_{eq}$, and a distance between the light absorbing material layers is represented by $L_{Abs}$, $$0.9 \times \{(m \cdot \lambda_0)/(2 \cdot n_{eq})\} \leq L_{Abs} \leq 1.1 \times \{m \cdot \lambda_0)/(2 \cdot n_{eq})\}$$

is preferably satisfied. Here, m is 1 or any integer of 2 or more including 1. When the thickness of each of the two light absorbing material layers and layers constituting the laminated structure located between the light absorbing material layers is represented by $t_i$, and the refractive index thereof is represented by $n_i$, the equivalent refractive index $n_{eq}$ is represented by $$n_{eq} = \Sigma(t_i \times n_i)/\Sigma(t_i).$$

In the formula, i=1, 2, 3, . . . , I, "I" is the total number of the two light absorbing material layers and layers constituting the laminated structure located between the light absorbing material layers, and "$\Sigma$" means summing up values of i=1 to i=I. In order to determine the equivalent refractive index $n_{eq}$, it is only required to observe constituent materials by electron microscopic observation and the like of a cross section of the light emitting element and to perform calculation on the basis of a known refractive index of each of the constituent materials and the thickness thereof obtained by observation. In a case where m is 1, a distance between adjacent light absorbing material layers satisfies, in all the plurality of light absorbing material layers, $$0.9 \times \{\lambda_0/(2 \cdot n_{eq})\} \leq L_{Abs} \leq 1.1 \times \{(\lambda_0)/(2 \cdot n_{eq})\}.$$

Furthermore, when m is any integer of 2 or more including 1, for example, if m=1 or 2, in some light absorbing material layers, a distance between adjacent light absorbing material layers satisfies $$0.9 \times \{\lambda_0/(2 \cdot n_{eq})\} \leq L_{Abs} \leq 1.1 \times \{(\lambda_0)/(2 \cdot n_{eq})\},$$

and in the remaining light absorbing material layers, a distance between adjacent light absorbing material layers satisfies $$0.9 \times \{(2 \cdot \lambda_0)/(2 \cdot n_{eq})\} \leq L_{Abs} \leq 1.1 \times \{(2 \cdot \lambda_0)/(2 \cdot n_{eq})\}.$$

Broadly, in some light absorbing material layers, a distance between adjacent light absorbing material layers satisfies, $$0.9 \times \{\lambda_0/(2 \cdot n_{eq})\} \leq L_{Abs} \leq 1.1 \times \{\lambda_0/(2 \cdot n_{eq})\},$$

and in the remaining light absorbing material layers, a distance between adjacent light absorbing material layers satisfies $$0.9 \times \{m' \cdot \lambda_0)/(2 \cdot n_{eq})\} \leq L_{Abs} \leq 1.1 \times \{(m' \cdot \lambda_0)/(2 \cdot n_{eq})\}.$$

Here, m' is any integer of 2 or more. Furthermore, the distance between adjacent light absorbing material layers is a distance between the centers of gravity of the adjacent light absorbing material layers. That is, actually, the distance is a distance between the centers of light absorbing material layers when the light absorbing material layers are cut with a virtual plane of the active layer in a thickness direction thereof.

Moreover, in the light emitting element of configuration 2 including the various preferable configurations described above, the light absorbing material layers preferably have a thickness of $\lambda_0/(4 \cdot n_{eq})$ or less. A lower limit value of the thickness of the light absorbing material layers may be 1 nm, for example.

Moreover, in the light emitting element of configuration 2 including the various preferable configurations described above, the light absorbing material layer can be located at a minimum amplitude portion generated in a standing wave of light formed in the laminated structure.

Moreover, in the light emitting element of configuration 2 including the various preferable configurations described above, the active layer can be located at a maximum amplitude portion generated in a standing wave of light formed in the laminated structure.

Moreover, in the light emitting element of configuration 2 including the various preferable configurations described above, the light absorbing material layers can have an optical absorption coefficient of twice or more the optical absorption coefficient of a compound semiconductor constituting the laminated structure. Here, the optical absorption coefficient of the light absorbing material layers and the optical absorption coefficient of the compound semiconductor constituting the laminated structure can be determined by observing constituent materials by electron microscopic observation and the like of a cross section of the light emitting element and analogizing on the basis of known evaluation results obtained by observing the constituent materials.

Moreover, in the light emitting element of configuration 2 including the various preferable configurations described above, each of the light absorbing material layers can include at least one selected from the group including a compound semiconductor material having a narrower band gap than the compound semiconductor constituting the laminated structure, a compound semiconductor material doped with impurities, a transparent conductive material, and a light reflecting layer constituting material having a light absorbing characteristic. Here, examples of the compound semiconductor material having a narrower band gap than the compound semiconductor constituting the laminated structure include InGaN in a case where the compound semiconductor constituting the laminated structure is GaN. Examples of the compound semiconductor material doped with impurities include n-GaN doped with Si and n-GaN doped with B. Examples of the transparent conductive material include a transparent conductive material constituting an electrode described later. Examples of the light reflecting layer constituting material having a light absorbing characteristic include a material constituting a light reflecting layer as described later (for example, $SiO_X$, $SiN_X$, or $TaO_X$). Each of the light absorbing material layers may include one of these materials. Alternatively, each of the light absorbing material layers may include various materials selected from these materials. However, one light absorbing material layer preferably includes one material from a viewpoint of simplification of forming the light absorbing material layers. The light absorbing material layers may be formed in the first compound semiconductor layer, in the second compound semiconductor layer, in the first light reflecting layer, or in the second light reflecting layer. Alternatively, any combination thereof may be used. Alternatively, each of the light absorbing material layers can also serve as an electrode including a transparent conductive material, as described later.

Light Emitting Element of Configuration 3

Moreover, in the light emitting element and the like of the present disclosure including the preferable form and configuration described above (including the light emitting elements of configurations 1 and 2), a compound semiconductor substrate can be disposed between the first surface of the first compound semiconductor layer and the first light reflecting layer. Here, the light emitting element of such a configuration is referred to as a "light emitting element of configuration 3" for convenience. In this case, the compound semiconductor substrate can be constituted by a GaN substrate. Note that examples of the thickness of the compound semiconductor substrate include $5 \times 10^{-5}$ m to $1 \times 10^{-4}$ m, but are not limited to such values. In addition, in the light emitting element of configuration 3 including such a configuration, the first light reflecting layer can include a multilayer light reflecting film formed on a part of a surface of the concave mirror portion constituted by a protrusion of the compound semiconductor substrate. Here, the light emitting element of such a configuration is referred to as a "light emitting element of configuration 3-A" for convenience. Alternatively, the first light reflecting layer can include a multilayer light reflecting film formed on a part of a surface of the concave mirror portion formed on the compound semiconductor substrate. Here, the light emitting element of such a configuration is referred to as a "light emitting element of configuration 3-B" for convenience. A material constituting the concave mirror portion in the light emitting element of configuration 3-A is, for example, a GaN substrate. As the GaN substrate, any one of a polar substrate, an antipolar substrate, and a nonpolar substrate may be used. Meanwhile, examples of a material constituting the concave mirror portion in the light emitting element of configuration 3-B include a transparent dielectric material such as $TiO_2$, $Ta_2O_5$, or $SiO_2$, a silicone-based resin, and an epoxy-based resin.

Light Emitting Element of Configuration 4

Alternatively, in the light emitting element and the like of the present disclosure including the preferable form and configuration described above (including the light emitting elements of configurations 1 and 2), the first light reflecting layer can be formed on the first surface of the first compound semiconductor layer. Here, the light emitting element of such a configuration is referred to as a "light emitting element of configuration 4" for convenience.

Moreover, in the light emitting element and the like of the present disclosure including the preferable form and configuration described above (including the light emitting elements of configurations 1 to 4), the laminated structure can have a higher value of thermal conductivity than the first light reflecting layer. The value of thermal conductivity of a dielectric material constituting the first light reflecting layer is generally about 10 watts/(m·K) or less. Meanwhile, the value of thermal conductivity of the GaN-based compound semiconductor constituting the laminated structure is about 50 watts/(m·K) to about 100 watts/(m·K).

Moreover, in the light emitting element and the like of the present disclosure including the preferable form and configuration described above (including the light emitting elements of configurations 1 to 4), if the radius of curvature of the concave mirror portion of the light emitting element (specifically, an effective region of the radius $r'_{DBR}$ in the concave mirror portion) is represented by $R_{DBR}$, $R_{DBR} \leq 1 \times 10^{-3}$ m, preferably $1 \times 10^{-5}$ m $\leq R_{DBR} \leq 1 \times 10^{-3}$ m, more preferably $1 \times 10^{-5}$ m $\leq R_{DBR} \leq 1 \times 10^{-4}$ m can be satisfied.

Moreover, in the light emitting element and the like of the present disclosure including the preferable form and configuration described above (including the light emitting elements of configurations 1 to 4), a convex portion is formed around the first light reflecting layer. The first light reflecting layer does not need to protrude from the convex portion, and this can protect the first light reflecting layer. That is, since the first light reflecting layer is disposed in a state of being retracted from the convex portion, for example, even if an object comes into contact with the convex portion, the object does not come into contact with the first light reflecting layer. This can protect the first light reflecting layer reliably.

Furthermore, in the light emitting element and the like of the present disclosure including the preferable form and configuration described above (including the light emitting elements of configurations 1 to 4), a material constituting various compound semiconductor layers (including the compound semiconductor substrate) located between the active layer and the first light reflecting layer preferably has no modulation of 10% or more in refractive index (no difference of 10% or more in refractive index on the basis of an average refractive index of the laminated structure). This can suppress occurrence of disturbance of an optical field in the resonator.

As described above, by the light emitting element and the like of the present disclosure including the preferable form and configuration described above, a surface emitting laser element (vertical cavity laser, VCSEL) that emits a laser beam via the first light reflecting layer, or a surface emitting laser element that emits a laser beam via the second light reflecting layer can be constituted. Note that a light emitting element manufacturing substrate as described later may be removed in some cases.

In the light emitting element and the like of the present disclosure, specifically, the laminated structure can include an AlInGaN-based compound semiconductor. Here, more specific examples of the AlInGaN-based compound semiconductor include GaN, AlGaN, InGaN, and AlInGaN. Moreover, these compound semiconductors may contain a boron (B) atom, a thallium (Tl) atom, an arsenic (As) atom, a phosphorus (P) atom, or an antimony (Sb) atom, if desired. The active layer preferably has a quantum well structure. Specifically, the active layer may have a single quantum well structure (SQW structure) or a multiple quantum well structure (MQW structure). The active layer having a quantum well structure has a structure obtained by laminating at least one well layer and at least one barrier layer. Examples of a combination of (a compound semiconductor constituting the well layer, a compound semiconductor constituting the barrier layer) include $(In_yGa_{(1-y)}N, GaN)$, $(In_yGa_{(1-y)}N, In_zGa_{(1-z)}N)$ [provided that y>z is satisfied], and $(In_yGa_{(1-y)}N, AlGaN)$. The first compound semiconductor layer may include a compound semiconductor of a first conductivity type (for example, n-type), and the second compound semiconductor layer may include a compound semiconductor of a second conductivity type (for example, p-type) different from the first conductivity type. The first compound semiconductor layer and the second compound semiconductor layer are also referred to as a first cladding layer and a second cladding layer, respectively. Each of the first compound semiconductor layer and the second compound semiconductor layer may be a single structure layer, a multilayer structure layer, or a superlattice structure layer. Moreover, each of the first compound semiconductor layer and the second compound semiconductor layer may include a composition gradient layer and a concentration gradient layer.

The laminated structure is formed on the second surface of the light emitting element manufacturing substrate, or on the second surface of the compound semiconductor substrate. Examples of the light emitting element manufacturing substrate include a GaN substrate, a sapphire substrate, a GaAs substrate, a SiC substrate, an alumina substrate, a ZnS substrate, a ZnO substrate, an AlN substrate, a LiMgO substrate, a LiGaO$_2$ substrate, a MgAl$_2$O$_4$ substrate, an InP substrate, a Si substrate, and a substrate having an underlying layer or a buffer layer formed on a surface (main surface) of each of these substrates. The GaN substrate is preferably used because of low defect density thereof. Furthermore, examples of the compound semiconductor substrate include a GaN substrate. It is known that the GaN substrate changes characteristics thereof among a polar characteristic, a nonpolar characteristic, and a semipolar characteristic depending on a growth surface, but any main surface (second surface) of the GaN substrate can be used for forming the compound semiconductor layer. Furthermore, regarding the main surface of the GaN substrate, depending on a crystal structure (for example, a cubic type or a hexagonal type), a crystal orientation plane such as a so-called surface A, B, C, R, M, N, or S, planes obtained by making these planes offset in a specific direction, and the like can also be used. Examples of a method for forming various compound semiconductor layers constituting the light emitting element include a metal organic-chemical vapor deposition method (MOCVD method), a metal organic-vapor phase epitaxy method (MOVPE method), a molecular beam epitaxy method (MBE method), a hydride vapor phase epitaxy method (HVPE method) in which a halogen contributes to transport or a reaction, an atomic layer deposition method (ALD method), a migration-enhanced epitaxy (MEE) method, and a plasma assisted physical vapor deposition method (PPD method). However, the method is not limited thereto.

Here, examples of an organic gallium source gas in the MOCVD method include a trimethyl gallium (TMG) gas and a triethyl gallium (TEG) gas. Examples of a nitrogen source gas include an ammonia gas and a hydrazine gas. In forming a GaN-based compound semiconductor layer having n-type conductivity, for example, silicon (Si) only needs to be added as an n-type impurity (n-type dopant). In forming a GaN-based compound semiconductor layer having p-type conductivity, for example, magnesium (Mg) only needs to be added as a p-type impurity (p-type dopant). In a case where aluminum (Al) or indium (In) is contained as a constituent atom of the GaN-based compound semiconductor layer, a trimethyl aluminum (TMA) gas only needs to be used as an Al source, and a trimethyl indium (TMI) gas only needs to be used as an In source. Moreover, a monosilane gas (SiH$_4$ gas) only needs to be used as a Si source, and a biscyclopentadienyl magnesium gas, methyl cyclopentadienyl magnesium, or biscyclopentadienyl magnesium (Cp$_2$Mg) only needs to be used as a Mg source. Note that examples of the n-type impurity (n-type dopant) further include Ge, Se, Sn, C, Te, S, O, Pd, and Po in addition to Si, and examples of the p-type impurity (p-type dopant) further include Zn, Cd, Be, Ca, Ba, C, Hg, and Sr in addition to Mg.

For example, it is only required to constitute the supporting substrate by any one of the various substrates exemplified as the light emitting element manufacturing substrate. Alternatively, the supporting substrate can be constituted by an insulating substrate including AlN and the like, a semiconductor substrate including Si, SiC, Ge, and the like, a metal substrate, or an alloy substrate. However, a conductive substrate is preferably used. Alternatively, a metal substrate or an alloy substrate is preferably used from viewpoints of a mechanical characteristic, elastic deformation, a plastic deformation property, a heat radiation property, and the like. As the thickness of the supporting substrate, for example, 0.05 mm to 1 mm can be exemplified. As a method for fixing the second light reflecting layer to the supporting substrate, a known method such as a solder bonding method, a room temperature bonding method, a bonding method using an adhesive tape, a bonding method using wax bonding, or a method using an adhesive can be used. However, the solder bonding method or the room temperature bonding method is desirably adopted from a viewpoint of ensuring conductivity. For example, in a case where a silicon semiconductor substrate which is a conductive substrate is used as the supporting substrate, a method capable of bonding at a low temperature of 400° C. or lower is desirably adopted in order to suppress warpage due to a difference in a thermal expansion coefficient. In a case where a GaN substrate is used as the supporting substrate, a bonding temperature may be 400° C. or higher.

In manufacturing the light emitting element and the like of the present disclosure, the light emitting element manufacturing substrate may be left, or the light emitting element manufacturing substrate may be removed after the active layer, the second compound semiconductor layer, the second electrode, and the second light reflecting layer are sequentially formed on the first compound semiconductor layer. Specifically, it is only required to form the active layer, the second compound semiconductor layer, the second electrode, and the second light reflecting layer sequentially on the first compound semiconductor layer, subsequently to fix the second light reflecting layer to the supporting substrate, and then to remove the light emitting element manufacturing substrate to expose the first compound semiconductor layer (first surface of the first compound semiconductor layer). The light emitting element manufacturing substrate can be removed by a wet etching method using an alkali aqueous solution such as a sodium hydroxide aqueous solution or a potassium hydroxide aqueous solution, an ammonia solution+a hydrogen peroxide solution, a sulfuric acid solution+a hydrogen peroxide solution, a hydrochloric acid solution+a hydrogen peroxide solution, a phosphoric acid solution+a hydrogen peroxide solution, and the like, a chemical/mechanical polishing method (CMP method), a mechanical polishing method, a dry etching method, a lift-off method using a laser, and the like, or a combination thereof.

In a case where the light emitting element manufacturing substrate is left, the first electrode only needs to be formed on the first surface facing the second surface of the light emitting element manufacturing substrate, or on the first surface facing the second surface of the compound semiconductor substrate. Furthermore, in a case where the light emitting element manufacturing substrate is not left, the first electrode only needs to be formed on the first surface of the first compound semiconductor layer constituting the laminated structure. Note that in this case, since the first light reflecting layer is formed on the first surface of the first compound semiconductor layer, for example, the first electrode only needs to be formed so as to surround the first light reflecting layer. For example, the first electrode desirably has a single layer configuration or a multilayer configuration including at least one metal (including an alloy) selected from the group including gold (Au), silver (Ag), palladium (Pd), platinum (Pt), nickel (Ni), Ti (titanium), vanadium (V), tungsten (W), chromium (Cr), Al (aluminum), Cu (copper), Zn (zinc), tin (Sn), and indium (In). Specific examples thereof include Ti/Au, Ti/Al, Ti/Al/Au, Ti/Pt/Au, Ni/Au, Ni/Au/Pt, Ni/Pt, Pd/Pt, and Ag/Pd. Note that the further forward a layer in "/" of the multilayer configuration is located, the closer to the active layer the layer is located. This applies to the following description similarly. For example, a film of the first electrode can be formed by a PVD method such as a vacuum vapor deposition method or a sputtering method.

In a case where the first electrode is formed so as to surround the first light reflecting layer, the first light reflecting layer and the first electrode can be in contact with each other. Alternatively, the first light reflecting layer and the first electrode can be separated from each other. That is, the first light reflecting layer and the first electrode can have an offset, and a separation distance can be within 1 mm. When the current injection region located in the first light reflecting layer and the first electrode are separated from each other in a plane, a current flows through the first compound semiconductor layer for a long distance. Therefore, in order to keep the electric resistance generated in this current path low, the separation distance is preferably within 1 mm. In some cases, the first electrode can be formed even on an edge of the first light reflecting layer, or the first light reflecting layer can be formed even on an edge of the first electrode. Here, in a case where the first light reflecting layer is formed even on an edge of the first electrode, the first electrode needs to have an opening having a certain size in order to prevent absorption of fundamental mode light of laser oscillation as much as possible. The size of the opening varies depending on the wavelength of the fundamental mode and the optical confinement structure in a lateral direction (in-plane direction of the first compound semiconductor layer), and therefore is not limited, but is preferably approximately on the order of several times or more the oscillation wavelength $\lambda_0$.

The second electrode can include a transparent conductive material. Examples of the transparent conductive material constituting the second electrode include an indium-based transparent conductive material [specifically, for example, indium-tin oxide (ITO, including Sn-doped $In_2O_3$, crystalline ITO, and amorphous ITO), indium-zinc oxide (IZO), indium-gallium oxide (IGO), indium-doped gallium-zinc oxide (IGZO and In—$GaZnO_4$), IFO (F-doped $In_2O_3$)], ITiO (Ti-doped $In_2O_3$), InSn, or InSnZnO], a tin-based transparent conductive material [specifically, for example, tin oxide ($SnO_2$), ATO (Sb-doped $SnO_2$), or FTO (F-doped $SnO_2$)], and a zinc-based transparent conductive material [specifically, for example, zinc oxide (ZnO, including Al-doped ZnO (AZO) and B-doped ZnO), gallium-doped zinc oxide (GZO), AlMgZnO (aluminum oxide and magnesium oxide-doped zinc oxide), and NiO. Alternatively, examples of the second electrode include a transparent conductive film having a host layer of gallium oxide, titanium oxide, niobium oxide, antimony oxide, nickel oxide, and the like, and further include a transparent conductive material such as a spinel type oxide or an oxide having an $YbFe_2O_4$ structure. However, the material constituting the second electrode is not limited to the transparent conductive material although depending on a disposition state of the second light reflecting layer and the second electrode. A metal such as palladium (Pd), platinum (Pt), nickel (Ni), gold (Au), cobalt (Co), or rhodium (Rh) can also be used. The second electrode only needs to include at least one of these materials. For example, a film of the second electrode can be formed by a PVD method such as a vacuum vapor deposition method or a sputtering method. Alternatively, a low-resistance semiconductor layer can also be used as the transparent electrode layer. In this case, specifically, an n-type GaN-based compound semiconductor layer can also be used. Moreover, in a case where a p-type layer is adjacent to the n-type GaN-based compound semiconductor layer, the electric resistance of an interface can also be lowered by bonding both layers to each other via a tunnel junction. By constituting the second electrode by a transparent conductive material, a current can be spread in a lateral direction (in-plane direction of the second compound semiconductor layer), and a current can be supplied to a current injection region efficiently.

A pad electrode may be disposed on the first electrode or the second electrode in order to connect the first electrode or the second electrode to an external electrode or circuit electrically. The pad electrode desirably has a single layer configuration or a multilayer configuration containing at least one metal selected from the group including titanium (Ti), aluminum (Al), platinum (Pt), gold (Au), nickel (Ni), and palladium (Pd). Alternatively, the pad electrode may have a multilayer configuration such as a Ti/Pt/Au multilayer configuration, a Ti/Au multilayer configuration, a Ti/Pd/Au multilayer configuration, a Ti/Pd/Au multilayer configuration, a Ti/Ni/Au multilayer configuration, or a Ti/Ni/Au/Cr/Au multilayer configuration. In a case where the first electrode includes an Ag layer or an Ag/Pd layer, a cover metal layer including, for example, Ni/TiW/Pd/TiW/Ni is preferably formed on a surface of the first electrode, and a pad electrode having a multilayer configuration of Ti/Ni/Au or a multilayer configuration of Ti/Ni/Au/Cr/Au is preferably formed on the cover metal layer, for example.

The light reflecting layer (distributed Bragg reflector layer, (DBR layer)) constituting the first light reflecting layer and the second light reflecting layer is constituted by, for example, a semiconductor multilayer film or a dielectric multilayer film. Examples of a dielectric material include oxides of Si, Mg, Al, Hf, Nb, Zr, Sc, Ta, Ga, Zn, Y, B, Ti, and the like, a nitride (for example, $SiN_X$, $AlN_X$, $AlGaN_X$, $GaN_X$, or $BN_X$), and a fluoride. Specific examples thereof include $SiO_X$, $TiO_X$, $NbO_X$, $ZrO_X$, $TaO_X$, $ZnO_X$, $AlO_X$, $HfO_X$, $SiN_X$, and $AlN_X$. In addition, the light reflecting layer can be obtained by alternately laminating two or more kinds of dielectric films including dielectric materials having different refractive indices among these dielectric materials. For example, a multilayer film such as $SiO_X/SiN_Y$, $SiO_X/TaO_X$, $SiO_X/NbO_Y$, $SiO_X/ZrO_Y$, or $SiO_X/AlN_Y$ is preferable. In order to obtain desired light reflectance, it is only required to appropriately select a material constituting each dielectric film, a film thickness, the number of laminated layers, and the like. The thickness of each dielectric film can be appropriately adjusted depending on a material used and the like, and is determined by the oscillation wavelength (emission wavelength) $\lambda_0$ and the refractive index n of the material used at the oscillation wavelength $\lambda_0$. Specifically, the thickness of each dielectric film is preferably an odd multiple of $\lambda_0/(4n)$. For example, in a case where the light reflecting layer is constituted by $SiO_X/NbO_Y$ in a light emitting element having the oscillation wavelength $\lambda_0$ of 410 nm, the thickness of each dielectric film may be about 40 nm to 70 nm. The number of laminated layers may be 2 or more, and preferably about 5 to 20. The total thickness of the light reflecting layer may be, for example, about 0.6 μm to 1.7 μm. Furthermore, the light reflectance of the light reflecting layer is desirably 95% or more.

The light reflecting layer can be formed on the basis of a known method. Specific examples of the method include: a PVD method such as a vacuum vapor deposition method, a sputtering method, a reactive sputtering method, an ECR plasma sputtering method, a magnetron sputtering method, an ion beam assisted vapor deposition method, an ion plating method, or a laser ablation method; various CVD methods; a coating method such as a spraying method, a spin coating method, or a dipping method; a method combining two or more of these methods; and a method combining these methods with one or more selected from the group including a whole or partial pre-treatment, irradiation with an inert gas (Ar, He, Xe, and the like) or plasma, irradiation with an oxygen gas, an ozone gas, or plasma, an oxidation treatment (heat treatment), and an exposure treatment.

Specific examples of the shape of a boundary between the current injection region and the current non-injection region, and the planar shape of an opening formed in the element region or the current confinement region include circular, elliptical, rectangular, and polygonal (triangular, quadrangular, hexagonal, and the like) shapes. In a case where the shape of the boundary between the current injection region and the current non-injection region is a circle, the circle preferably has a diameter of about 5 μm to 100 μm. Here, the "element region" refers to a region into which a confined current is injected, a region in which light is confined by a difference in refractive index and the like, a region where laser oscillation occurs in a region sandwiched between the first light reflecting layer and the second light reflecting layer, or a region actually contributing to laser oscillation in the region sandwiched between the first light reflecting layer and the second light reflecting layer.

A side surface and an exposed surface of the laminated structure may be coated with a coating layer. The coating layer can be formed on the basis of a known method. The refractive index of a material constituting the coating layer is preferably smaller than the refractive index of a material constituting the laminated structure. Examples of the material constituting the coating layer include a $SiO_X$-based material containing $SiO_2$, a $SiN_X$-based material, a $SiO_YN_Z$-based material, $TaO_X$, $ZrO_X$, $AlN_X$, $AlO_X$, and $GaO_X$, and further include an organic material such as a polyimide resin. Examples of a method for forming the coating layer include a PVD method such as a vacuum vapor deposition method or a sputtering method, and a CVD method. The coating layer can also be formed on the basis of a coating method.

Example 1

Figure 2:
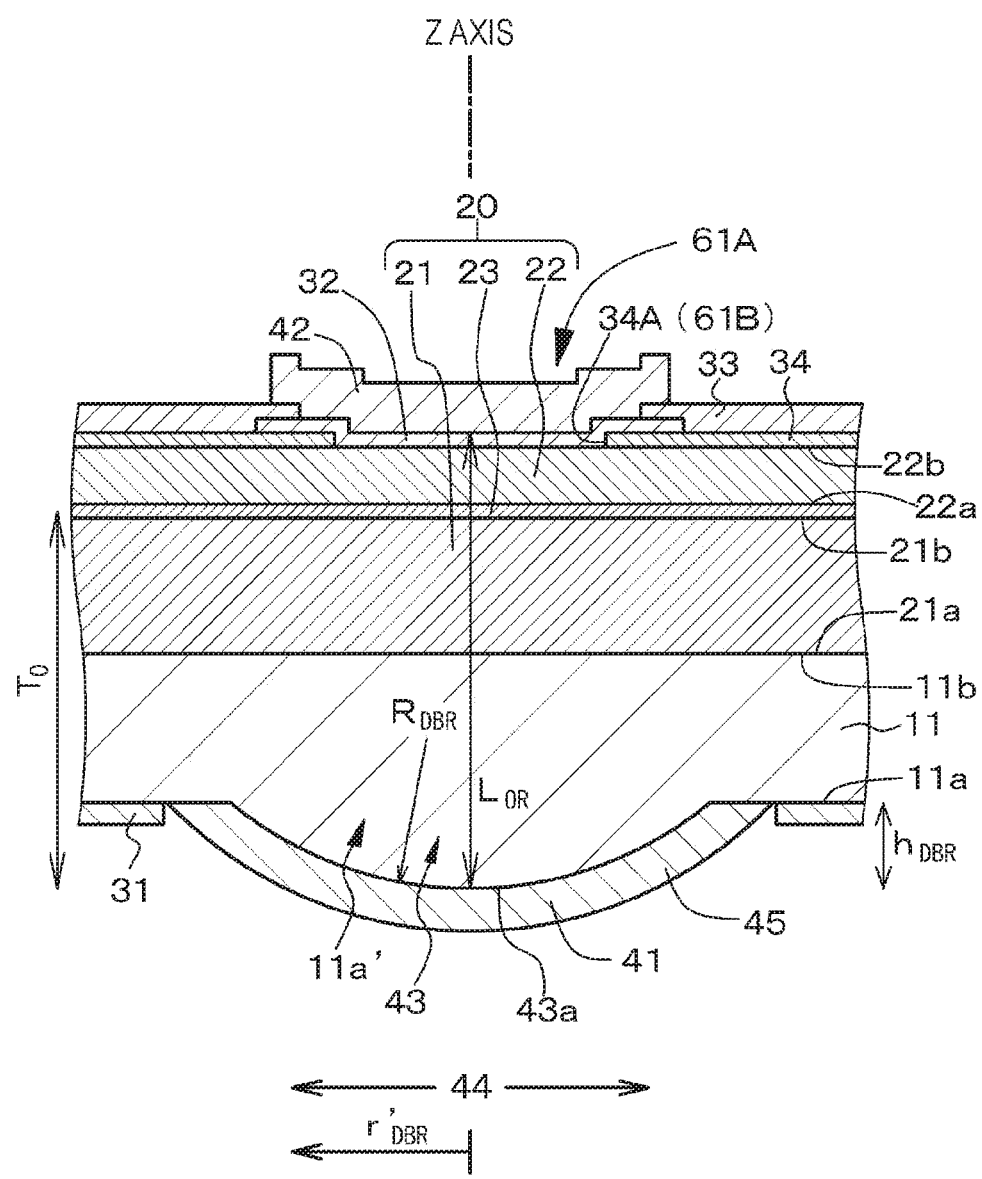
FIG. 2 is a schematic partial end view of the light emitting element of Example 1 in which the light convergence/divergence changing means is removed from FIG. 1.

Example 1 relates to the light emitting element and the light emitting element array of the present disclosure, and specifically to the light emitting element according to the first aspect of the present disclosure and the light emitting element of configuration 3-A. The light emitting element of Example 1 or a light emitting element of each of Examples 2 to 4 and 6 to 10 as described later is more specifically constituted by a surface emitting laser element (vertical cavity laser (VCSEL)) that emits a laser beam via the first light reflecting layer. In addition, a light emitting element of Example 5 as described later is more specifically constituted by a surface emitting laser element (vertical cavity laser (VCSEL)) that emits a laser beam via the second light reflecting layer. FIG. 1 illustrates a schematic partial end view of the light emitting element of Example 1. In addition, FIG. 2 illustrates a schematic partial end view of the light emitting element of Example 1 in which the light convergence/divergence changing means is removed from FIG. 1.

The light emitting element of Example 1 or a light emitting element of each of Examples 2 to 10 as described later includes:

(A) a laminated structure 20 (specifically, a GaN-based compound semiconductor) obtained by laminating:

a first conductivity type (specifically, n-type) first compound semiconductor layer 21 having a first surface 21a and a second surface 21b facing the first surface 21a;

an active layer (light emitting layer) 23 facing the second surface 21b of the first compound semiconductor layer 21; and a second conductivity type (specifically, p-type) second compound semiconductor layer 22 having a first surface 22a facing the active layer 23 and a second surface 22b facing the first surface 22a;

(B) a first light reflecting layer 41 disposed on the first surface 21a side of the first compound semiconductor layer 21;

(C) a second light reflecting layer 42 disposed on the second surface 22b side of the second compound semiconductor layer 22; and (D) light convergence/divergence changing means 50. The first light reflecting layer 41 is formed on a concave mirror portion 43. The second light reflecting layer 42 has a flat shape. In addition, when light generated in the active layer 23 is emitted to the outside, a light convergence/divergence state before the light generated in the active layer 23 is incident on the light convergence/divergence changing means 50 is different from a light convergence/divergence state after the light generated in the active layer 23 passes through the light convergence/divergence changing means 50.

Furthermore, the light emitting element array of Example 1 includes a plurality of the light emitting elements of Example 1 juxtaposed. In addition, light beams emitted from the light emitting elements have different wavelengths. The configuration and structure of the light emitting elements that emit light beams having different wavelengths can be a known configuration and structure. In addition, the plurality of light emitting elements is mounted on, for example, one mounting substrate. Examples of the color of light emitted from the light emitting elements include blue, green, and red.

Then, when the light generated in the active layer 23 passes through the light convergence/divergence changing means 50, in the light emitting element of Example 1, the light is converged more than before the light is incident on the light convergence/divergence changing means 50. Here, in the light emitting element of Example 1, the light convergence/divergence changing means 50 is constituted by a convex lens, but the present disclosure is not limited thereto. In addition, the light that has passed through the light convergence/divergence changing means 50 is, for example, parallel light. The light convergence/divergence changing means 50 can be formed, for example, by etching back a transparent insulating material layer such as $SiO_2$.

In addition, in the light emitting element of Example 1, as described above, light is emitted via the first light reflecting layer 41, and the light convergence/divergence changing means 50 is disposed on the light emitting side of the first light reflecting layer 41. Specifically, the light convergence/divergence changing means 50 is formed on a light emitting surface 41a of the first light reflecting layer 41. In addition, the center of curvature of the light convergence/divergence changing means 50 on the optical axis (Z axis) (specifically, the center of curvature in the region of the light convergence/divergence changing means 50 corresponding to the effective region of the radius $r'_{DBR}$ in the concave mirror portion) is located closer to the light convergence/divergence changing means 50 than the center of curvature of the first light reflecting layer 41 on the optical axis (Z axis) (specifically, the center of curvature in the region of the first light reflecting layer 41 corresponding to the effective region of the radius $r'_{DBR}$ in the concave mirror portion) (located closer to a light emitting surface).

Moreover, on the optical axis (Z axis), a distance from a light emitting surface 50A of the light convergence/divergence changing means 50 to a light emitting surface 41a of the first light reflecting layer 41 is $1\times10^{-6}$ m to $1\times10^{-3}$ m, specifically 10 μm. In addition, when the planar shape of the first light reflecting layer 41 is assumed to be a circle, the circle has a diameter of $1\times10^{-4}$ m or less, specifically 60 μm. The thickness of the light convergence/divergence changing means 50 along the optical axis (Z-axis) is $1\times10^{-6}$ m to $1\times10^{-3}$ m, specifically 10 μm. A distance from the active layer 23 to the first light reflecting layer 41 is $1\times10^{-5}$ m to $5\times10^{-4}$ m, specifically 50 μm. A distance from the first light reflecting layer 41 to the second light reflecting layer along the optical axis (Z axis) is $1\times10^{-5}$ m or more, that is, the resonator length $L_{OR}$ is $1\times10^{-5}$ m≤$L_{OR}$, specifically, $L_{OR}$=50 μm. Note that a region of the first light reflecting layer 41 from the first surface 21a of the first compound semiconductor layer 21 to a certain depth, the laminated structure 20 (the first compound semiconductor layer 21, the active layer 23, and the second compound semiconductor layer 22), and a region of the second light reflecting layer 42 from the second surface 22b of the second compound semiconductor layer 22 to a certain depth constitute a resonator.

In addition, the second compound semiconductor layer 22 has a current injection region 61A and a current non-injection region (current confinement region) 61B surrounding the current injection region 61A. The shape of the concave mirror portion 43 is a spherical shape or a parabolic shape having a coefficient of determination of 0.8 or more, preferably 0.9 or more, more preferably 0.99 or more within a range (region) of the beam waist radius $\omega_0$ from the central portion of the concave mirror portion 43, or for example, within a desired region such as within a range (region) of 1.2 times the beam waist radius $\omega_0$ or within a range (region) twice the beam waist radius wo. Specifically, in the light emitting element of Example 1, a figure drawn by an interface 43a facing the laminated structure 20 in a part of the concave mirror portion 43 (effective region 44 in the concave mirror portion 43 and the desired region described above) when the concave mirror portion 43 is cut along a virtual plane including a laminating direction of the laminated structure 20 is a part of a circle or a part of a parabola. Note that the shape of a portion of the concave mirror portion 43 located outside the effective region 44 (cross-sectional shape) does not need to be a part of a circle or a part of a parabola.

Furthermore, a compound semiconductor substrate 11 constituted by a GaN substrate is disposed between the first surface 21a of the first compound semiconductor layer 21 and the first light reflecting layer 41. A surface of the compound semiconductor substrate (light emitting element manufacturing substrate) 11 facing the first compound semiconductor layer 21 is referred to as "second surface 11b", and a surface facing the second surface 11b is referred to as "first surface 11a". That is, the laminated structure 20 is formed on the second surface 11b of the conductive compound semiconductor substrate 11. In addition, the first light reflecting layer 41 is constituted by a multilayer light reflecting film 45 formed on at least a part of a surface of the concave mirror portion 43 (specifically, a surface of the concave mirror portion 43) constituted by the protrusion 11a' of the first surface 11a of the compound semiconductor substrate 11. Moreover, when the radius of curvature of the concave mirror portion 43 (specifically, the effective region 44 of the radius $r'_{DBR}$ in the concave mirror portion 43) is represented by $R_{DBR}$, $R_{DBR} \leq 1\times10^{-3}$ m is satisfied. Specifically, $L_{OR}$=50 μm, $R_{DBR}$=70 μm, and $r'_{DBR}$=15 μm can be exemplified, but are not limited thereto. In addition, as the wavelength (oscillation wavelength) $\lambda_0$ of desired light mainly emitted from the light emitting element, $\lambda_0$=450 nm can be exemplified. Alternatively, in order to constitute a light emitting element array, in addition to a light emitting element that emits blue light, as the (oscillation wavelength) $\lambda_0$ of a light emitting element that emits green or red light, $\lambda_0$=515 nm, and $\lambda_0$=635 nm can be exemplified.

Here, when a distance from the active layer 23 to an interface between the concave mirror portion 43 and the multilayer light reflecting film 45 is represented by $T_0$, an ideal parabolic function x=f(z) can be represented by $x=z^2/t_0$, and $h_{DBR}=r'_{DBR}{}^2/2T_0$.

However, when a figure drawn by the interface 43a is a part of a parabola, it goes without saying that the parabola may deviate from such an ideal parabola. However, as described above, in the desired region, the shape is a spherical shape or a parabolic shape having a coefficient of determination of 0.8 or more.

Furthermore, the laminated structure 20 has a higher value of thermal conductivity than the first light reflecting layer 41. The value of thermal conductivity of the dielectric material constituting the first light reflecting layer 41 is about 10 watts/(m·K) or less. Meanwhile, the value of thermal conductivity of the GaN-based compound semiconductor constituting the laminated structure 20 is about 50 watts/(m·K) to about 100 watts/(m·K).

The first compound semiconductor layer 21 is constituted by an n-GaN layer, the active layer 23 has a five-layered multiple quantum well structure obtained by laminating an $In_{0.04}Ga_{0.96}N$ layer (barrier layer) and an $In_{0.16}Ga_{0.84}N$ layer (well layer), and the second compound semiconductor layer 22 is constituted by a p-GaN layer. The first electrode 31 is formed on the first surface 11a of the compound semiconductor substrate 11. Meanwhile, the second electrode 32 is formed on the second compound semiconductor layer 22, and the second light reflecting layer 42 is formed on the second electrode 32. The second light reflecting layer 42 on the second electrode 32 has a flat shape. The first electrode 31 includes Ti/Pt/Au, and the second electrode 32 includes a transparent conductive material, specifically, ITO. On an edge of the first electrode 31, a pad electrode (not illustrated) to be electrically connected to an external electrode or circuit, for example, including Ti/Pt/Au or V/Pt/Au, is formed or connected. On an edge of the second electrode 32, a pad electrode 33 to be electrically connected to an external electrode or circuit, for example, including Pd/Ti/Pt/Au, Ti/Pd/Au, or Ti/Ni/Au, is formed or connected. The first light reflecting layer 41 and the second light reflecting layer 42 each have a laminated structure of a $Ta_2O_5$ layer and a $SiO_2$ layer (total number of laminated dielectric films: 20). The first light reflecting layer 41 and the second light reflecting layer 42 each have a multilayer structure as described above, but are each represented by one layer for simplifying the drawings. The planar shape of each of openings 34A formed in the first electrode 31, the first light reflecting layer 41, the second light reflecting layer 42, and an insulating film (current confinement region) 34 is a circle.

Hereinafter, with reference to FIGS. 3A, 3B, 4, 5, 6, 7, and 8 which are schematic partial end views of the laminated structure and the like, a method for manufacturing the light emitting element of Example 1 will be described.

[Step-100]

First, on the second surface 11b of the compound semiconductor substrate 11 having a thickness of about 0.4 mm, the GaN-based compound semiconductor-containing laminated structure 20 obtained by laminating:

the first compound semiconductor layer 21 having the first surface 21a and the second surface 21b facing the first surface 21a;

the active layer (light emitting layer) 23 in contact with the second surface 21b of the first compound semiconductor layer 21; and the second compound semiconductor layer 22 having the first surface 22a facing the active layer 23 and the second surface 22b facing the first surface 22a is formed. Specifically, by sequentially forming the first compound semiconductor layer 21, the active layer 23, and the second compound semiconductor layer 22 on the second surface 11b of the compound semiconductor substrate 11 on the basis of an epitaxial growth method based on a known MOCVD method, the laminated structure 20 can be obtained (see FIG. 3A).

[Step-110]

Figure 3A:
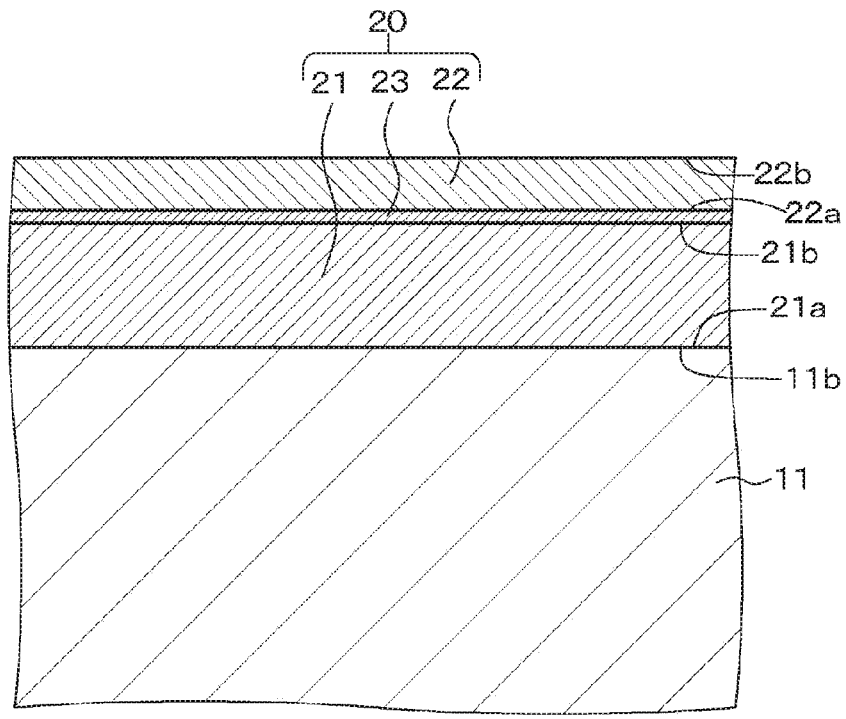
FIGS. 3A and 3B are schematic partial end views of a laminated structure and the like for explaining a method for manufacturing the light emitting element of Example 1.
Figure 3B:
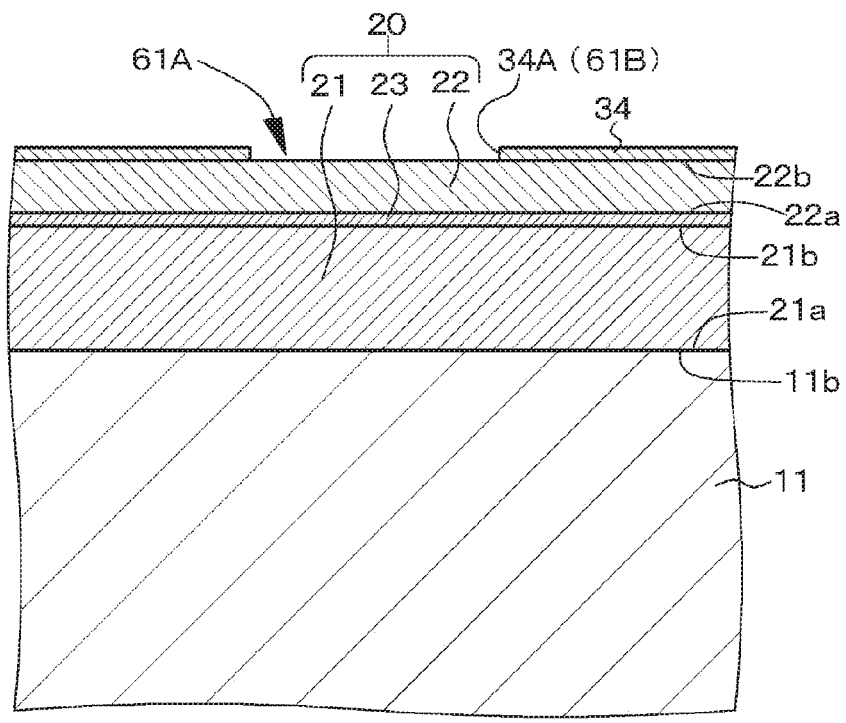
Figure 4:
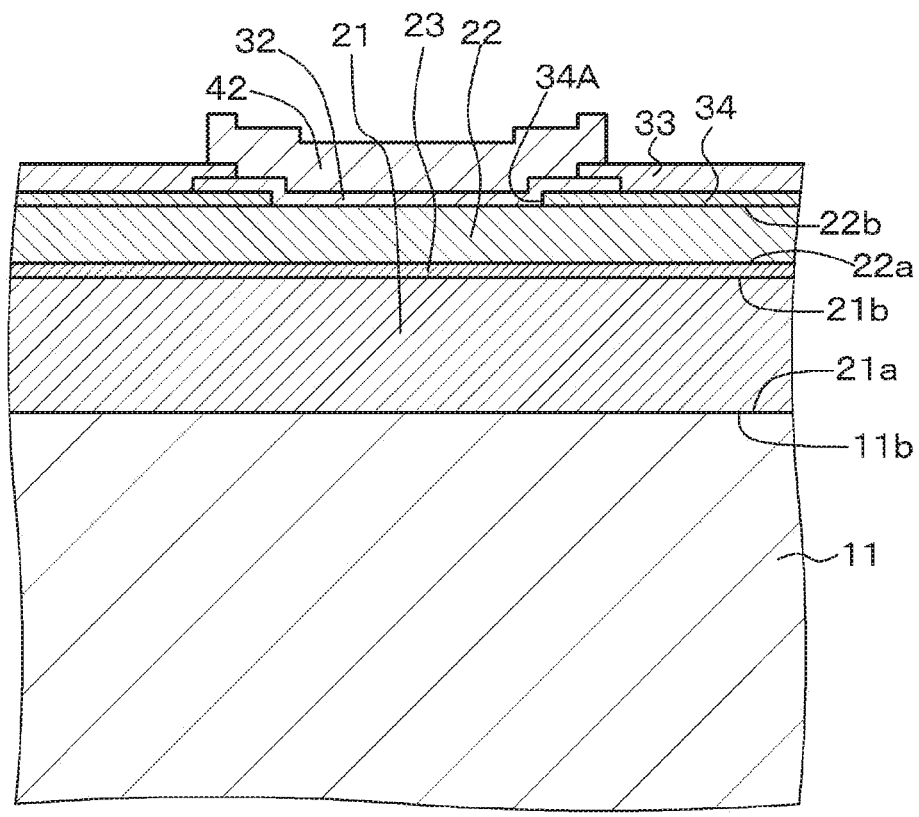
FIG. 4 is a schematic partial end view of a laminated structure and the like for explaining a method for manufacturing the light emitting element of Example 1, following FIG. 3B.

Subsequently, on the second surface 22b of the second compound semiconductor layer 22, the $SiO_2$-containing insulating film (current confinement layer) 34 having the opening 34A is formed on the basis of a combination of a film forming method such as a CVD method, a sputtering method, or a vacuum vapor deposition method, and a wet etching method or a dry etching method (see FIG. 3B). A current confinement region (current injection region 61A and current non-injection region 61B) is defined by the insulating film 34 having the opening 34A. That is, the current injection region 61A is defined by the opening 34A.

In order to obtain the current confinement region, an insulating film (current confinement layer) including an insulating material (for example, $SiO_X$, $SiN_X$, $AlO_X$, $ZrO_X$, or $HfO_X$) may be formed between the second electrode 32 and the second compound semiconductor layer 22. Alternatively, the second compound semiconductor layer 22 may be etched by a RIE method and the like to form a mesa structure. Alternatively, a part of the laminated second compound semiconductor layer 22 may be partially oxidized from a lateral direction to form a current confinement region. Impurities may be injected into the second compound semiconductor layer 22 by ion implantation to form a region having conductivity lowered. Alternatively, these may be appropriately combined. However, the second electrode 32 needs to be electrically connected to a portion of the second compound semiconductor layer 22 through which a current flows due to current confinement.

[Step-120]

Thereafter, the second electrode 32 and the second light reflecting layer 42 are formed on the second compound semiconductor layer 22. Specifically, the second electrode 32 includes the second surface 22b of the second compound semiconductor layer 22 exposed to a bottom surface of the opening 34A (current injection region 61A) up to a top surface of the insulating film 34, for example, on the basis of a lift-off method. Moreover, the pad electrode 33 is formed on the basis of a combination of a film forming method such as a sputtering method or a vacuum vapor deposition method and a patterning method such as a wet etching method or a dry etching method. Subsequently, the second light reflecting layer 42 includes a top surface of the second electrode 32 to a top surface of the pad electrode 33 on the basis of a combination of a film forming method such as a sputtering method or a vacuum vapor deposition method and a patterning method such as a wet etching method or a dry etching method. The second light reflecting layer 42 on the second electrode 32 has a flat shape. In this way, the structure illustrated in FIG. 4 can be obtained.

[Step-130]

Figure 5:
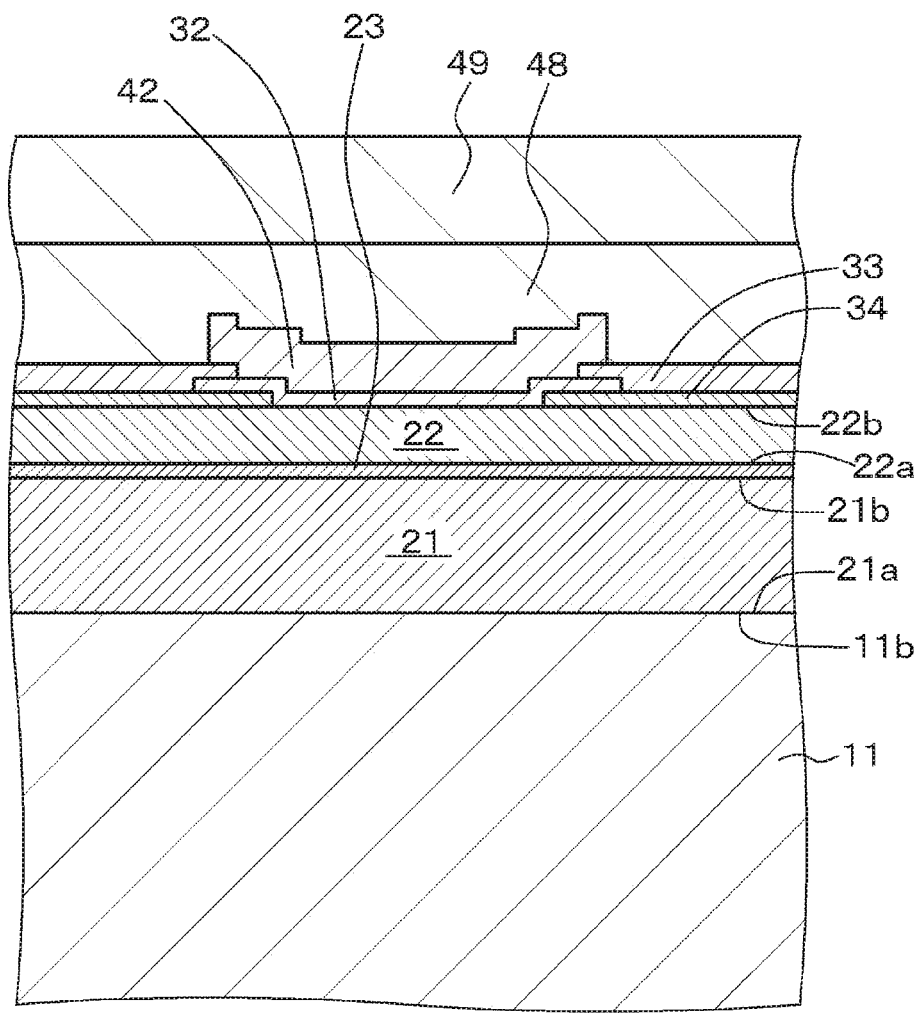
FIG. 5 is a schematic partial end view of a laminated structure and the like for explaining a method for manufacturing the light emitting element of Example 1, following FIG. 4.
Figure 6:
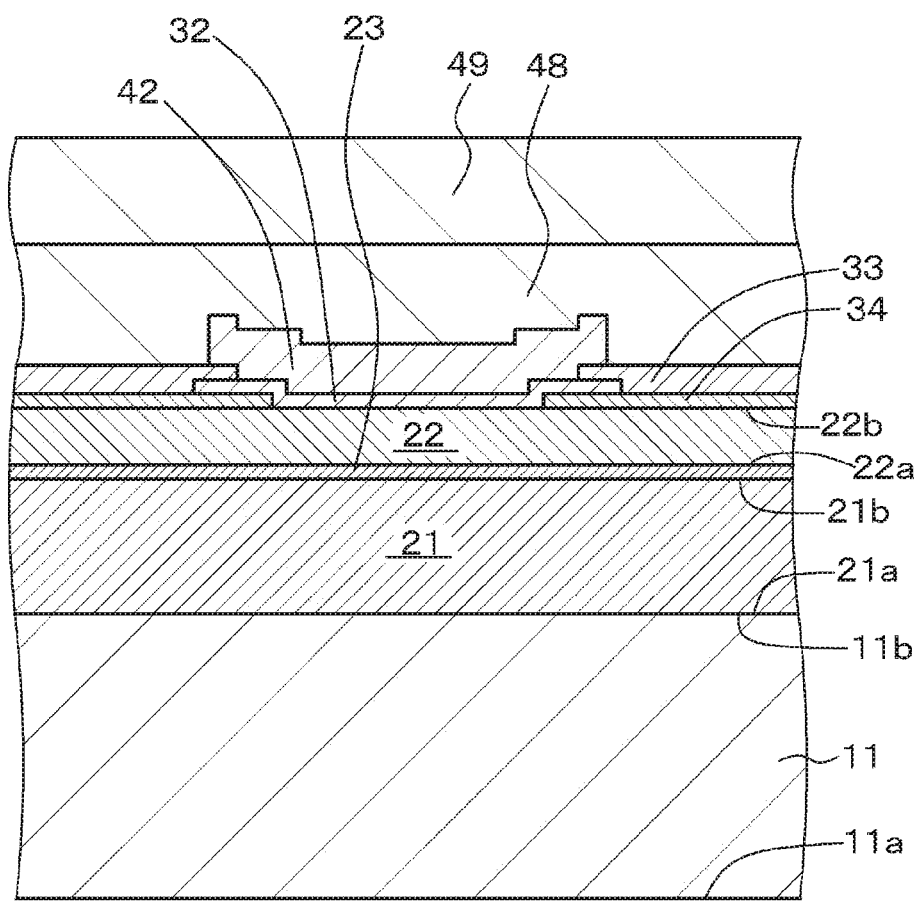
FIG. 6 is a schematic partial end view of a laminated structure and the like for explaining a method for manufacturing the light emitting element of Example 1, following FIG. 5.
Figure 7:
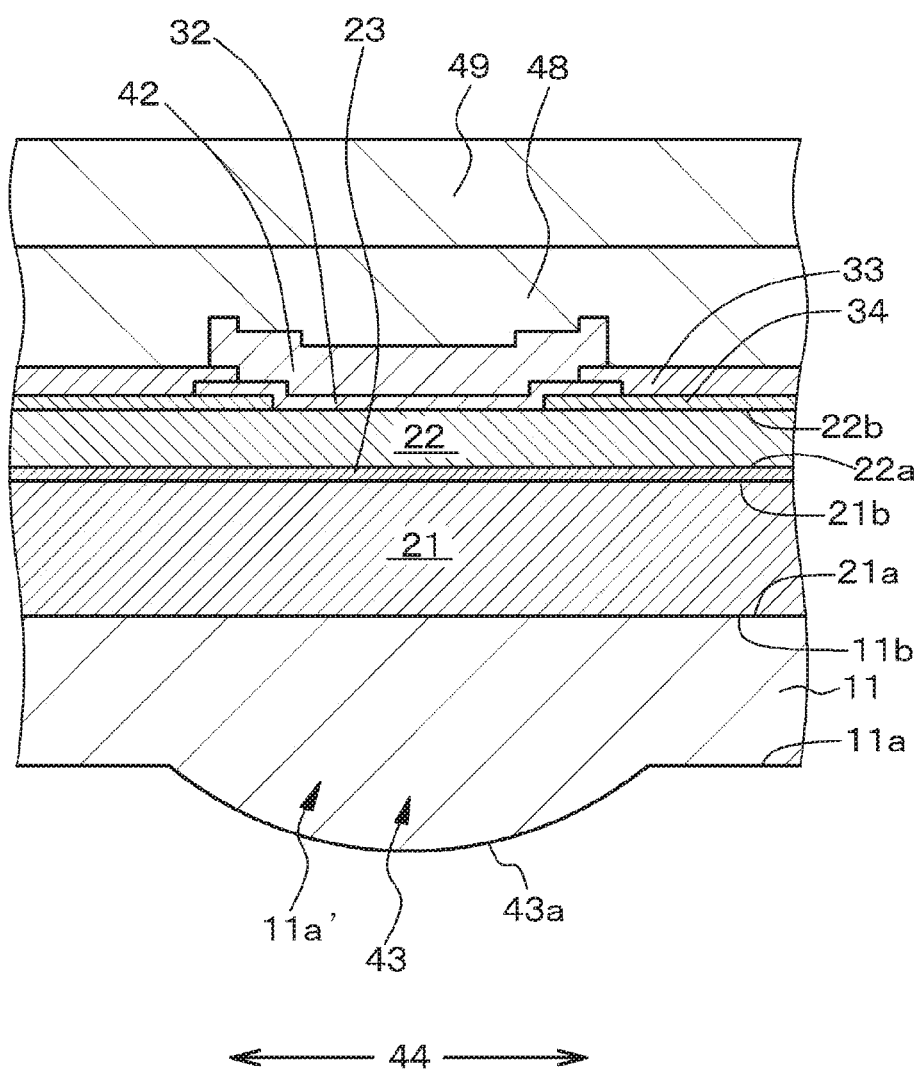
FIG. 7 is a schematic partial end view of a laminated structure and the like for explaining a method for manufacturing the light emitting element of Example 1, following FIG. 6.
Figure 8:
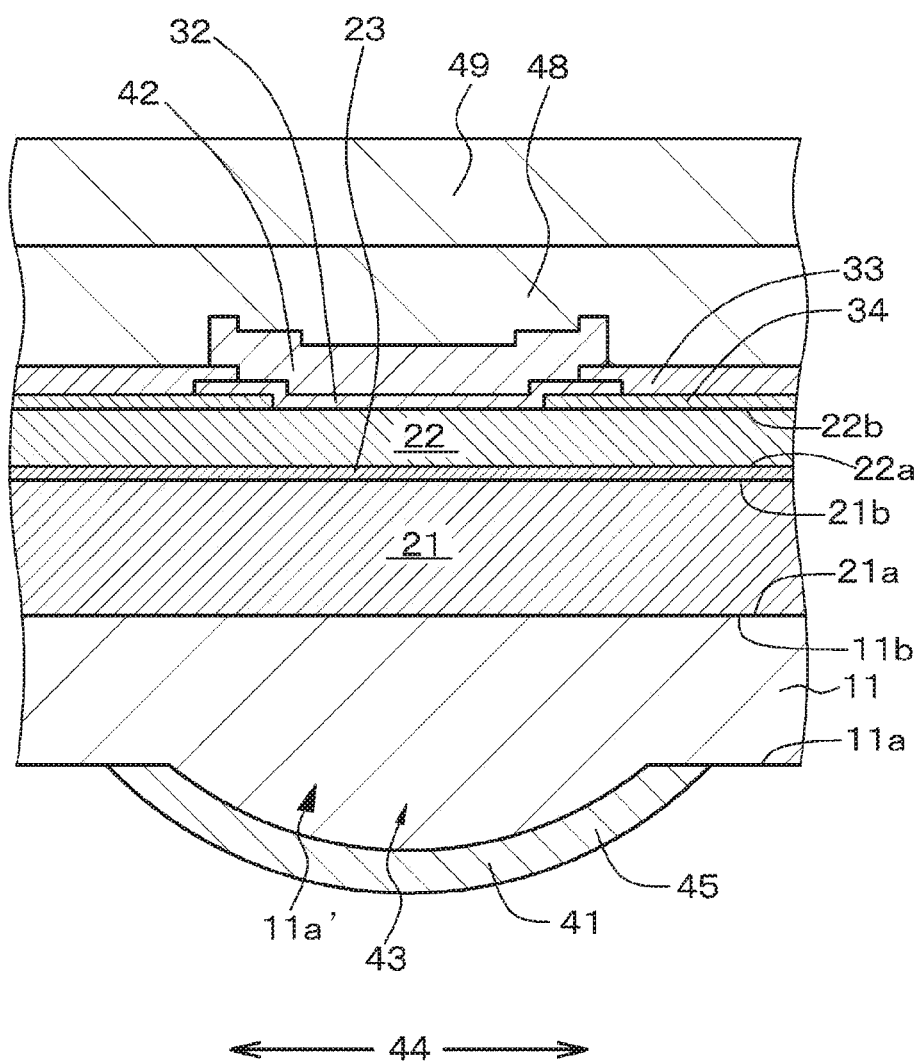
FIG. 8 is a schematic partial end view of a laminated structure and the like for explaining a method for manufacturing the light emitting element of Example 1, following FIG. 7.

Subsequently, the second light reflecting layer 42 is fixed to a supporting substrate 49 via a bonding layer 48 (see FIG. 5). Specifically, the second light reflecting layer 42 is fixed to the supporting substrate 49 constituted by a sapphire substrate using the bonding layer 48 including an adhesive.

[Step-140]

Subsequently, the compound semiconductor substrate 11 is thinned on the basis of a mechanical polishing method or a CMP method. Moreover, the first surface 11a of the compound semiconductor substrate 11 is mirror-finished (see FIG. 6). The first surface 11a of the compound semiconductor substrate 11 preferably has a value of surface roughness Ra of 10 nm or less. The surface roughness Ra is defined in JIS B-610:2001, and can be specifically measured on the basis of observation based on AFM and cross-sectional TEM. Then, the concave mirror portion 43 constituted by the protrusion $11a^\alpha$ is formed on an exposed surface (first surface 11a) of the compound semiconductor substrate 11. Specifically, a patterned resist layer is formed on the first surface 11a of the compound semiconductor substrate 11 where the concave mirror portion 43 is to be formed, and the resist layer is heated and thereby reflowed to obtain a resist pattern. To the resist pattern, the same shape as (or similar shape to) that of the protrusion 11a' is imparted. Then, by etching back the resist pattern and the first surface 11a of the compound semiconductor substrate 11 using an RIE method and the like, the concave mirror portion 43 constituted by the protrusion 11a' can be formed on the exposed surface (first surface 11a) of the compound semiconductor substrate 11 (see FIG. 7).

[Step-150]

Thereafter, the multilayer light reflecting film 45 is formed on at least a part of the concave mirror portion 43. Specifically, the multilayer light reflecting film 45 includes the exposed surface (first surface 11a) of the compound semiconductor substrate 11 up to a top surface of the concave mirror portion 43 on the basis of a known method such as a sputtering method or a vacuum vapor deposition method. Then, an unnecessary portion of the multilayer light reflecting film 45 is removed on the basis of a patterning method such as a wet etching method or a dry etching method to obtain the first light reflecting layer 41 (see FIG. 8). Thereafter, the first electrode 31 is formed on the first surface 11a of the compound semiconductor substrate 11 on the basis of a combination of a film forming method such as a sputtering method or a vacuum vapor deposition method and a patterning method such as a wet etching method or a dry etching method to obtain the first electrode 31 electrically connected to the first compound semiconductor layer 21.

[Step-160]

Subsequently, in order to form the light convergence/divergence changing means 50, a $SiO_2$-containing transparent insulating material layer is formed on the exposed surface (first surface 11a) of the compound semiconductor substrate 11 including the first light reflecting layer 41 and the first electrode 31, for example, on the basis of a CVD method. Then, a resist material layer having the same cross-sectional shape as that of the convex lens is formed on the transparent insulating material layer, and the resist material layer and the transparent insulating material layer are etched back to obtain the light convergence/divergence changing means 50 formed on the light emitting surface 41a of the first light reflecting layer 41 and constituted by the convex lens.

[Step-170]

Then, the supporting substrate 49 and the bonding layer 48 are removed. In this way, the structure illustrated in FIG. 1 can be obtained. Thereafter, by further performing so-called element separation, the light emitting element is separated. A side surface and an exposed surface of the laminated structure are coated with, for example, a $SiO_2$-containing insulating layer. Subsequently, by performing packaging or sealing, the light emitting element of Example 1 is completed.

Note that in [step-140], after the compound semiconductor substrate 11 is thinned and moreover mirror-finished, the supporting substrate 49 and the bonding layer 48 may be removed. Furthermore, the supporting substrate 49 and the bonding layer 48 may be left.

In the light emitting element of Example 1, the first light reflecting layer includes a concave mirror portion. Therefore, even if the resonator length $L_{OR}$ is $1 \times 10^{-5}$ m or more, it is possible to avoid an increase in diffraction loss. As a result, laser oscillation can be performed reliably, and the resonator length $L_{OR}$ can be $1 \times 10^{-5}$ m or more. Therefore, a problem of thermal saturation can be alleviated. Furthermore, since the resonator length $L_{OR}$ can be $1 \times 10^{-5}$ m or more, the tolerance of a manufacturing process of the light emitting element is increased. As a result, the yield can be improved.

Moreover, since the light emitting element or the light emitting element array of Example 1 includes the light convergence/divergence changing means, an emission state when the light generated in the active layer is emitted to the outside can be accurately controlled so as to be a desired state.

Furthermore, except for Example 4 as described later, a GaN substrate is used in a manufacturing process of the light emitting element, but a GaN-based compound semiconductor is not formed on the basis of a method for performing epitaxial growth in a lateral direction, such as an ELO method. Therefore, as the GaN substrate, not only a polar GaN substrate but also an antipolar GaN substrate or a nonpolar GaN substrate can be used. If a polar GaN substrate is used, luminous efficiency tends to decrease due to an effect of a piezoelectric field in the active layer. However, if a nonpolar GaN substrate or an antipolar GaN substrate is used, such a problem can be solved or alleviated.

Example 2

Example 2 is a modification of Example 1, and relates to the light emitting element of configuration 3-B. In the light emitting element of Example 2 illustrated in the schematic partial end view of FIG. 9, the concave mirror portion 43 is constituted by the protrusion 43' formed on the compound semiconductor substrate 11 (specifically, on the first surface 11a of the compound semiconductor substrate 11). The first light reflecting layer 41 is constituted by the multilayer light reflecting film 45 formed on the concave mirror portion 43 (protrusion 43'). Examples of a material constituting the protrusion 43' (protrusion 43') include a transparent dielectric material such as $TiO_2$, $Ta_2O_5$, or $SiO_2$, a silicone-based resin, and an epoxy-based resin.

In the light emitting element of Example 2, the compound semiconductor substrate 11 is thinned and mirror-finished in a similar step to [step-140] of Example 1, and then the concave mirror portion 43 constituted by the protrusion 43' is formed on the exposed surface (first surface 11a) of the compound semiconductor substrate 11. Specifically, for example, a $TiO_2$ layer or a $Ta_2O_5$ layer is formed on the exposed surface (first surface 11a) of the compound semiconductor substrate 11. Subsequently, a patterned resist layer is formed on the $TiO_2$ layer or the $Ta_2O_5$ layer where the concave mirror portion 43 is to be formed, and the resist layer is heated and thereby reflowed to obtain a resist pattern. To the resist pattern, the same shape as (or similar shape to) that of the protrusion 43' is imparted. Then, by etching back the resist pattern and the $TiO_2$ layer or the $Ta_2O_5$ layer, the concave mirror portion 43 constituted by the protrusion 43' can be formed on the exposed surface (first surface 11a) of the compound semiconductor substrate 11. Subsequently, the multilayer light reflecting film 45 includes the exposed surface (first surface 11a) of the compound semiconductor substrate 11 up to a top surface of the concave mirror portion 43 on the basis of a known method. Thereafter, an unnecessary portion of the multilayer light reflecting film 45 is removed to obtain the first light reflecting layer 41. Thereafter, the first electrode 31 is formed on the first surface 11a of the compound semiconductor substrate 11 to obtain the first electrode 31 electrically connected to the first compound semiconductor layer 21.

The configuration and structure of the light emitting element of Example 2 can be similar to those of the light emitting element of Example 1 except for the above points, and therefore detailed description will be omitted. Note that the supporting substrate 49 and the bonding layer 48 may be left without being removed.

Example 3

Example 3 is also a modification of Examples 1 and 2, and relates to the light emitting element of configuration 4. In the light emitting element of Example 3 illustrated in the schematic partial end view of FIG. 10, the first light reflecting layer 41 is formed on the first surface 21a of the first compound semiconductor layer 21. In manufacturing the light emitting element of Example 3, the light emitting element manufacturing substrate 11 is removed and the first surface 21a of the first compound semiconductor layer 21 is exposed in a similar step to [step-140] of Example 1. Then, similarly to Example 1, a patterned resist layer is formed on the first surface 21a of the first compound semiconductor layer 21 where the concave mirror portion 43 is to be formed, and the resist layer is heated and thereby reflowed to obtain a resist pattern. To the resist pattern, the same shape as (or similar shape to) that of a protrusion 21c is imparted. Then, by etching back the resist pattern and the first surface 21a of the first compound semiconductor layer 21, the concave mirror portion 43 constituted by the protrusion 21c can be formed on the first surface 21a of the first compound semiconductor layer 21. Alternatively, in the modification of the light emitting element of Example 3 illustrated in the schematic partial end view of FIG. 11, for example, a $TiO_2$ layer or a $Ta_2O_5$ layer is formed on the first surface 21a of the first compound semiconductor layer 21. Subsequently, a patterned resist layer is formed on the $TiO_2$ layer or the $Ta_2O_5$ layer where the concave mirror portion 43 is to be formed, and the resist layer is heated and thereby reflowed to obtain a resist pattern. To the resist pattern, the same shape as (or similar shape to) that of a protrusion 21d is imparted. Then, by etching back the resist pattern and the $TiO_2$ layer or the $Ta_2O_5$ layer, the concave mirror portion 43 constituted by the protrusion 21d can be formed on the first surface 21a of the first compound semiconductor layer 21.

The configuration and structure of each of the light emitting element of Example 3 and the modification thereof can be similar to those of the light emitting element of Example 1 or 2 except for the above points, and therefore detailed description will be omitted. Note that the supporting substrate 49 and the bonding layer 48 may be left without being removed.

Example 4

Example 4 is a modification of Example 3. The schematic partial end view of the light emitting element of Example 4 is substantially similar to that in FIG. 11, and the configuration and structure of the light emitting element of Example 4 can be substantially similar to those of Example 3, and therefore detailed description will be omitted.

Figure 12A:
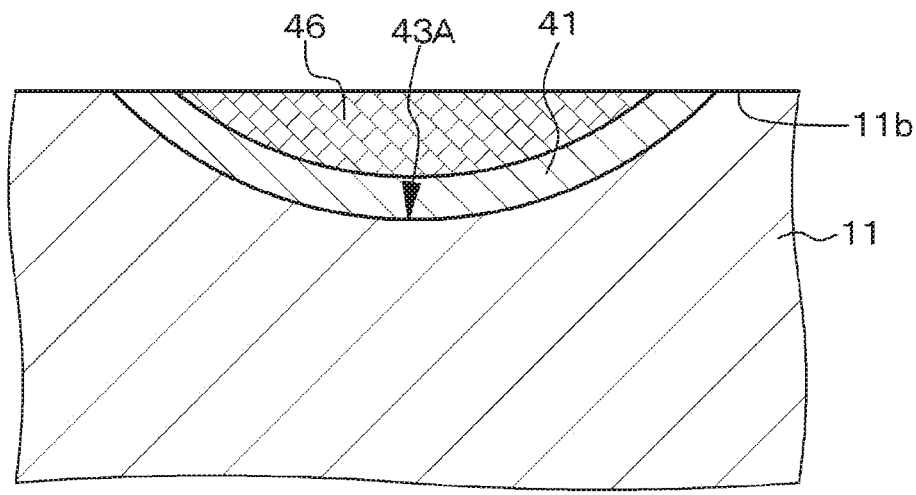
FIGS. 12A and 12B are schematic partial end views of a substrate and the like for explaining a method for manufacturing a light emitting element of Example 4.

In Example 4, first, a concave portion 43A for forming the concave mirror portion 43 is formed on the second surface 11b of the light emitting element manufacturing substrate 11. Then, the first light reflecting layer 41 including a multilayer film is formed on the second surface 11b of the light emitting element manufacturing substrate 11. Thereafter, a planarization film 46 is formed on the first light reflecting layer 41. The planarization film 46 and the first light reflecting layer 41 are planarized, and a part of the second surface 11b of the light emitting element manufacturing substrate 11 is exposed while the planarization film 46 and the first light reflecting layer 41 are left (see FIG. 12A). The planar shape of the first light reflecting layer 41 is a circle. However, the shape of the first light reflecting layer 41 is not limited thereto.

Figure 12B:
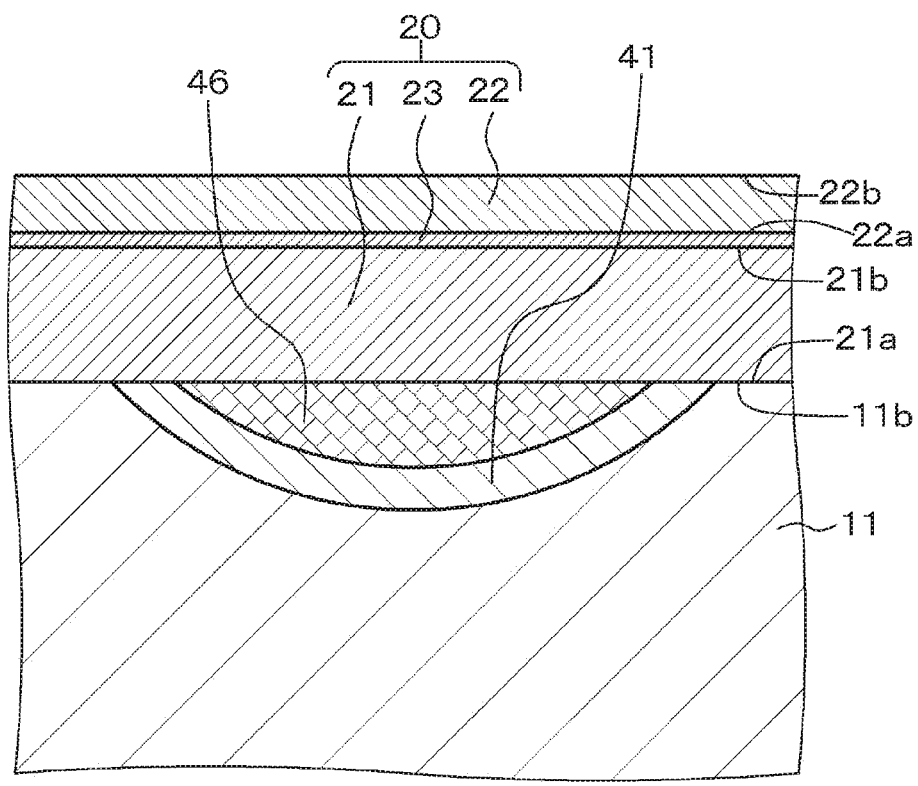

Next, the laminated structure 20 is formed on the light emitting element manufacturing substrate 11 including the first light reflecting layer 41 on the basis of a growth in a lateral direction using a method for performing epitaxial growth in a lateral direction, such as an ELO method (see FIG. 12B). Thereafter, [step-110] and [step-120] in Example 1 are executed. Then, the light emitting element manufacturing substrate 11 is removed, and the first electrode 31 is formed on the exposed first surface 21a of the first compound semiconductor layer 21. Alternatively, the first electrode 31 is formed on the first surface 11a of the light emitting element manufacturing substrate 11 without removing the light emitting element manufacturing substrate 11.

Example 5

Figure 13:
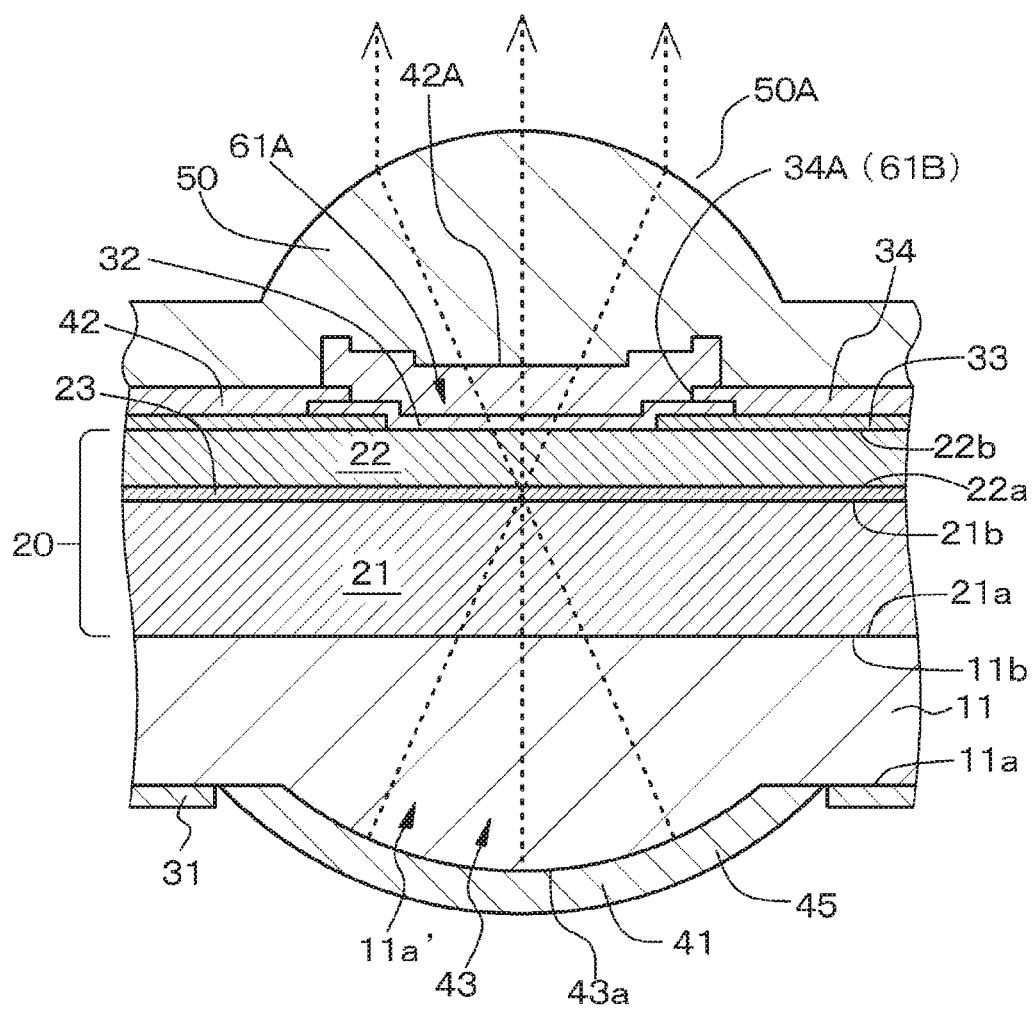
FIG. 13 is a schematic partial end view of a light emitting element of Example 5.

Example 5 relates to a light emitting element according to the second aspect of the present disclosure. FIG. 13 illustrates a schematic partial end view of the light emitting element of Example 5. In the light emitting element of Example 5, light is emitted via the second light reflecting layer 42, and the light convergence/divergence changing means 50 is disposed on a light emitting side of the second light reflecting layer 42. Specifically, the light convergence/divergence changing means 50 is formed on the light emitting surface 42a of the second light reflecting layer 42. In addition, the center of curvature of the light convergence/divergence changing means 50 on the optical axis (Z axis) (specifically, the center of curvature in the region of the light convergence/divergence changing means 50 corresponding to the effective region of the radius $r'_{DBR}$ in the concave mirror portion) is located closer to the light convergence/divergence changing means 50 than the center of curvature of the first light reflecting layer 41 on the optical axis (Z axis) (specifically, the center of curvature in the region of the first light reflecting layer 41 corresponding to the effective region of the radius $r'_{DBR}$ in the concave mirror portion) (located closer to a light emitting surface).

In manufacturing the light emitting element of Example 5, similar steps to [step-100] to [step-120] in Example 1 are executed. Subsequently, in order to form the light convergence/divergence changing means 50, a $SiO_2$-containing transparent insulating material layer is formed on the second compound semiconductor layer 22 including the second light reflecting layer 42, for example, on the basis of a CVD method. Then, a resist material layer having the same cross-sectional shape as that of the convex lens is formed on the transparent insulating material layer, and the resist material layer and the transparent insulating material layer are etched back to obtain the light convergence/divergence changing means 50 formed on the light emitting surface 42a of the second light reflecting layer 42 and constituted by the convex lens.

Thereafter, [step-130] to [step-150] and [step-170] in Example 1 are executed. In this way, the structure illustrated in FIG. 13 can be obtained. Thereafter, by further performing so-called element separation, the light emitting element is separated. A side surface and an exposed surface of the laminated structure are coated, for example, with a $SiO_2$-containing insulating layer. Subsequently, by performing packaging or sealing, the light emitting element of Example 5 is completed. Note that after [step-150], the exposed surface (first surface 11a) of the compound semiconductor substrate 11 including the first light reflecting layer 41 and the first electrode 31 may be fixed to the supporting substrate via a bonding layer.

Example 6

Example 6 is a modification of Examples 1 to 5. In the light emitting element of Example 6, the first light reflecting layer 41 includes a light transmitting portion 41A and a light shielding portion 41B surrounding the light transmitting portion 41A. In the light emitting element of Example 6, the shape of an outer edge of the current injection region 61A is preferably similar to the shape of an outer edge of the light transmitting portion 41A, and the shape of an outer edge of the concave mirror portion 43 is preferably similar to the shape of an outer edge of the light transmitting portion 41A. The light shielding portion 41B includes, for example, a Ti/Pt/Au laminate. Note that in the drawings relating to the light emitting element of Example 6 described below, the light convergence/divergence changing means 50 is not illustrated for simplifying the drawings.

In the light emitting element of Example 6, the first light reflecting layer includes a light transmitting portion, but examples of the specific position of the light shielding portion include the various positions described above. Furthermore, a method for manufacturing the light emitting element of Example 6 further includes a step of forming a light shielding portion on a part of the concave mirror portion or forming a light shielding portion from a top surface of a part of the concave mirror portion up to an outer region of the concave mirror portion.

Figure 9:
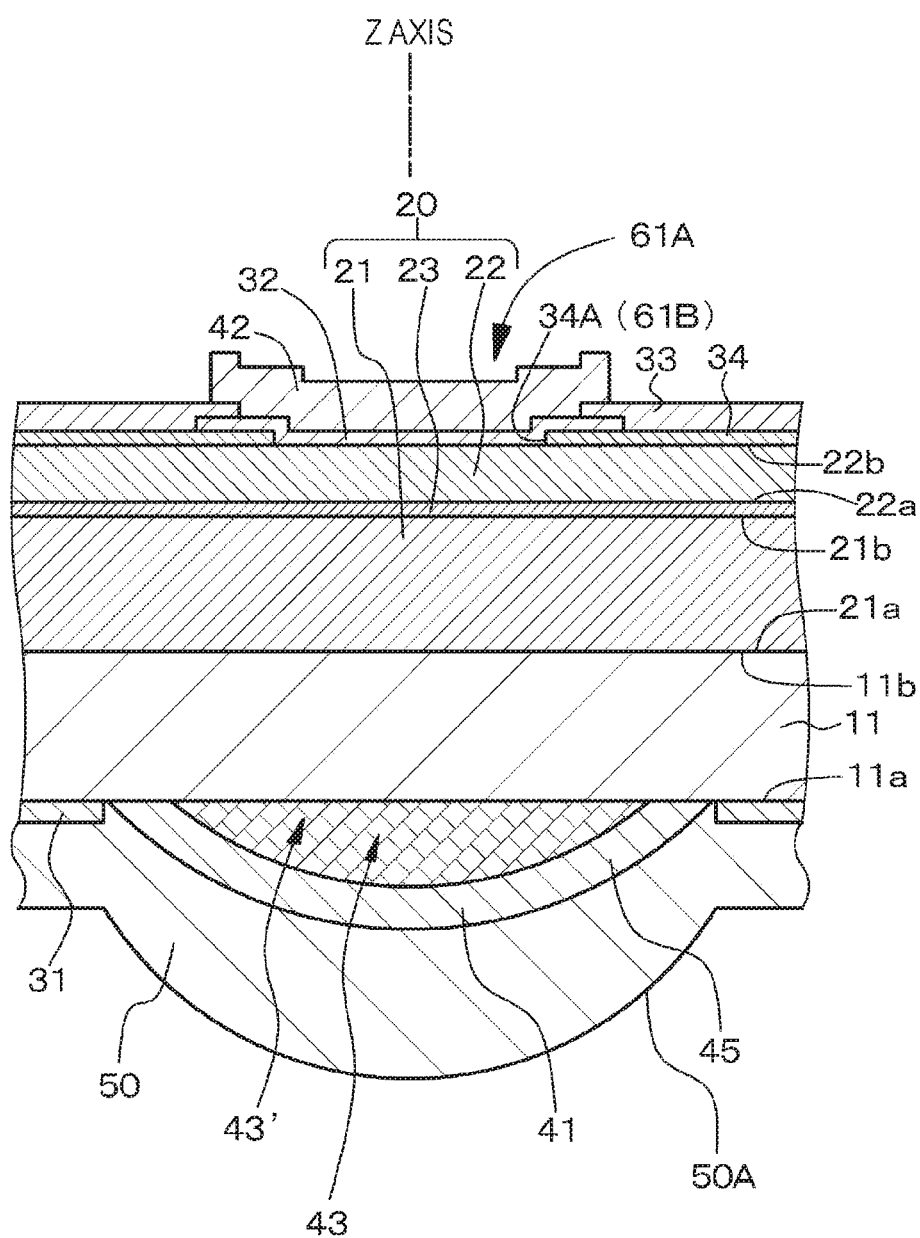
FIG. 9 is a schematic partial end view of a light emitting element of Example 2.
Figure 10:
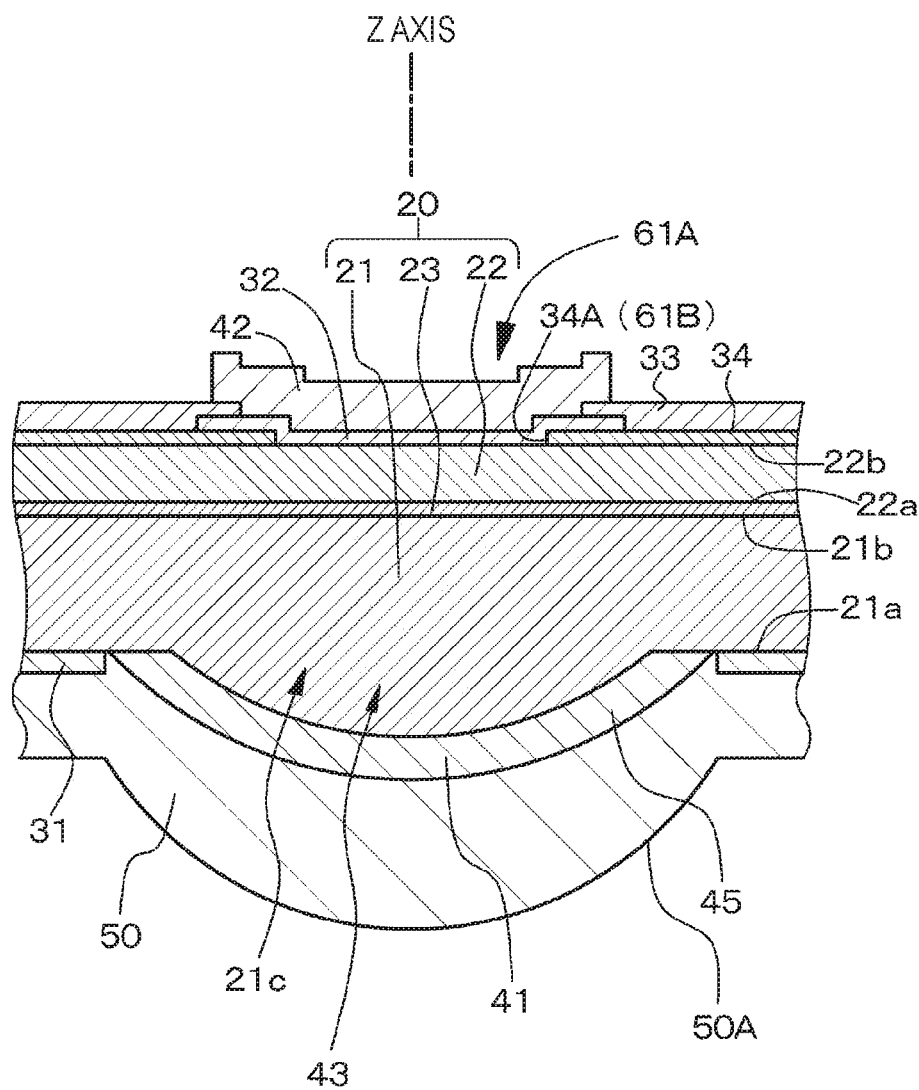
FIG. 10 is a schematic partial end view of a light emitting element of Example 3.
Figure 11:
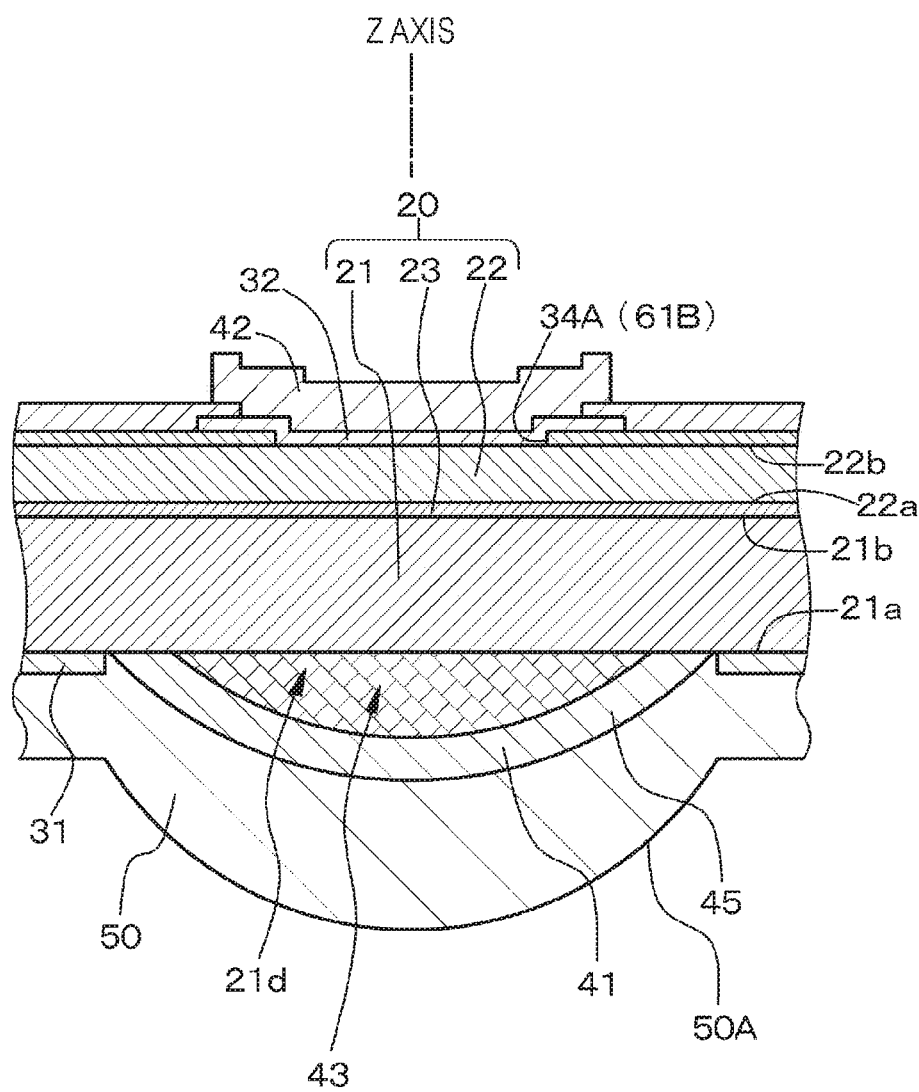
FIG. 11 is a schematic partial end view of a modification of the light emitting element of Example 3.
Figure 20:
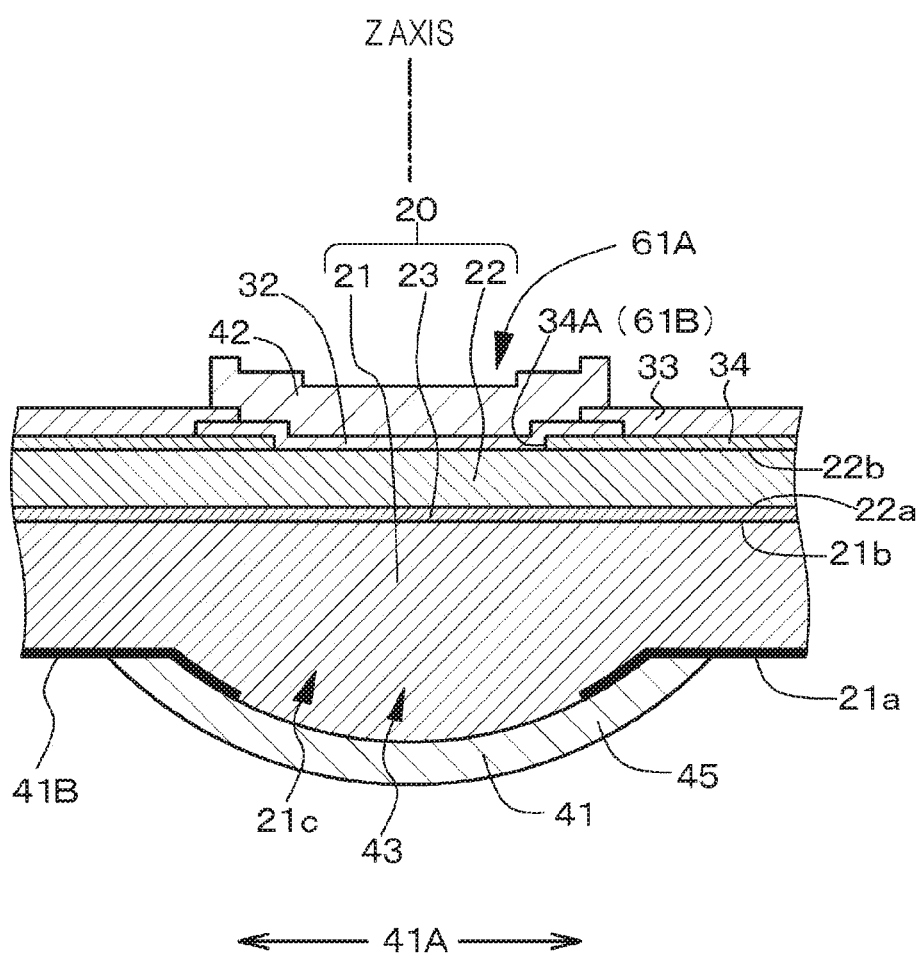
FIG. 20 is a schematic partial end view of a modification of the light emitting element of Example 6.
Figure 21:
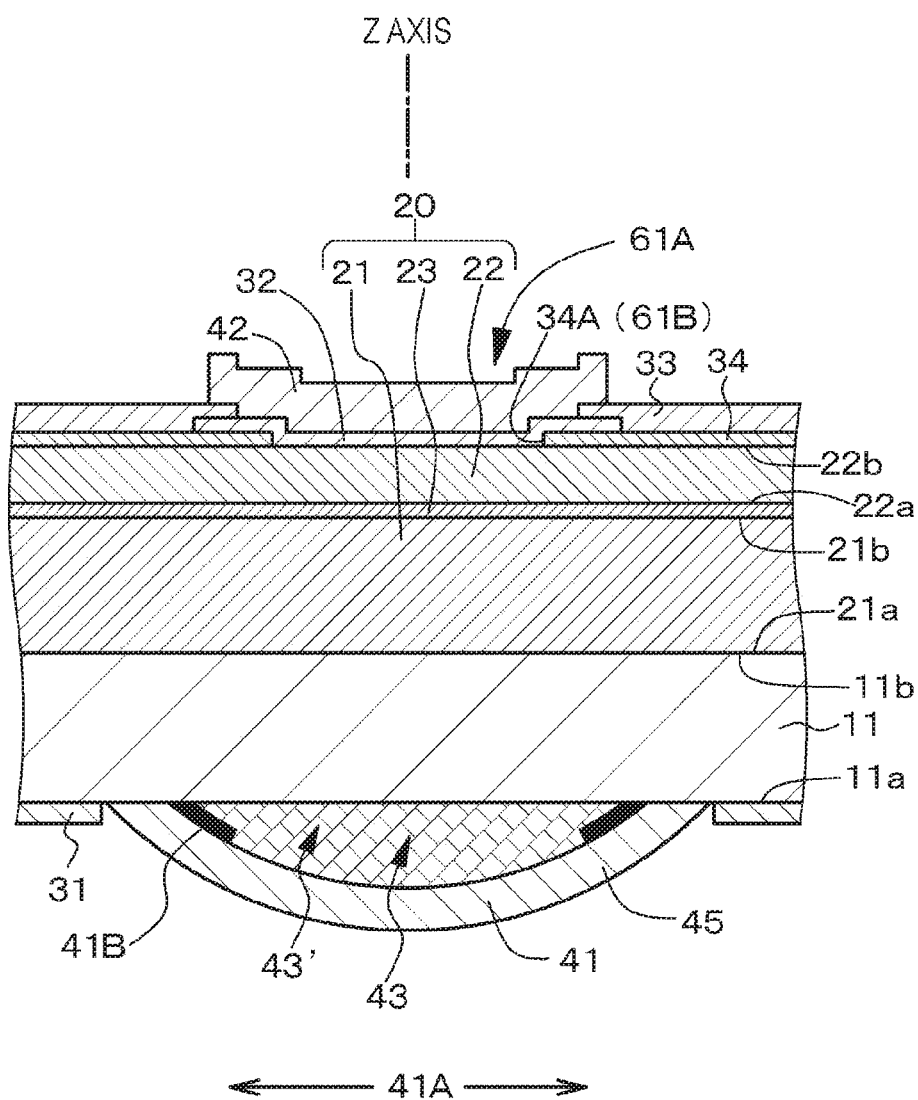
FIG. 21 is a schematic partial end view of a modification of the light emitting element of Example 6.
Figure 22:
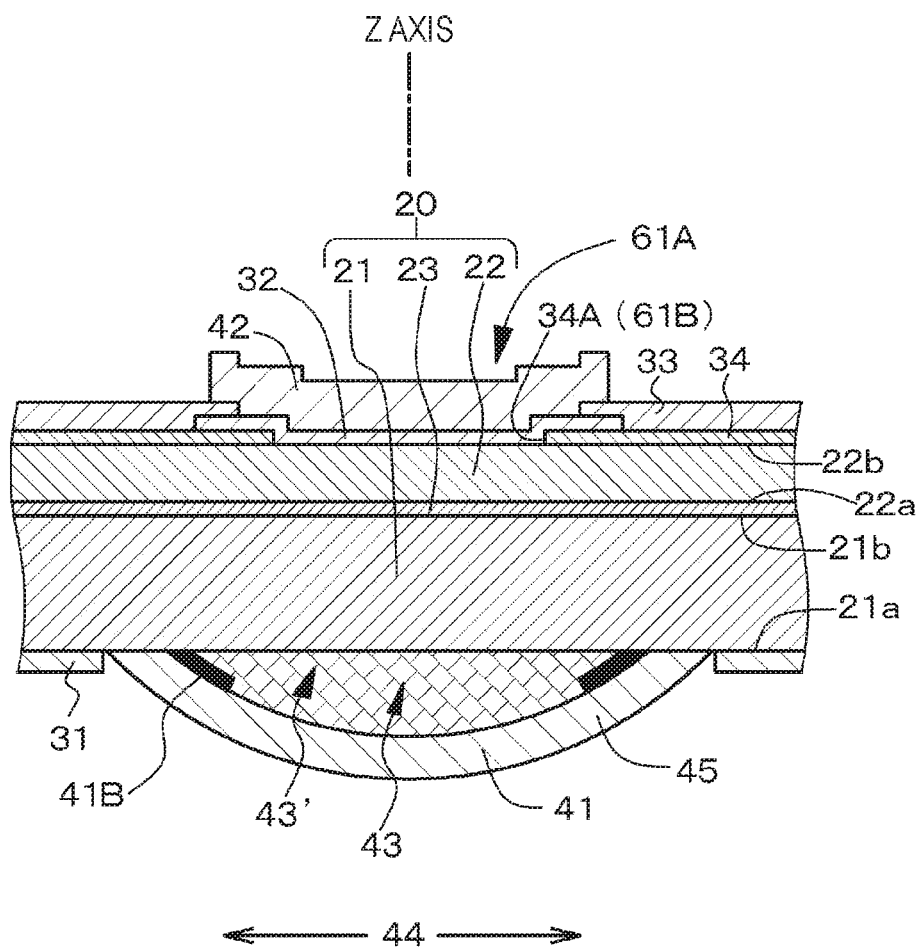
FIG. 22 is a schematic partial end view of a modification of the light emitting element of Example 6.

Examples in which the light shielding portion in Example 6 is applied to the light emitting element of Example 1 illustrated in FIG. 1 are illustrated in FIGS. 14, 15, 16, 17, 18, and 19. Furthermore, an example in which the light shielding portion in Example 6 is applied to the light emitting element of Example 2 illustrated in FIG. 9 is illustrated in FIG. 20, an example in which the light shielding portion in Example 6 is applied to the light emitting element of Example 3 illustrated in FIG. 10 is illustrated in FIG. 21, and an example in which the light shielding portion in Example 6 is applied to the modification of the light emitting element of Example 3 illustrated in FIG. 11 is illustrated in FIG. 22.

Figure 14:
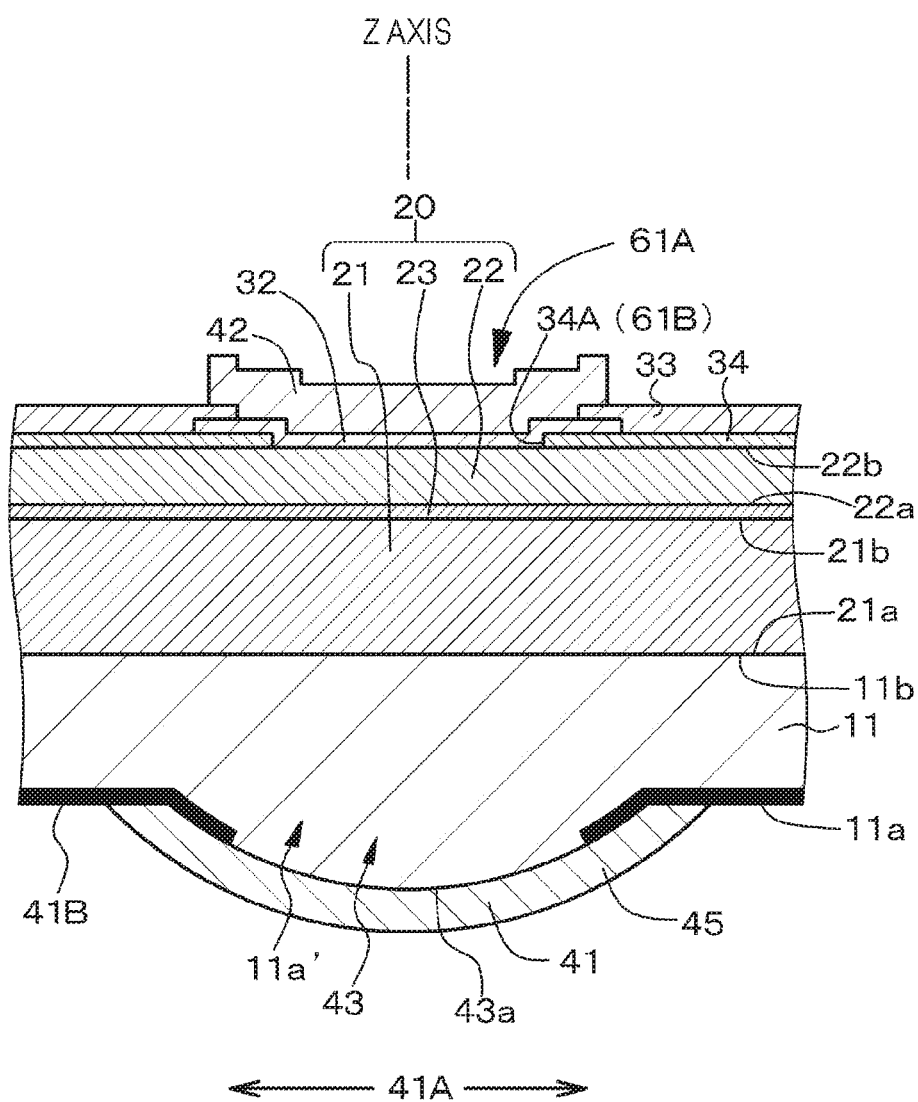
FIG. 14 is a schematic partial end view of a light emitting element of Example 6.
Figure 15:
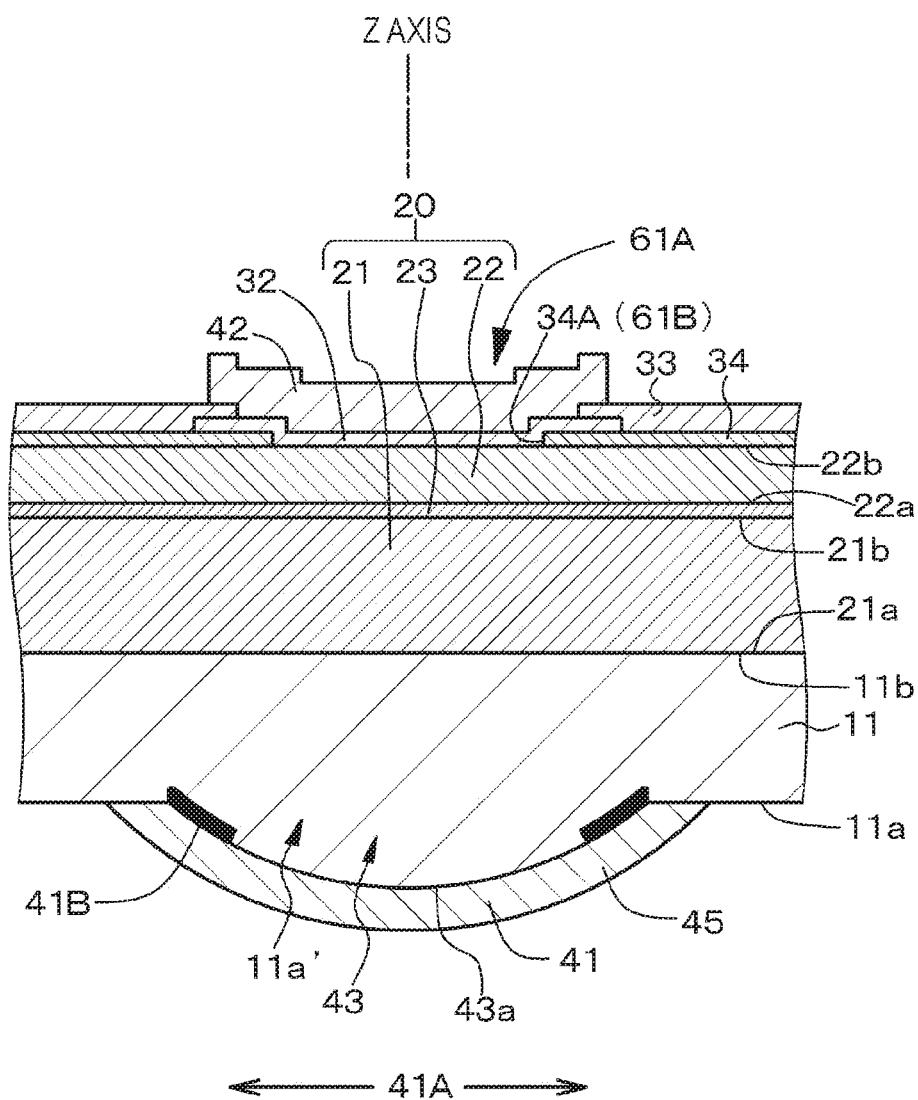
FIG. 15 is a schematic partial end view of a modification of the light emitting element of Example 6.
Figure 16:
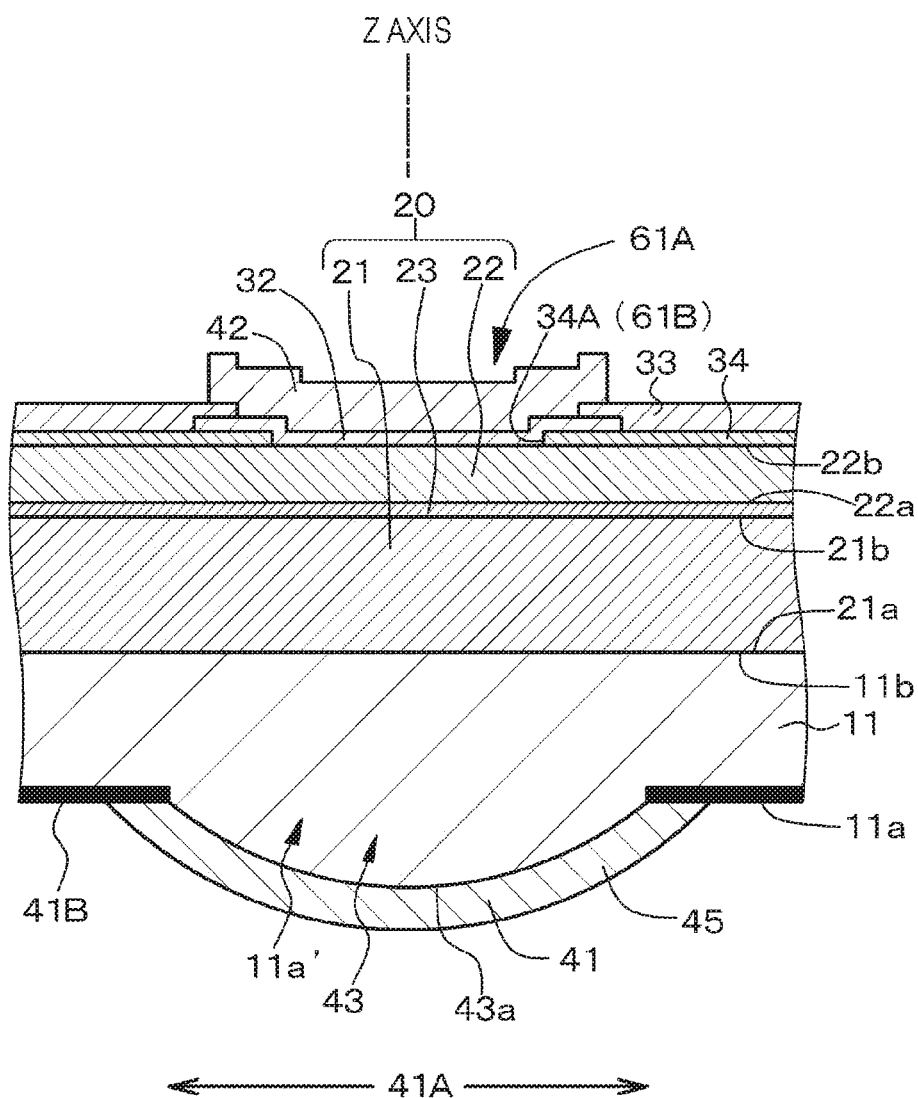
FIG. 16 is a schematic partial end view of a modification of the light emitting element of Example 6.
Figure 17:
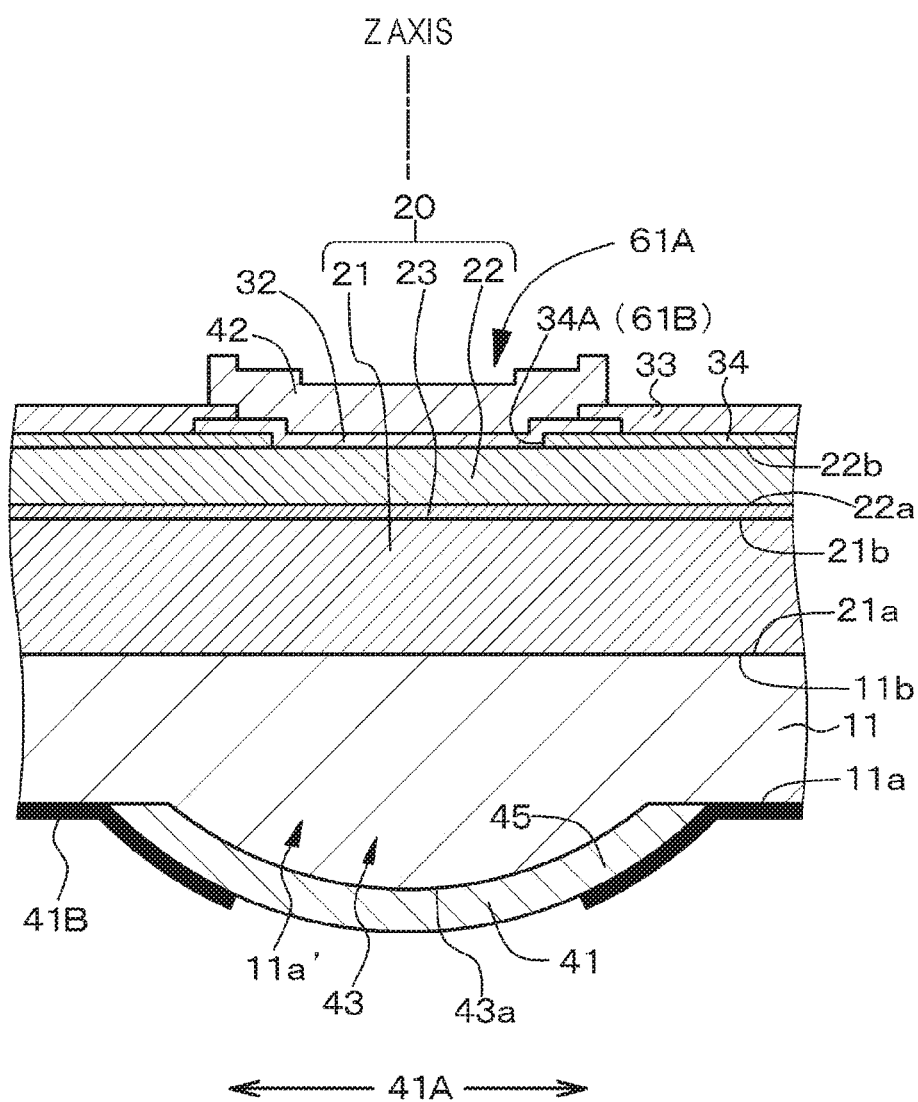
FIG. 17 is a schematic partial end view of a modification of the light emitting element of Example 6.
Figure 18:
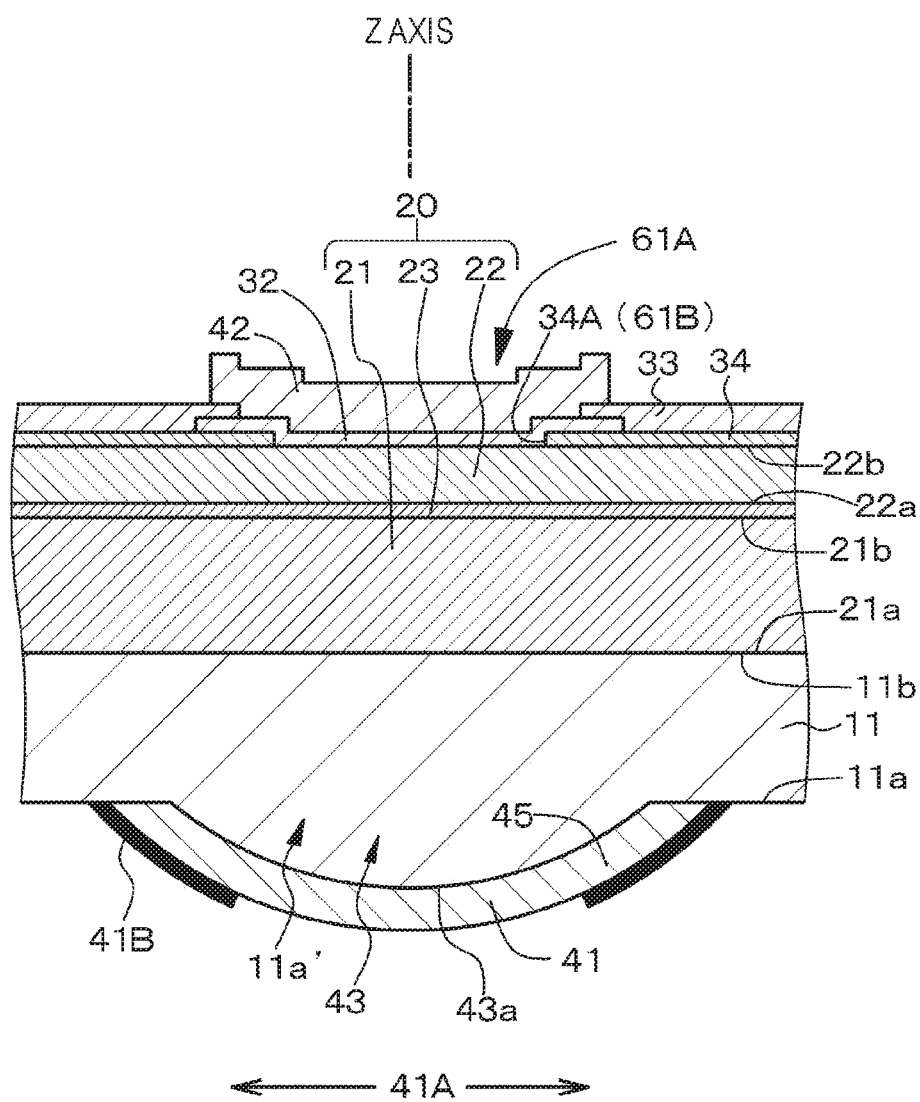
FIG. 18 is a schematic partial end view of a modification of the light emitting element of Example 6.
Figure 19:
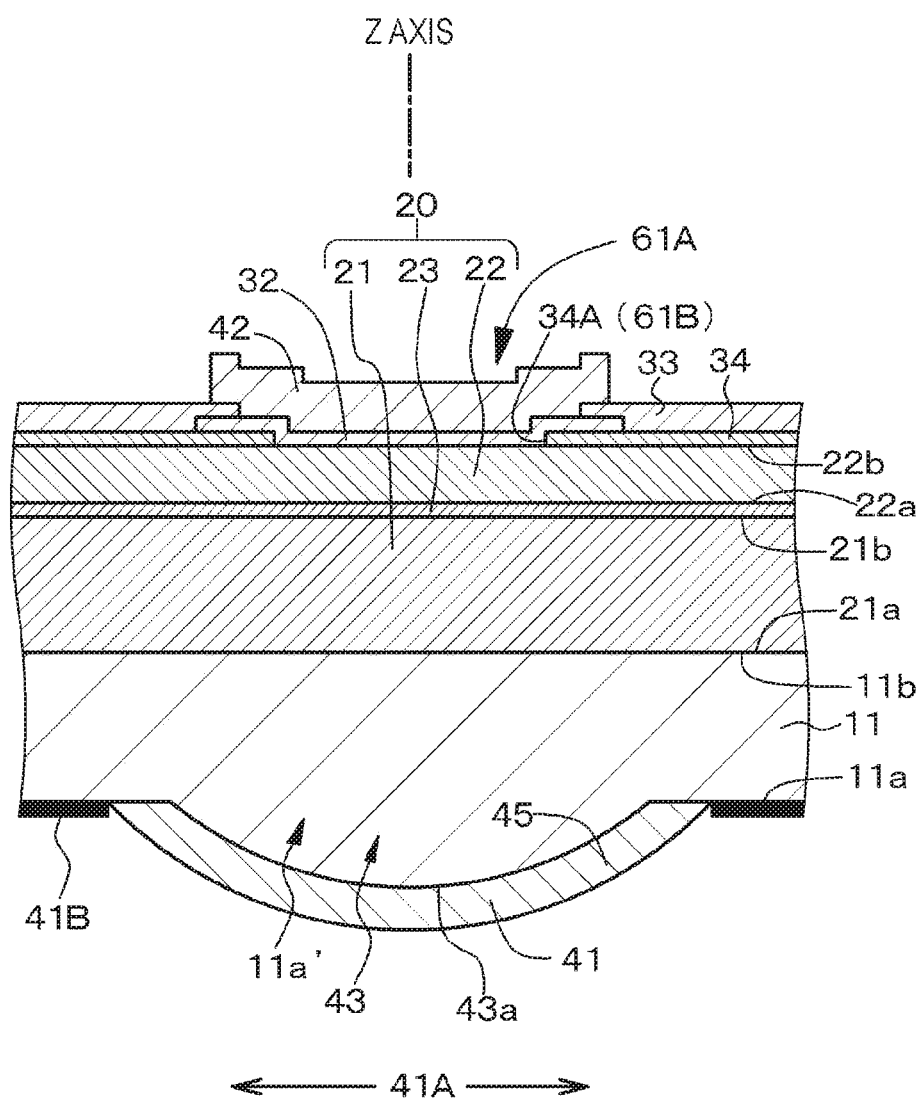
FIG. 19 is a schematic partial end view of a modification of the light emitting element of Example 6.

In the example illustrated in FIG. 14, the light shielding portion 41B is formed on the first surface 11a of the compound semiconductor substrate 11 and a part of the concave mirror portion 43. In the example illustrated in FIG. 15, the light shielding portion 41B is formed on a part of the concave mirror portion 43. In the example illustrated in FIG. 16, the light shielding portion 41B is formed on a part of the first surface 11a of the compound semiconductor substrate 11. In the example illustrated in FIG. 17, the light shielding portion 41B is formed on the first surface 11a of the compound semiconductor substrate 11 and a part of the first light reflecting layer 41. In the example illustrated in FIG. 18, the light shielding portion 41B is formed on a part of the first light reflecting layer 41. In the example illustrated in FIG. 19, the light shielding portion 41B is formed on a part of the first surface 11a of the compound semiconductor substrate 11. Note that the light shielding portions illustrated in FIGS. 15 to 19 can be applied to other Examples appropriately. In the example illustrated in FIG. 20, the light shielding portion 41B is formed on the first surface 21a of the first compound semiconductor layer 21 and a part of the concave mirror portion 43. In the example illustrated in FIGS. 21 and 22, the light shielding portion 41B is formed on a part of the concave mirror portion 43.

Example 7

Example 7 is also a modification of Examples 1 to 6, and relates to the light emitting element of configuration 1. As described above, the current injection region 61A and the current non-injection region 61B (current confinement region) are defined by the insulating film 34 having the opening 34A. That is, the current injection region 61A is defined by the opening 34A. That is, in the light emitting element of Example 7, the second compound semiconductor layer 22 has the current injection region 61A and the current non-injection region 61B surrounding the current injection region 61A. A shortest distance $D_{CI}$ from the area center of gravity point of the current injection region 61A to a boundary 61C between the current injection region 61A and the current non-injection region 61B satisfies the above-described formulas (A) and (B).

In the light emitting element of Example 7, the radius $r'_{DBR}$ of the effective region in the concave mirror portion 43 of the first light reflecting layer 41 satisfies $$\omega_0 \le r'_{DBR} \le 20 \cdot \omega_0.$$

Furthermore, $D_{CI} \ge \omega_0$ is satisfied. Moreover, $R_{DBR} \le 1 \times 10^{-3}$ m is satisfied. Specifically, $$D_{CI} = 4\ \mu m,$$

$$\omega_0 = 1.5\ \mu m,$$

$$L_{OR} = 50\ \mu m,$$

$$R_{DBR} = 60\ \mu m, \text{ and}$$

$$\lambda_0 = 525\ nm$$

can be exemplified. Furthermore, 8 μm can be exemplified as the diameter of the opening 34A. As the GaN substrate, a substrate having a main surface obtained by inclining a c-plane about 75 degrees in an m-axis direction is used. That is, the GaN substrate has a {20-21} plane which is a semipolar plane as a main surface. Note that such a GaN substrate can also be used in other Examples.

A deviation between the central axis (Z axis) of the concave mirror portion 43 and the current injection region 61A in the XY plane direction deteriorates characteristics of the light emitting element. Lithography is often used in both patterning for forming the concave mirror portion 43 and patterning for forming the opening 34A. In this case, a positional relationship between the concave mirror portion 43 and the opening 34A often shifts in the XY plane depending on performance of an exposure machine. In particular, the opening 34A (current injection region 61A) is positioned by performing alignment from the second compound semiconductor layer 22 side. Meanwhile, the concave mirror portion 43 is positioned by performing alignment from the compound semiconductor substrate 11 side. Therefore, in the light emitting element of Example 7, by forming the opening 34A (current injection region 61) so as to be larger than a region where light is focused by the concave mirror portion 43, even if a deviation occurs between the central axis (Z axis) of the concave mirror portion 43 and the current injection region 61A in the XY plane direction, the structure does not affect oscillation characteristics.

That is, in a case where a region where light reflected by the first light reflecting layer is collected is not included in a current injection region corresponding to a region where the active layer has gain by current injection, stimulated emission of light from a carrier is inhibited. As a result, laser oscillation may be inhibited. Therefore, by satisfying the above formulas (A) and (B), inclusion of the region where light reflected by the first light reflecting layer is collected in the current injection region can be ensured, and laser oscillation can be achieved reliably.

Example 8

Example 8 is also a modification of Examples 1 to 7, and relates to the light emitting element of configuration 2.

By the way, if an equivalent refractive index of a whole laminated structure constituted by the two DBR layers and the laminated structure formed therebetween is represented by $n_{eq}$, and a wavelength of a laser beam to be emitted from the surface emitting laser element (light emitting element) is represented by $\lambda_0$, the resonator length $L_{OR}$ in the whole laminated structure is represented by $$L = (m \cdot \lambda_0)/(2 \cdot n_{eq}).$$

Here, m represents a positive integer. In addition, in the surface emitting laser element (light emitting element), a wavelength at which oscillation is possible is determined by the resonator length $L_{OR}$. Each oscillation mode that can oscillate is referred to as a longitudinal mode. In addition, among the longitudinal modes, a longitudinal mode that matches with a gain spectrum determined by an active layer can cause laser oscillation. If an effective refractive index is represented by $n_{eff}$, an interval $\Delta\lambda$ between longitudinal modes is represented by $$\lambda_0^2/(2n_{eff} \cdot L).$$

That is, the longer the resonator length $L_{OR}$ is, the narrower the interval $\Delta\lambda$ between longitudinal modes is. Therefore, in a case where the resonator length $L_{OR}$ is long, a plurality of longitudinal modes can exist in a gain spectrum, and therefore a plurality of longitudinal modes can oscillate. Note that the following relationship is satisfied between the equivalent refractive index $n_{eq}$ and the effective refractive index $n_{eff}$ if an oscillation wavelength is represented by $\lambda_0$.

$$n_{eff} = n_{eq} - \lambda_0 \cdot (dn_{eq}/d\lambda_0)$$

Figure 30A:
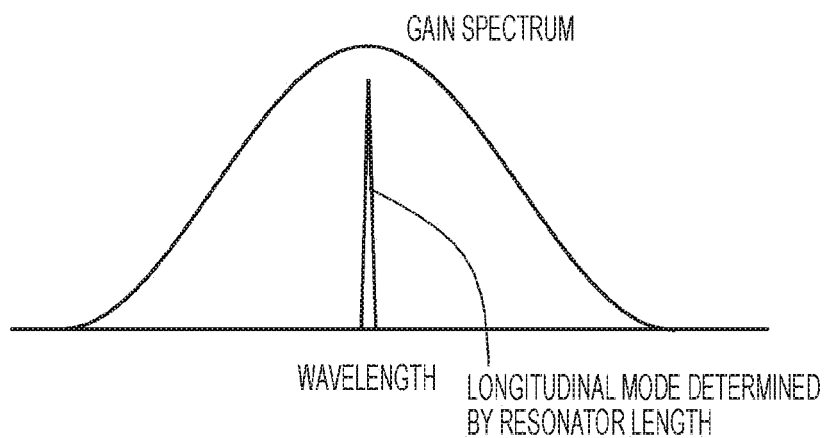
FIGS. 30A and 30B are conceptual diagrams schematically illustrating a longitudinal mode existing in a gain spectrum determined by an active layer.
Figure 30B:
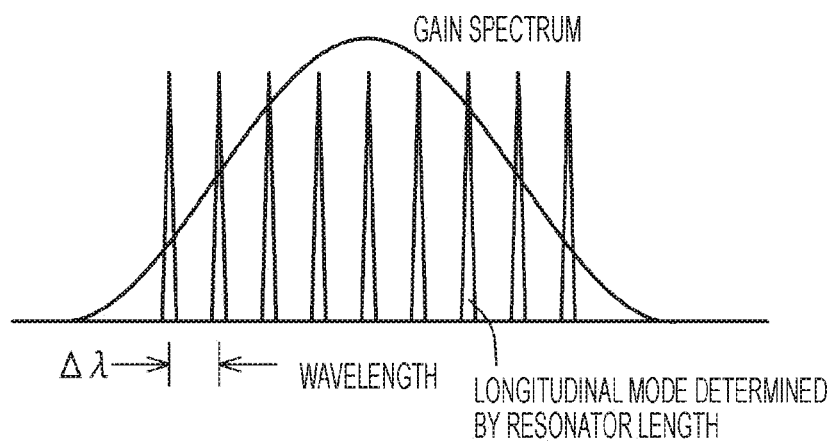

Here, in a case where the laminated structure includes a GaAs-based compound semiconductor layer, the resonator length $L_{OR}$ is usually as short as 1 μm or less, and one kind (one wavelength) of a laser beam in a longitudinal mode is usually emitted from a surface emitting laser element (see the conceptual diagram of FIG. 30A). Therefore, it is possible to accurately control an oscillation wavelength of a laser beam in a longitudinal mode emitted from the surface emitting laser element. Meanwhile, in a case where the laminated structure includes a GaN-based compound semiconductor layer, the resonator length $L_{OR}$ is usually as long as several times the wavelength of a laser beam emitted from a surface emitting laser element. Therefore, a plurality of kinds of laser beams in longitudinal modes can be emitted from the surface emitting laser element (see the conceptual diagram of FIG. 30B), and it is difficult to accurately control an oscillation wavelength of a laser beam that can be emitted from the surface emitting laser element.

Figure 23:
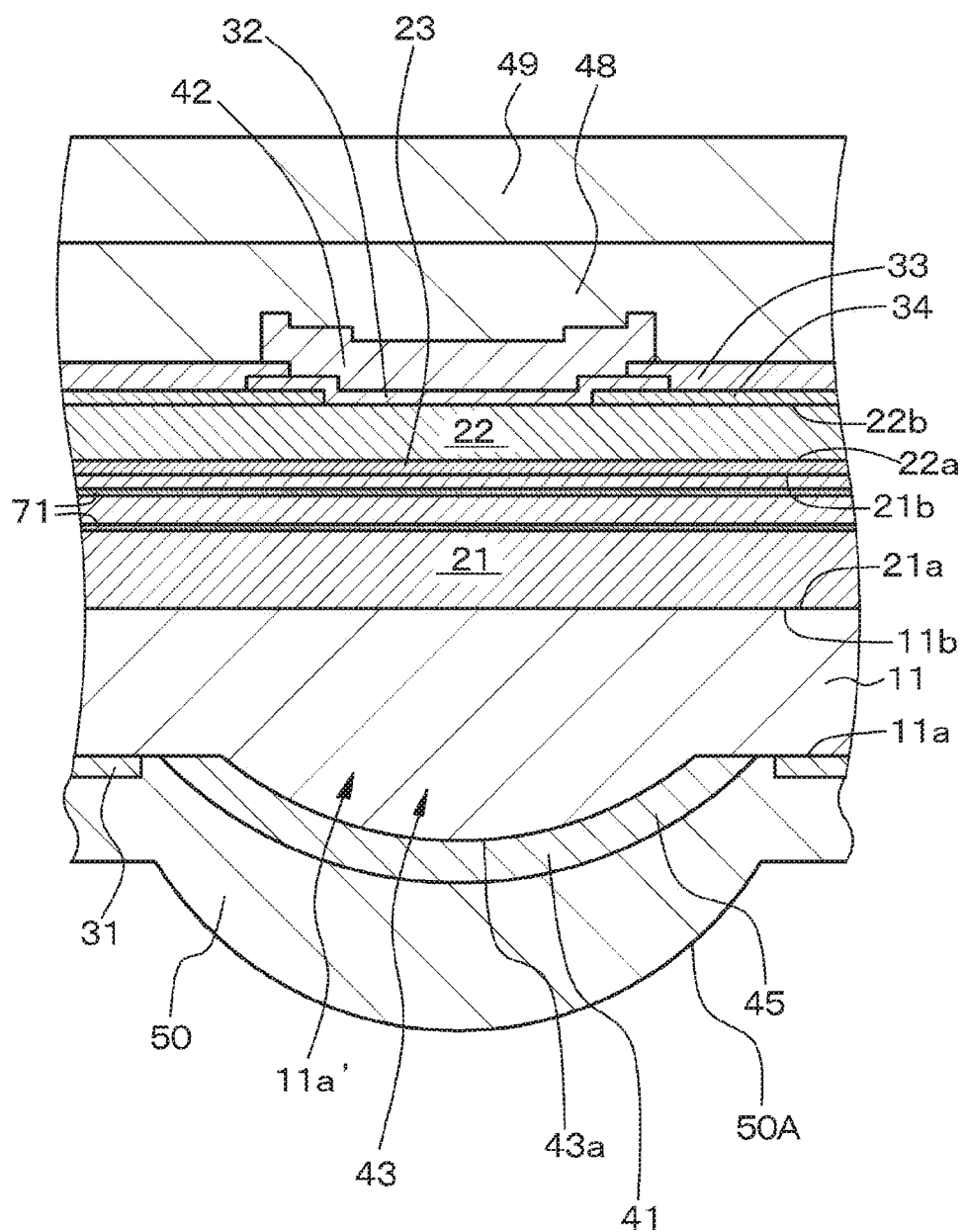
FIG. 23 is a schematic partial end view of a light emitting element of Example 7.
Figure 24:
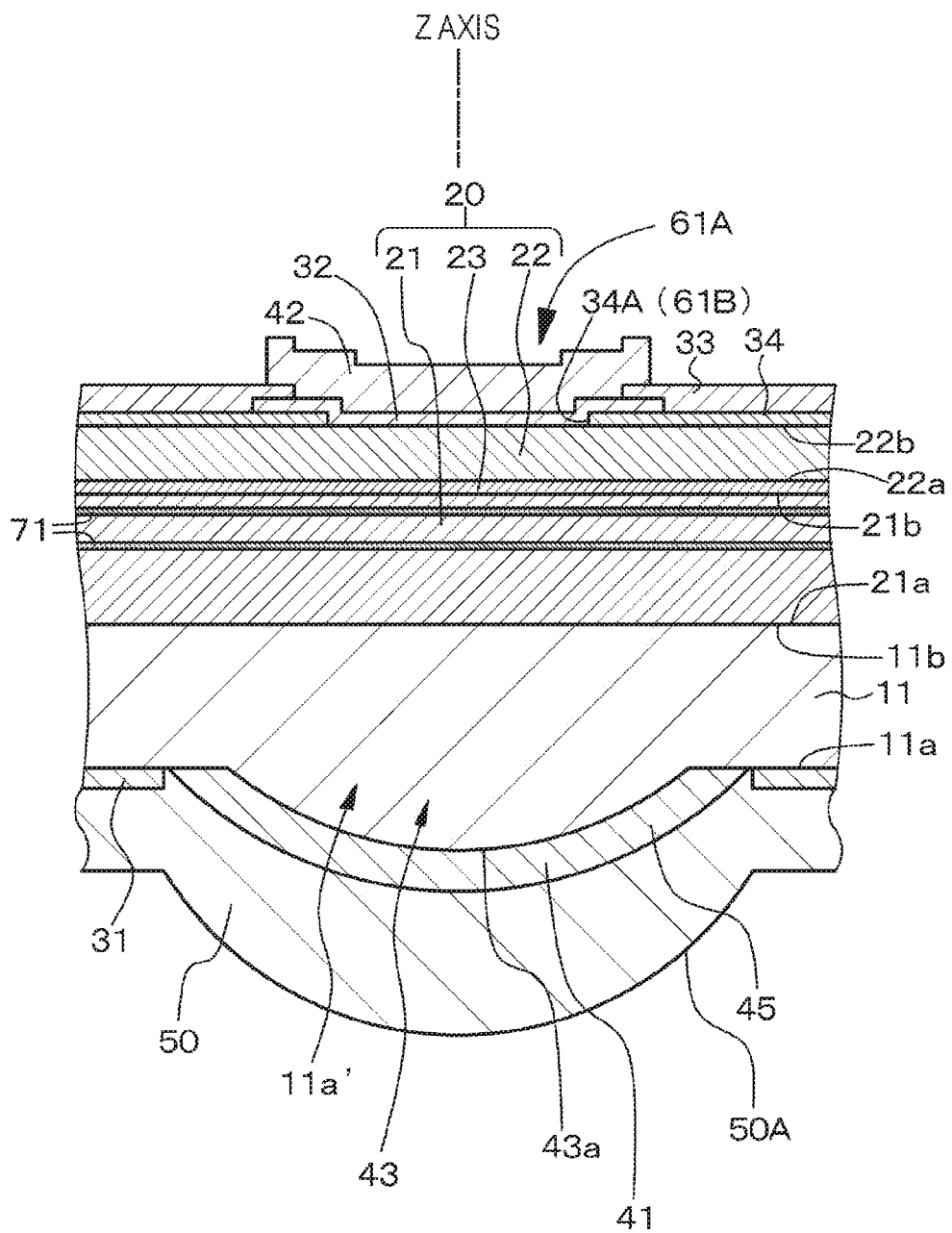
FIG. 24 is a schematic partial end view of a modification of the light emitting element of Example 7.

As illustrated in the schematic partial cross-sectional view of FIG. 23 or 24 (a modification of the light emitting element of Example 1), in the light emitting element of Example 8 or a light emitting element of each of Examples 9 and 10 as described later, in the laminated structure 20 including the second electrode 32, at least two light absorbing material layers 71, preferably at least four light absorbing material layers 71 are formed in parallel with the virtual plane occupied by the active layer 23. Specifically, in Example 8, 20 light absorbing material layers 71 are formed. Note that only the two light absorbing material layers 71 are illustrated in the drawings in order to simplify the drawings.

The oscillation wavelength (desired oscillation wavelength emitted from the light emitting element) $\lambda_0$ is 450 nm in Example 8. The 20 light absorbing material layers 71 includes a compound semiconductor material having a narrower band gap than a compound semiconductor constituting the laminated structure 20, specifically includes n-In$_{0.2}$Ga$_{0.8}$N, and is formed in the first compound semiconductor layer 21. The thickness of the light absorbing material layer 71 is $\lambda_0/(4 \cdot n_{eq})$ or less, and specifically 3 nm. Furthermore, the optical absorption coefficient of the light absorbing material layer 71 is twice or more, and specifically $1 \times 10^3$ times the optical absorption coefficient of the first compound semiconductor layer 21 constituted by an n-GaN layer.

Furthermore, the light absorbing material layer 71 is located at a minimum amplitude portion generated in a standing wave of light formed in the laminated structure, and the active layer 23 is located at a maximum amplitude portion generated in a standing wave of light formed in the laminated structure. A distance between the center of the active layer 23 in a thickness direction thereof and the center of the light absorbing material layer 71 adjacent to the active layer 23 in a thickness direction thereof is 46.5 nm. Moreover, if an equivalent refractive index of the whole of the two light absorbing material layers 71 and the laminated structure located between the light absorbing material layers 71 (specifically, the first compound semiconductor layer 21 in Example 8) is represented by $n_{eq}$, and a distance between the light absorbing material layers 71 is represented by $L_{Abs}$, $$0.9 \times \{(m \cdot \lambda_0)/(2 \cdot n_{eq})\} \le L_{Abs} \le 1.1 \times \{(m \cdot \lambda_0)/(2 \cdot n_{eq})\}$$

is satisfied. Here, m is 1 or any integer of 2 or more including 1. However, in Example 8, m=1. Therefore, a distance between the adjacent light absorbing material layers 71 satisfies, in all the plurality of light absorbing material layers 71 (20 light absorbing material layers 71), $$0.9 \times \{(m \cdot \lambda_0)/(2 \cdot n_{eq})\} \le L_{Abs} \le 1.1 \times \{(m \cdot \lambda_0)/(2 \cdot n_{eq})\}.$$

Specifically, the value of the equivalent refractive index $n_{eq}$ is 2.42, and when m=1, specifically, $$L_{Abs} = 1 \times 450/(2 \times 2.42)$$
$$= 93.0 \text{ nm}$$

is satisfied. Note that m may be any integer of 2 or more in some of the 20 light absorbing material layers 71.

In manufacturing the light emitting element of Example 8, in a similar step to [step-100] of Example 1, the laminated structure 20 is formed. At this time, the 20 light absorbing material layers 71 is also formed in the first compound semiconductor layer 21. Except for this point, the light emitting element of Example 8 can be manufactured on the basis of a similar method to that of the light emitting element of Example 1.

Figure 25:
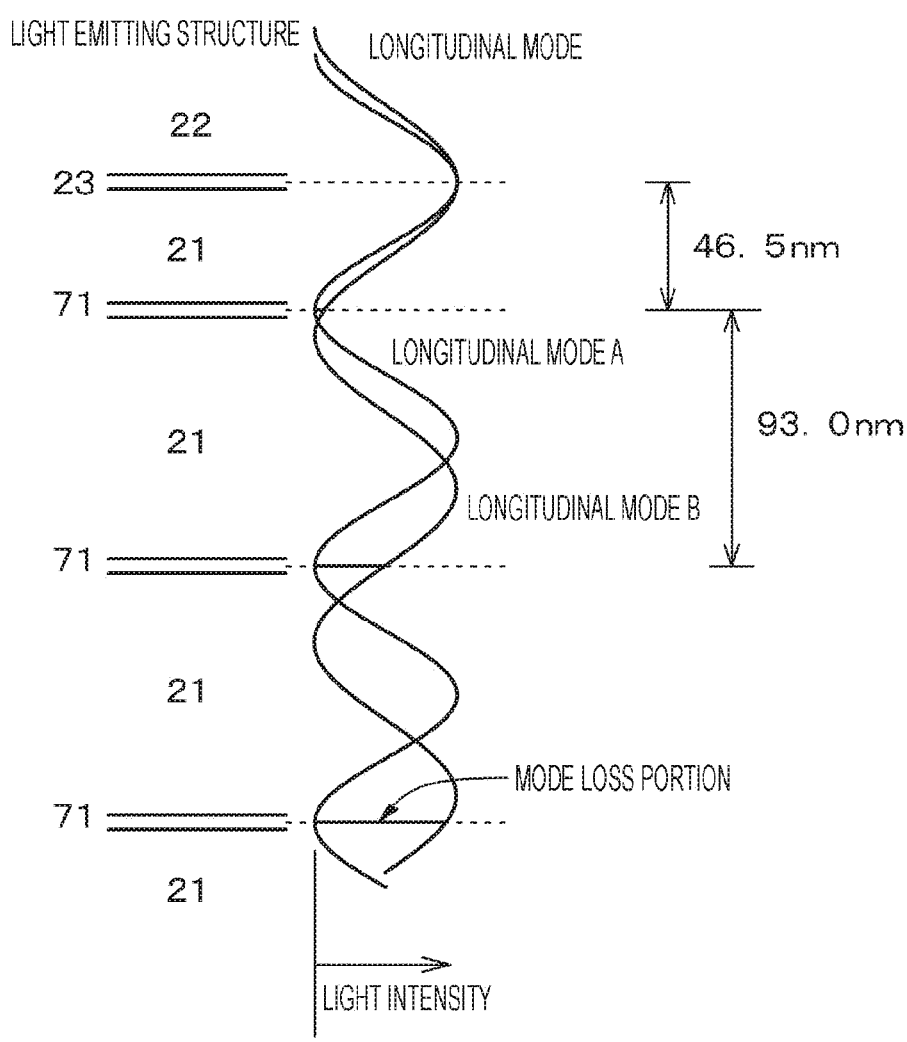
FIG. 25 is a diagram obtained by superimposing a schematic partial cross-sectional view of a light emitting element of Example 8 with two longitudinal modes of longitudinal mode A and longitudinal mode B.

In a case where a plurality of longitudinal modes is generated within a gain spectrum determined by the active layer 23, this case is schematically illustrated in FIG. 25. Note that FIG. 25 illustrates two longitudinal modes of longitudinal mode A and longitudinal mode B. In addition, in this case, it is assumed that the light absorbing material layer 71 is located at the minimum amplitude portion of the longitudinal mode A and is not located at the minimum amplitude portion of the longitudinal mode B. In this case, a mode loss of the longitudinal mode A is minimized, but a mode loss of the longitudinal mode B is large. In FIG. 25, the mode loss portion of the longitudinal mode B is schematically indicated by a solid line. Therefore, oscillation occurs in the longitudinal mode A more easily than in the longitudinal mode B. Therefore, by using such a structure, in other words, by controlling the positions and the cycles of the light absorbing material layers 71, it is possible to stabilize a specific longitudinal mode and to make oscillation easier. Meanwhile, it is possible to increase a mode loss for another undesirable longitudinal mode. Therefore, it is possible to suppress oscillation in another undesirable longitudinal mode.

As described above, in the light emitting element of Example 8, since at least two light absorbing material layers are formed in the laminated structure, among laser beams in a plurality of kinds of longitudinal modes that can be emitted from a surface emitting laser element, oscillation of a laser beam in an undesired longitudinal mode can be suppressed. As a result, it is possible to accurately control an oscillation wavelength of an emitted laser beam. In addition, note that the light emitting element of Example 8 has the concave mirror portion 43, and therefore can reliably suppress occurrence of diffraction loss.

Example 9

Example 9 is a modification of Example 8. In Example 8, each of the light absorbing material layers 71 includes a compound semiconductor material having a narrower band gap than the compound semiconductor constituting the laminated structure 20. Meanwhile, in Example 9, each of the ten light absorbing material layers 71 includes a compound semiconductor material doped with impurities, specifically, a compound semiconductor material (specifically, n-GaN:Si) having an impurity concentration (impurity: Si) of $1 \times 10^{19}/cm^3$. Furthermore, in Example 9, the oscillation wavelength $\lambda_0$ is 515 nm. Note that the composition of the active layer 23 is $In_{0.3}Ga_{0.7}N$. In Example 9, m=1, the value of $L_{Abs}$ is 107 nm, a distance between the center of the active layer 23 in a thickness direction thereof and the center of a light absorbing material layer 71 adjacent to the active layer 23 in a thickness direction thereof is 53.5 nm, and the thickness of the light absorbing material layers 71 is 3 nm. The configuration and structure of the light emitting element of Example 9 can be similar to those of the light emitting element of Example 8 except for the above points, and therefore detailed description will be omitted. Note that m may be an any integer of 2 or more in some of the ten light absorbing material layers 71.

Example 10

Example 10 is a modification of Example 8. In Example 10, each of five light absorbing material layers (referred to as "first light absorbing material layer" for convenience) has a similar configuration to the light absorbing material layer 71 of Example 8, that is, includes $n-In_{0.3}Ga_{0.7}N$. Moreover, in Example 10, one light absorbing material layer (referred to as "second light absorbing material layer" for convenience) includes a transparent conductive material. Specifically, the second light absorbing material layer also serves as the second electrode 32 including ITO. In Example 10, the oscillation wavelength $\lambda_0$ is 450 nm. Furthermore, m=1 or 2. In a case of m=1, the value of $L_{Abs}$ is 93.0 nm, a distance between the center of the active layer 23 in a thickness direction thereof and the center of the first light absorbing material layer adjacent to the active layer 23 in a thickness direction thereof is 46.5 nm, and the thickness of the five-layered first light absorbing material layer is 3 nm. That is, in the five-layered first light absorbing material layer, $$0.9 \times \{(m \cdot \lambda_0)/(2 \cdot n_{eq})\} \leq L_{Abs} \leq 1.1 \times \{(m \cdot \lambda_0)/(2 \cdot n_{eq})\}$$

is satisfied. Furthermore, in each of the first light absorbing material layer adjacent to the active layer 23 and the second light absorbing material layer, m=2 is satisfied. That is, $$0.9 \times \{(2 \cdot \lambda_0)/(2 \cdot n_{eq})\} \leq L_{Abs} \leq 1.1 \times \{(2 \cdot \lambda_0)/(2 \cdot n_{eq})\}$$

is satisfied. The optical absorption coefficient of the one-layered second light absorbing material layer also serving as the second electrode 32 is 2000 cm$^{-1}$, the thickness thereof is 30 nm, and a distance from the active layer 23 to the second light absorbing material layer is 139.5 nm. The configuration and structure of the light emitting element of Example 10 can be similar to those of the light emitting element of Example 8 except for the above points, and therefore detailed description will be omitted. Note that m can be an any integer of 2 or more in some of the five first light absorbing material layers. Note that the number of the light absorbing material layers 71 can be set to one unlike Example 8. Also in this case, a positional relationship between the second light absorbing material layer also serving as the second electrode 32 and the light absorbing material layer 71 needs to satisfy the following formula.

$$0.9 \times \{(m \cdot \lambda_0)/(2 \cdot n_{eq})\} \leq L_{Abs} \leq 1.1 \times \{(m \cdot \lambda_0)/(2 \cdot n_{eq})\}$$

Hitherto, the present disclosure has been described on the basis of the preferable Examples. However, the present disclosure is not limited to these Examples. The configurations and structures of the light emitting element described in Examples are illustrative and can be changed appropriately. The method for manufacturing the light emitting element also can be changed appropriately. In some cases, by appropriately selecting the bonding layer and the supporting substrate, the surface emitting laser element can emit light from a top surface of the second compound semiconductor layer via the second light reflecting layer.

Note that the present disclosure can have the following configurations.

<<A01 Light emitting element>>

A light emitting element including:

a laminated structure obtained by laminating a first compound semiconductor layer having a first surface and a second surface facing the first surface, an active layer facing the second surface of the first compound semiconductor layer, and a second compound semiconductor layer having a first surface facing the active layer and a second surface facing the first surface;

a first light reflecting layer disposed on the first surface side of the first compound semiconductor layer;

a second light reflecting layer disposed on the second surface side of the second compound semiconductor layer; and light convergence/divergence changing means, in which the first light reflecting layer is formed on a concave mirror portion, the second light reflecting layer has a flat shape, and when light generated in the active layer is emitted to the outside, a light convergence/divergence state before the light is incident on the light convergence/divergence changing means is different from a light convergence/divergence state after the light passes through the light convergence/divergence changing means.

[A02] The light emitting element according to [A01], in which when the light generated in the active layer passes through the light convergence/divergence changing means, the light is converged more than before the light is incident on the light convergence/divergence changing means.

[A03] The light emitting element according to [A02], in which the light convergence/divergence changing means includes a convex lens, a Fresnel lens, or a hologram lens.

[A04] The light emitting element according to any one of [A01] to [A03], in which light is emitted via the first light reflecting layer, and
the light convergence/divergence changing means is disposed on a light emitting side of the first light reflecting layer.

[A05] The light emitting element according to [A04], in which the center of curvature of the light convergence/divergence changing means on an optical axis is located closer to the light convergence/divergence changing means than the center of curvature of the first light reflecting layer on the optical axis.

[A06] The light emitting element according to [A04] or [A05], in which on an optical axis, a distance from a light emitting surface of the light convergence/divergence changing means to a light emitting surface of the first light reflecting layer is $1\times10^{-6}$ m to $1\times10^{-3}$ m.

[A07] The light emitting element according to any one of [A04] to [A06], in which when the planar shape of the first light reflecting layer is assumed to be a circle, the circle has a diameter of $1\times10^{-4}$ m or less.

[A08] The light emitting element according to any one of [A04] to [A07], in which the light convergence/divergence changing means has a thickness of $1\times10^{-6}$ m to $1\times10^{-3}$ m along an optical axis.

[A09] The light emitting element according to any one of [A04] to [A08], in which a distance from the active layer to the first light reflecting layer is $1\times10^{-5}$ m to $5\times10^{-4}$ m.

[A10] The light emitting element according to any one of [A01] to [A03], in which
light is emitted via the second light reflecting layer, and
the light convergence/divergence changing means is disposed on a light emitting side of the second light reflecting layer.

[A11] The light emitting element according to any one of [A01] to [A10], in which a distance from the first light reflecting layer to the second light reflecting layer along an optical axis is $1\times10^{-5}$ m or more.

[A12] The light emitting element according to any one of [A01] to [A11], in which the laminated structure includes a GaN-based compound semiconductor.

[A13] The light emitting element according to any one of [A01] to [A12], in which the light emitting element includes a surface emitting laser element.

[A14] The light emitting element according to any one of [A01] to [A13], in which the first light reflecting layer has a light transmitting portion and a light shielding portion surrounding the light transmitting portion.

[A15] The light emitting element according to any one of [A01] to [A14], in which the shape of the concave mirror portion is a spherical shape or a parabolic shape having a coefficient of determination of 0.8 or more within a range of a beam waist radius $\omega_0$ from the central portion of the concave mirror portion.

[A16] The light emitting element according to any one of [A01] to [A15], in which a figure drawn by an interface facing the laminated structure in a part of the concave mirror portion of the first light reflecting layer when the first light reflecting layer is cut along a virtual plane including a laminating direction of the laminated structure is a part of a circle or a part of a parabola.

<<B01 Light emitting element of configuration 1>>

The light emitting element according to any one of [A01] to [A16], in which
the second compound semiconductor layer has a current injection region and a current non-injection region surrounding the current injection region, and
a shortest distance $D_{CI}$ from the area center of gravity point of the current injection region to a boundary between the current injection region and the current non-injection region satisfies the following formulas.

$$D_{CI} \geq \omega_0/2$$

in which $$\omega_0 \equiv (\lambda_0/\pi)\{L_{OR}(R_{DBR}-L_{OR})\}^{1/2}$$

Here
$\lambda_0$: Wavelength of light mainly emitted from light emitting element
$L_{OR}$: Resonator length
$R_{DBR}$: Radius of curvature of concave mirror portion of first light reflecting layer

[B02] The light emitting element according to [B01], in which
the radius $r'_{DBR}$ of an effective region in the concave mirror portion of the first light reflecting layer satisfies $$\omega_0 \leq r'_{DBR} \leq 20 \cdot \omega_0.$$

[B03] The light emitting element according to [B01] or [B02], satisfying $D_{CI} \geq \omega_0$.

[B04] The light emitting element according to any one of [B01] to [B03], satisfying $R_{DBR} \leq 1\times10^{-3}$ M.

<<C01 Light emitting element of configuration 2>>

The light emitting element according to any one of [A01] to [B04], in which the laminated structure including the second electrode has at least two light absorbing material layers in parallel with a virtual plane occupied by the active layer.

[C02] The light emitting element according to [C01], having at least four light absorbing material layers.

[C03] The light emitting element according to [C01] or [C02], in which if an oscillation wavelength is represented by $\lambda_0$, an equivalent refractive index of the whole of the two light absorbing material layers and the laminated structure located between the light absorbing material layers is represented by $n_{eq}$, and a distance between the light absorbing material layers is represented by $L_{Abs}$, $$0.9\times\{(m\cdot\lambda_0)/(2\cdot n_{eq})\} \leq L_{Abs} \leq 1.1\times\{(m\cdot\lambda_0)/(2\cdot n_{eq})\}$$

is satisfied.
In the formula, m is 1 or any integer of 2 or more including 1.

[C04] The light emitting element according to any one of [C01] to [C03], in which the light absorbing material layers have a thickness of $\lambda_0/(4\cdot n_{eq})$ or less.

[C05] The light emitting element according to any one of [C01] to [C04], in which the light absorbing material layers are located at a minimum amplitude portion generated in a standing wave of light formed in the laminated structure.

[C06] The light emitting element according to any one of [C01] to [C05], in which the active layer is located at a maximum amplitude portion generated in a standing wave of light formed in the laminated structure.

[C07] The light emitting element according to any one of [C01] to [C06], in which the light absorbing material layers have an optical absorption coefficient twice or more the optical absorption coefficient of a compound semiconductor constituting the laminated structure.

[C08] The light emitting element according to any one of [C01] to [C07], in which each of the light absorbing material layers includes at least one selected from the group including a compound semiconductor material having a narrower band gap than a compound semiconductor constituting the laminated structure, a compound semiconductor material doped with impurities, a transparent conductive material, and a light reflecting layer constituting material having a light absorbing characteristic.

[D01] The light emitting element according to any one of [A01] to [C08], in which a compound semiconductor substrate is disposed between the first surface of the first compound semiconductor layer and the first light reflecting layer.

[D02] The light emitting element according to [D01], in which the compound semiconductor substrate is constituted by a GaN substrate.

[D03] The light emitting element according to [D01] or [D02], in which the first light reflecting layer includes a multilayer light reflecting film formed on a surface of at least a part of the concave mirror portion constituted by a protrusion of the compound semiconductor substrate.

[D04] The light emitting element according to [D01] or [D02], in which the first light reflecting layer includes a multilayer light reflecting film formed on a surface of at least a part of the concave mirror portion formed on the compound semiconductor substrate.

[D05] The light emitting element according to any one of [A01] to [C08], in which the first light reflecting layer is formed on the first surface of the first compound semiconductor layer.

[D06] The light emitting element according to any one of [A01] to [D05], in which the laminated structure has a higher value of thermal conductivity than the first light reflecting layer.

[D07] The light emitting element according to any one of [A01] to [D06], in which $R_{DBR} \leq 1 \times 10^{-3}$ m is satisfied when a radius of curvature of the concave mirror portion of the light emitting element is represented by $R_{DBR}$.

[D08] The light emitting element according to any one of [A01] to [D07], in which a convex portion is formed around the first light reflecting layer, and the first light reflecting layer does not protrude from the convex portion.

<<E01 Light emitting element array>>

A light emitting element array having a plurality of light emitting elements juxtaposed therein, each of the light emitting elements including:

a laminated structure obtained by laminating a first compound semiconductor layer having a first surface and a second surface facing the first surface, an active layer facing the second surface of the first compound semiconductor layer, and a second compound semiconductor layer having a first surface facing the active layer and a second surface facing the first surface;

a first light reflecting layer disposed on the first surface side of the first compound semiconductor layer;

a second light reflecting layer disposed on the second surface side of the second compound semiconductor layer; and light convergence/divergence changing means, in which
the first light reflecting layer is formed on a concave mirror portion, the second light reflecting layer has a flat shape, and when light generated in the active layer is emitted to the outside, a light convergence/divergence state before the light is incident on the light convergence/divergence changing means is different from a light convergence/divergence state after the light passes through the light convergence/divergence changing means.

<<E02 Light emitting element array>>

A light emitting element array having a plurality of light emitting elements juxtaposed therein, in which each of the light emitting elements is the light emitting element according to any one of [A01] to [D08].

[E03] The light emitting element array according to [E01] or [E02], in which light beams emitted from the light emitting elements have different wavelengths.

REFERENCE SIGNS LIST

11 Compound semiconductor substrate (light emitting element manufacturing substrate)
11a First surface of compound semiconductor substrate
11b Second surface of compound semiconductor substrate
11a' Protrusion on first surface of compound semiconductor substrate
20 Laminated structure
21 First compound semiconductor layer
21a First surface of first compound semiconductor layer
21b Second surface of first compound semiconductor layer
21c, 21d Protrusion formed on first surface of first compound semiconductor layer
22 Second compound semiconductor layer
22a First surface of second compound semiconductor layer
22b Second surface of second compound semiconductor layer
23 Active layer (light emitting layer)
31 First electrode
32 Second electrode
33 Pad electrode
34 Insulating film (current confinement region)
34A Opening formed in insulating film (current confinement region)
41 First light reflecting layer
41a Light emitting surface of first light reflecting layer
41A Light transmitting portion
41B Light shielding portion
42 Second light reflecting layer
42a Light emitting surface of second light reflecting layer
43 Concave mirror portion
43a Interface facing laminated structure of effective region in concave mirror portion of first light reflecting layer
43' Protrusion formed on compound semiconductor substrate
44 Effective region in concave mirror portion of first light reflecting layer
45 Multilayer light reflecting film
46 Planarization film
48, 48' Bonding layer
49, 49' Supporting substrate
61A Current injection region
61B Current non-injection region (current confinement region)
71 Light absorbing material layer

The invention claimed is:

1. A light emitting element comprising:
a laminated structure obtained by laminating
a first compound semiconductor layer having a first surface and a second surface facing the first surface,
an active layer facing the second surface of the first compound semiconductor layer, and
a second compound semiconductor layer having a first surface facing the active layer and a second surface facing the first surface;
a first light reflecting layer disposed on the first surface side of the first compound semiconductor layer;

a second light reflecting layer disposed on the second surface side of the second compound semiconductor layer; and light convergence/divergence changing means, wherein the first light reflecting layer is formed on a concave mirror portion, the second light reflecting layer has a flat shape, when light generated in the active layer is emitted to an outside, a light convergence/divergence state before the light is incident on the light convergence/divergence changing means is different from a light convergence/divergence state after the light passes through the light convergence/divergence changing means, light is emitted via the second light reflecting layer, the light convergence/divergence changing means is disposed on a light emitting side of the second light reflecting layer, and a center of curvature of the light convergence/divergence changing means on an optical axis is located closer to the light convergence/divergence changing means than a center of curvature of the first light reflecting layer on the optical axis such that both of the center of curvature of the light convergence/divergence changing means and the center of curvature of the first light reflecting layer are located in between the light convergence/divergence changing means and the first light reflecting layer.

2. The light emitting element according to claim 1, wherein when the light generated in the active layer passes through the light convergence/divergence changing means, the light is converged more than before the light is incident on the light convergence/divergence changing means.

3. The light emitting element according to claim 2, wherein the light convergence/divergence changing means includes a convex lens, a Fresnel lens, or a hologram lens.

4. The light emitting element according to claim 1, wherein when a planar shape of the first light reflecting layer is a circle that has a diameter of $1 \times 10^{-4}$ m or less.

5. The light emitting element according to claim 1, wherein the light convergence/divergence changing means has a thickness of $1 \times 10^{-6}$ m to $1 \times 10^{-3}$ m along an optical axis.

6. The light emitting element according to claim 1, wherein a distance from the active layer to the first light reflecting layer is $1 \times 10^{-5}$ m to $5 \times 10^{-4}$ m.

7. The light emitting element according to claim 1, wherein a distance from the first light reflecting layer to the second light reflecting layer along an optical axis is $1 \times 10^{-5}$ m or more.

8. The light emitting element according to claim 1, wherein the laminated structure includes a GaN-based compound semiconductor.

9. The light emitting element according to claim 1, wherein the light emitting element includes a surface emitting laser element.

10. A light emitting element array having a plurality of light emitting elements juxtaposed therein, each of the light emitting elements including:

a laminated structure obtained by laminating a first compound semiconductor layer having a first surface and a second surface facing the first surface, an active layer facing the second surface of the first compound semiconductor layer, and a second compound semiconductor layer having a first surface facing the active layer and a second surface facing the first surface;

a first light reflecting layer disposed on the first surface side of the first compound semiconductor layer;

a second light reflecting layer disposed on the second surface side of the second compound semiconductor layer; and light convergence/divergence changing means, wherein the first light reflecting layer is formed on a concave mirror portion, the second light reflecting layer has a flat shape, when light generated in the active layer is emitted to an outside, a light convergence/divergence state before the light is incident on the light convergence/divergence changing means is different from a light convergence/divergence state after the light passes through the light convergence/divergence changing means, light is emitted via the second light reflecting layer, the light convergence/divergence changing means is disposed on a light emitting side of the second light reflecting layer, and a center of curvature of the light convergence/divergence changing means on an optical axis is located closer to the light convergence/divergence changing means than a center of curvature of the first light reflecting layer on the optical axis such that both of the center of curvature of the light convergence/divergence changing means and the center of curvature of the first light reflecting layer are located in between the light convergence/divergence changing means and the first light reflecting layer.

11. The light emitting element array according to claim 10, wherein light beams emitted from the light emitting elements have different wavelengths.

* * * * *